United States Patent
Nakagaki

(10) Patent No.: US 8,032,878 B2
(45) Date of Patent: Oct. 4, 2011

(54) DATA REPROGRAMMING METHOD AND SYSTEM

(75) Inventor: Yoshio Nakagaki, Toyota (JP)

(73) Assignee: Denso Corporation, Kariya, Aichi-Pref. (JP)

( * ) Notice: Subject to any disclaimer, the term of this patent is extended or adjusted under 35 U.S.C. 154(b) by 1444 days.

(21) Appl. No.: 11/489,438

(22) Filed: Jul. 20, 2006

(65) Prior Publication Data

US 2007/0036021 A1 Feb. 15, 2007

(30) Foreign Application Priority Data

Jul. 20, 2005 (JP) ................................. 2005-210401

(51) Int. Cl.
*G06F 9/44* (2006.01)
*G06F 19/00* (2011.01)
(52) U.S. Cl. .............................. 717/168; 701/32; 701/35
(58) Field of Classification Search .................. None
See application file for complete search history.

(56) References Cited

U.S. PATENT DOCUMENTS

| | | | |
|---|---|---|---|
| 4,070,648 | A | 1/1978 | Mergenthaler et al. |
| 6,816,971 | B2 | 11/2004 | Schmidt et al. |
| 2002/0120856 | A1* | 8/2002 | Schmidt et al. ............... 713/193 |
| 2004/0004396 | A1* | 1/2004 | Kumazawa et al. ........... 307/9.1 |
| 2006/0047374 | A1* | 3/2006 | Hashimoto et al. ............... 701/1 |
| 2008/0216067 | A1* | 9/2008 | Villing .......................... 717/174 |

FOREIGN PATENT DOCUMENTS

| | | |
|---|---|---|
| DE | 27 27 533 | 11/1978 |
| DE | 100 08 974 | 9/2001 |
| JP | 5-195859 | 8/1993 |
| JP | 06-162377 | 6/1994 |
| JP | 2000-163296 | 6/2000 |
| JP | 2000-230454 | 8/2000 |
| JP | 2003-162454 | 6/2003 |

OTHER PUBLICATIONS

Japanese Office Action dated Dec. 15, 2009, issued in corresponding Japanese Application No. 2005-210401, with English translation.
German Official Action dated Jan. 28, 2008, issued in counterpart German Application No. 10 2006 033 694.1 with English translation.

* cited by examiner

*Primary Examiner* — Michael J Yigdall
*Assistant Examiner* — Ben Wang
(74) *Attorney, Agent, or Firm* — Nixon & Vanderhye PC

(57) ABSTRACT

In a data reprogramming system, a receiving unit receives a plurality of items of data for use in reprogramming. The plurality of items of data are sent to the receiving unit. The plurality of items of data are respectively attached with the same identifier. A data extracting unit verifies the received plurality of items of data and extracts at least one item of the data as validated data upon determination that the at least one item of the data meets a predetermined rule against at least one remaining item of the data based on the verified result.

21 Claims, 30 Drawing Sheets

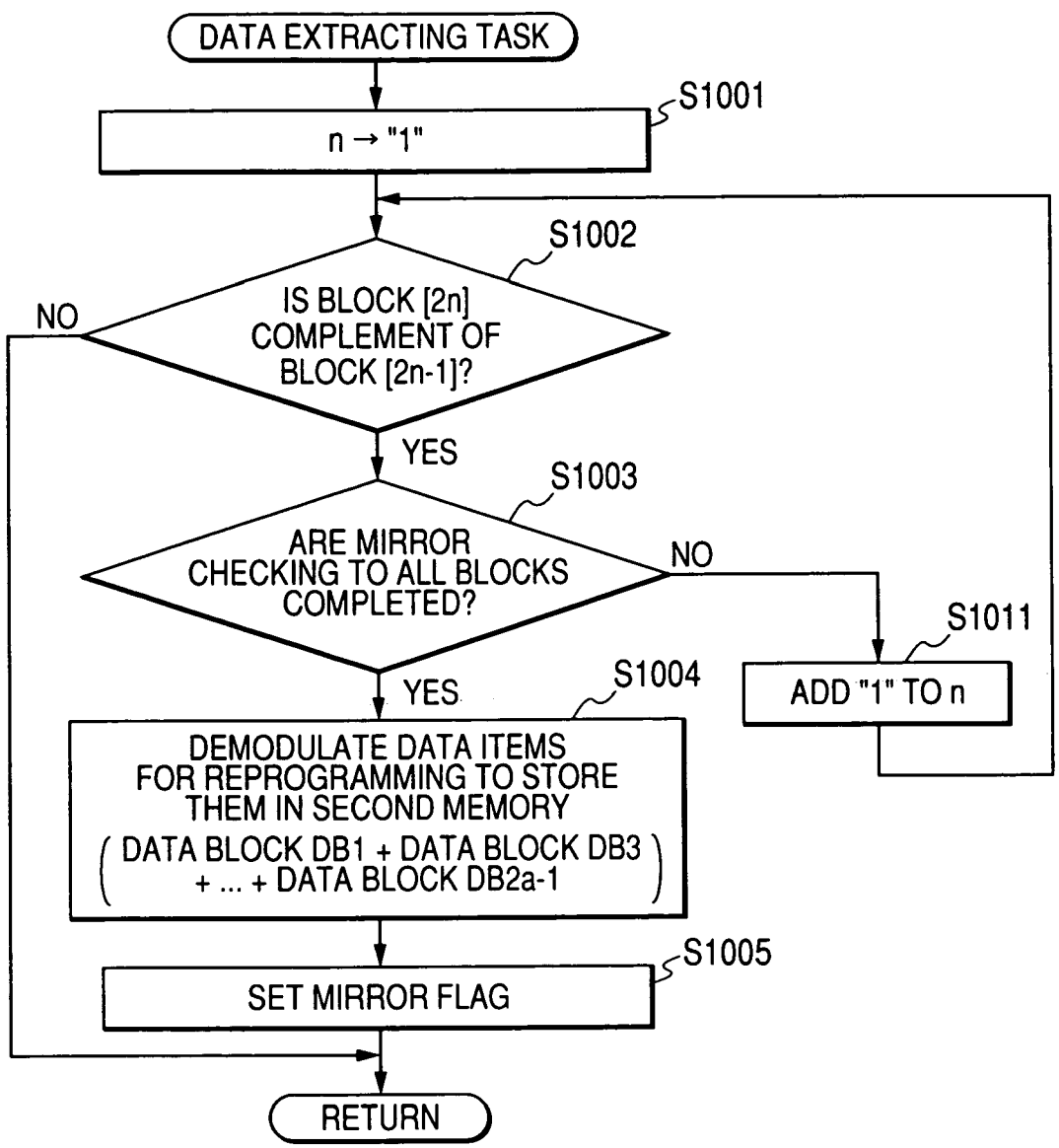

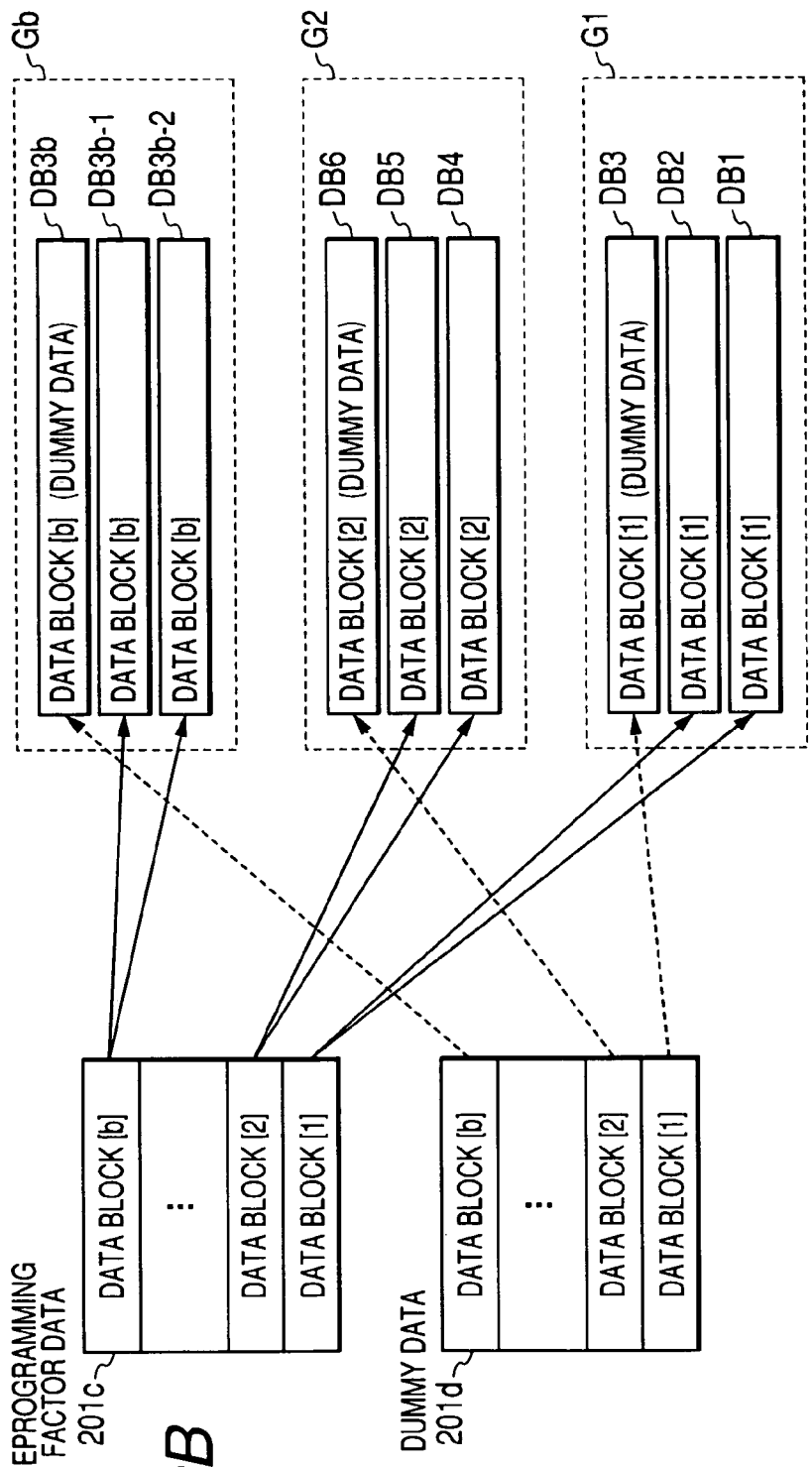

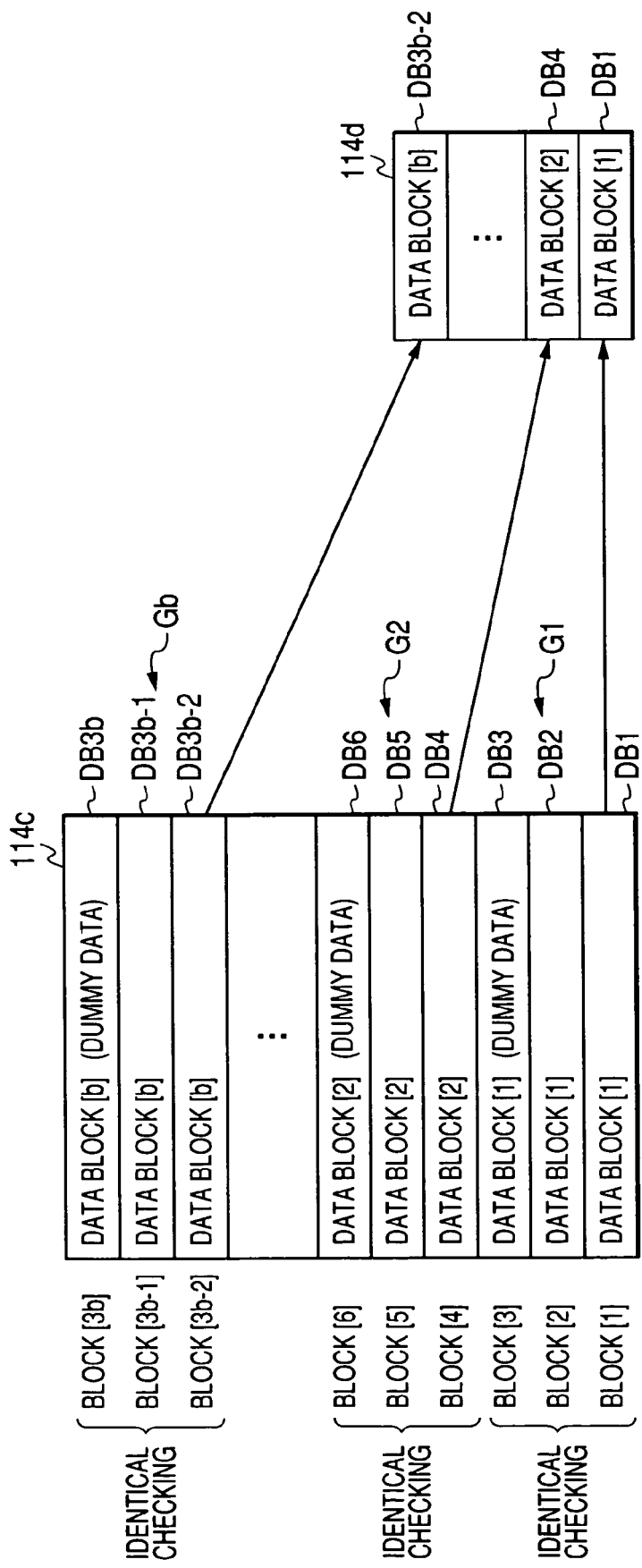

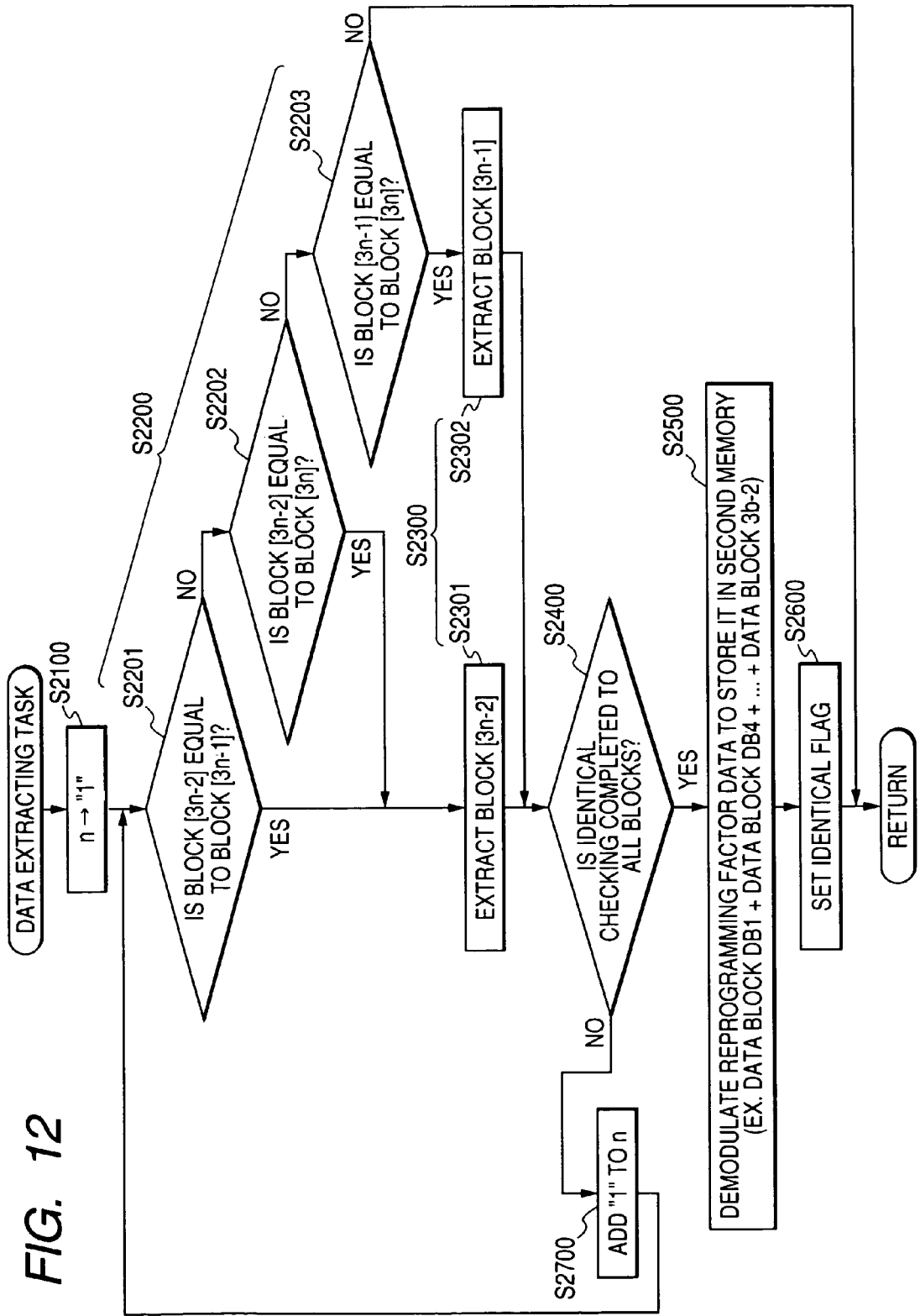

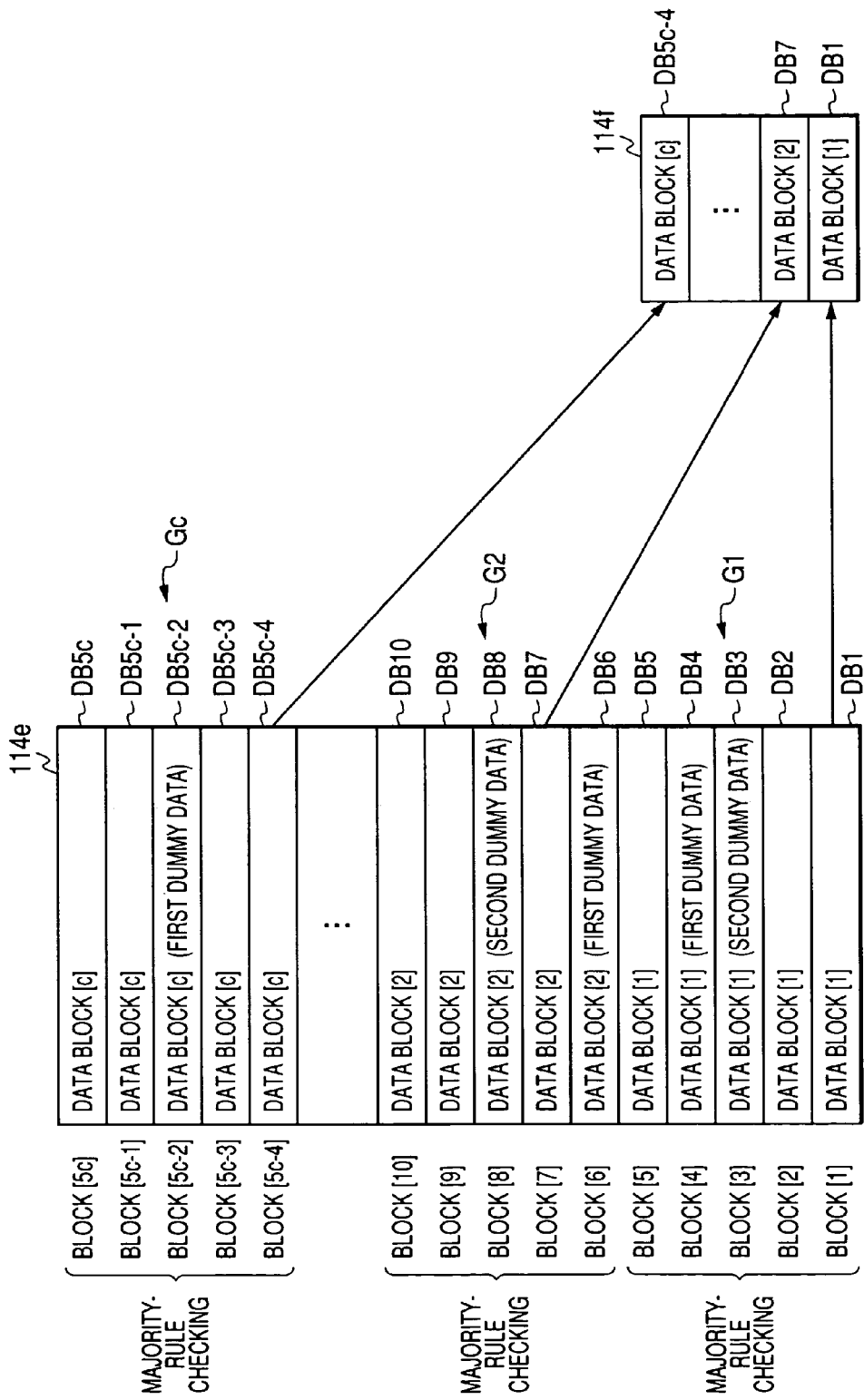

FIG. 19

| BLOCK [5n]   | SECOND DUMMY DATA |
|---|---|
| BLOCK [5n-1] | FIRST DUMMY DATA |
| BLOCK [5n-2] | FIRST DUMMY DATA |
| BLOCK [5n-3] | REPROGRAMMING DATA |
| BLOCK [5n-4] | REPROGRAMMING DATA |

→ IDENTICAL NUMBER OF CANDIDATE DATA [5n-2] = 1

→ IDENTICAL NUMBER OF CANDIDATE DATA [5n-4] = 1

| IDENTIFIER (ID) | DETERMINING UNIT |
|---|---|
| 0x01 | MIRROR DETERMINING UNIT |
| 0x02 | IDENTIFY DETERMINING UNIT |
| 0x03 | MAJORITY-RULE DETERMINING UNIT |
| 0x04 | MAJORITY-OCCUPYING DETERMINING UNIT |

DATA REPROGRAMMING METHOD AND SYSTEM

CROSS REFERENCE TO RELATED APPLICATIONS

This application is based on Japanese Patent Application 2005-210401 filed on Jul. 20, 2005. This application claims the benefit of priority from the Japanese Patent Application, so that the descriptions of which are all incorporated herein by reference.

FIELD OF THE INVENTION

The present invention relates to data reprogramming methods and systems, which have a function of storing rewritably in advance data, such as control program data and/or control data used to control a target, such as an in-vehicle device. More particularly, the present invention relates to data reprogramming methods and systems, which are configured to reprogram the stored data based on data for use in reprogramming; this data for use in reprogramming has been externally sent, for example, by radio waves. The data for use in reprogramming will be referred to as "reprogramming data".

BACKGROUND OF THE INVENTION

A plurality of electronic control units (ECUs) are normally installed in a vehicle. For example, the ECUs include an engine control unit for controlling fuel injection of an engine installed in a vehicle and a brake control unit for controlling a brake system installed therein.

Each of the ECUs is equipped with a nonvolatile memory in which a control program and control data used to control at least one target device installed in the vehicle are stored in advance. Specifically, each ECU is programmed to execute the control program based on the control data and/or signals measured by in-vehicle sensors and sent therefrom, thereby controlling the corresponding target device in accordance with the control program; these measured signals represent the operating condition of the vehicle.

Descriptions of such control program and control data associated therewith stored in the nonvolatile memory may be required to be reprogrammed with a version upgrade of the control program.

In this case, a circuit board (on which an ECU whose control program and control data associated therewith are targets for reprogramming is mounted) is retrieved from the vehicle, and thereafter, the retrieved ECU and a proper external tool are connected via a cable to be communicable therebetween. Thereafter, communications between the ECU and the external tool allow the control program and/or the control data to be reprogrammed.

However, it may take a lot of trouble and time to use the control program and data reprogramming method set forth above.

In order to solve the problem, a control unit is conventionally disclosed in Japanese Unexamined Patent Publication No. H05-195859.

Specifically, in the Publication, an external management center stores in advance VIN (Vehicle Identification Number) codes of vehicles to be managed and version information indicative of a specific version of a control program (software item) that are used to distinguish this version from other versions. When receiving a request for reprogramming at least one item in the control program and the control data, a control unit installed in a vehicle wirelessly communicates with the management center to obtain reprogramming data therefrom. Next, the control unit reprograms the at least one item stored in a rewritable region of the nonvolatile memory based on the reprogramming data. Installation of the above-structured control unit in a vehicle allows a control program and control data stored therein to be very simply updated.

If the control unit is configured such that a control program and control data stored therein are unconditionally reprogrammable, unauthorized reprogramming and/or illegal modification may be made, resulting in vehicle-performance deterioration and/or environmental damage due to vehicle emission deterioration, such as emissions of NOx (Nitrous Oxides), HC (Hydrocarbons), and CO (Carbon Monoxide) exceeding the legal emission standards.

In order to avoid such unauthorized reprogramming and/or illegal modification, the control unit disclosed in the Publication is configured to receive an identifier (identification code) identifying, as a target to be reprogrammed, at least one of the vehicles to be managed; this identifier has been sent together with the reprogramming data.

In addition, the control unit is configured to determine whether the received identification code and a code, such as a VIN code specifying the vehicle and stored therein. If it is determined that the received identification code and the specifying code coincide with each other, the control unit is configured to perform control program and data reprogramming operations based on the reprogramming data.

In the conventional control unit, the control program and data reprogramming operations can be performed on the condition that the received identification code and the specifying code coincide with each other. This allows the security level of the control unit associated with the control program and data reprogramming to be highly maintained.

Control units of this type designed to wirelessly communicate with the management center to obtain the reprogramming data are more frequently accessed from external devices than previous control units designed to communicate with an external tool via a cable to obtain the reprogramming data therefrom. The high frequency of access may cause an identification code together with unauthorized data and/or illegal modified data to coincide with a specifying code of the vehicle. The match between the identification code together with the unauthorized data and/or illegal modified data and the specifying code of the vehicle by accident or intention may cause a control program and control data to be reprogrammed based on the unauthorized data and/or illegal modified data.

Specifically, the accidental or intended match of these codes may cause vehicle-performance deterioration and/or environmental damage due to vehicle emission deterioration, such as emissions of NOx, HC, and CO exceeding the legal emission standards.

SUMMARY OF THE INVENTION

In view of the background, an object of at least one aspect of the present invention is to maintain the security level associated with reprogramming of data, such as a control program and/or control data, stored in a rewritable memory, such as a nonvolatile memory.

According to one aspect of the present invention, there is provided a data reprogramming system communicable with a rewritable memory in which data is stored in advance. The stored data is reprogrammable based on validated data. The data reprogramming system includes a receiving unit configured to receive a plurality of items of data for use in reprogramming. The plurality of items of data are sent to the receiving unit. The plurality of items of data are respectively attached with the same identifier. The data reprogramming system also includes a data extracting unit that is configured to verify the received plurality of items of data and to extract at least one item of the data as the validated data upon determination that the at least one item of the data meets a predetermined rule against at least one remaining item of the data based on the verified result.

According to another aspect of the present invention, there is provided a data reprogramming program product embedded in a memory of a computer communicable with a rewritable memory in which data is stored in advance. The stored data is reprogrammable based on validated data. The data reprogramming program product includes first means for instructing a computer to receive a plurality of items of data for use in reprogramming. The plurality of items of data being sent to the computer, the plurality of items of data being respectively attached with the same identifier. The data reprogramming program product includes second means for instructing a computer to verify the received plurality of items of data and to extract at least one item of the data as the validated data upon determination that the at least one item of the data meets a predetermined rule against at least one remaining item of the data based on the verified result.

According to a further aspect of the present invention, there is provided a method of reprogramming data stored in advance in a rewritable memory based on validated data. The method includes receiving a plurality of items of data for use in reprogramming. The plurality of items of data are sent such that the plurality of items of data are respectively attached with the same identifier. The method includes verifying the received plurality of items of data and extracting at least one item of the data as the validated data upon determination that the at least one item of the data meets a predetermined rule against at least one remaining item of the data based on the verified result.

BRIEF DESCRIPTION OF THE DRAWINGS

Other objects and aspects of the invention will become apparent from the following description of embodiments with reference to the accompanying drawings in which:

FIG. 9 is a flowchart schematically illustrates a specific example of a data extracting task in step S134 of FIG. 7;

FIG. 10A is a view schematically illustrating an example of the structure of data to be communicable between the management center and the in-vehicle control system according to a second embodiment of the present invention;

FIG. 10B is a view schematically illustrating an example of the structure of the management-center's memory in which items of reprogramming data are stored in advance, and an example of how to send the reprogramming data by the management center;

FIG. 11 is a view schematically illustrating extracting and storing processing to be executed by the CPU of the engine control unit according to the second embodiment;

FIG. 12 schematically illustrates a specific example of data extracting task in step S134 of FIG. 7 according to the second embodiment;

FIG. 14 is a view schematically illustrating extracting and storing processing to be executed by the CPU of the engine control unit according to a third embodiment of the present invention;

FIG. 19 is a view schematically illustrating another result of the identical comparison in step S3100 of FIG. 15;

FIRST EMBODIMENT

In a first embodiment of the present invention, a data reprogramming system according to the present invention is applied to an in-vehicle control system 100.

Figure 1:
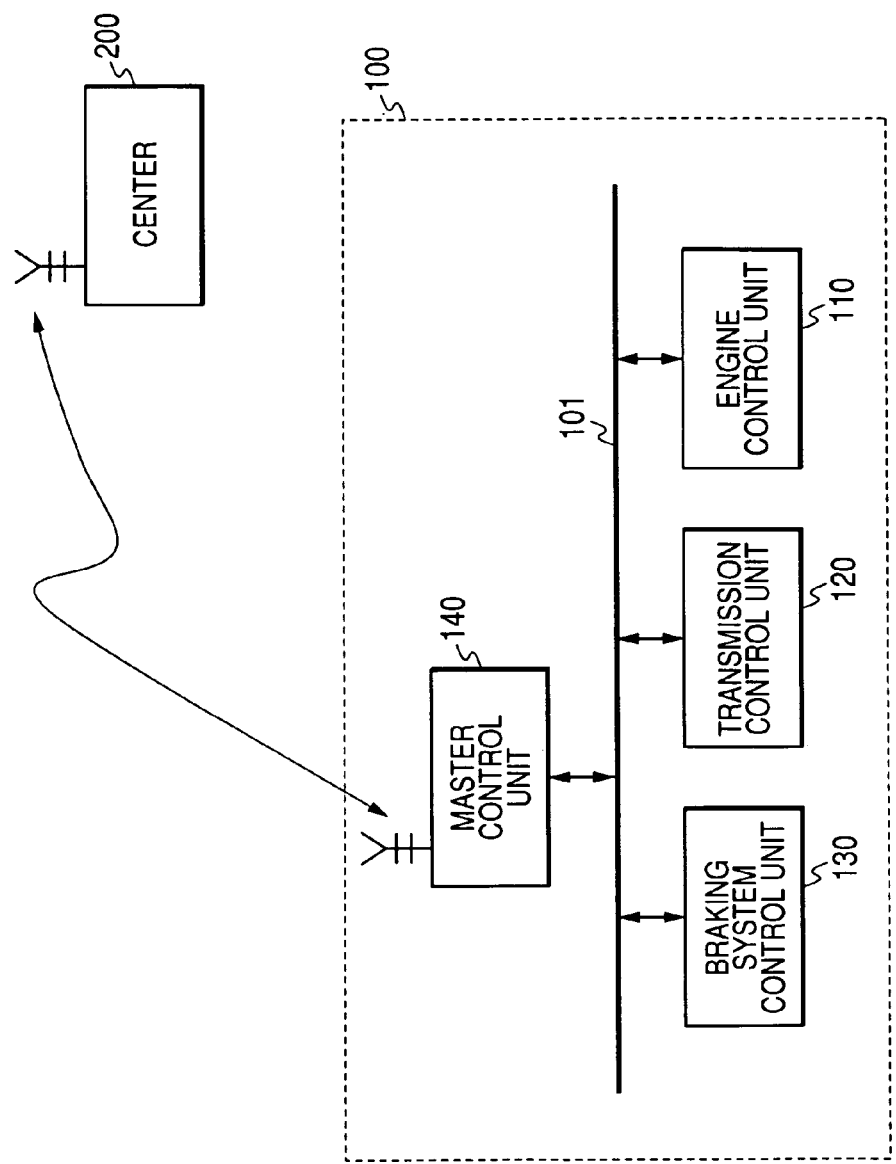
FIG. 1 is a block diagram schematically illustrating an example of the configuration of an in-vehicle control system according to a first embodiment of the present invention.

As illustrated in FIG. 1, the in-vehicle control system 100 mainly includes a master control unit 140 operative to perform centralized control over a plurality of electronic control units (ECUs) and to store in advance information associated with each ECU, such as version information of a control program stored in each ECU.

The ECUs and the master control unit 140 are communicably linked to each other through a communications bus 101 constituting a bus type LAN (Local Area Network), such as a CAN (Controller Area Network). The communications network 101 allows the master control unit 140 and the ECUs to communicate data with each other.

The plurality of ECUs includes ECUs 110, 120, and 130.

The ECU 110 serves as an engine control unit operative to control, as a control target, fuel injection of an engine installed in the vehicle.

The ECU 120 serves as a transmission control unit operative to automatically control to change the gear ratio of a transmission (control target) of the vehicle.

The ECU 130 serves as a braking-system control unit operative to control a braking system (control target) of the vehicle, which contributes to stopping the vehicle.

These ECUs 110, 120, and 130 communicate with each other through the communications bus 101 information indicative of the control state of the corresponding target and of the result of control of the corresponding target.

Each of the ECUs 110, 120, and 130 has a nonvolatile memory and stores at its nonvolatile memory in advance a control program and control data required for each ECU to run the corresponding program.

Specifically, each of the ECUs 110, 120, and 130 is operative to execute the corresponding control program stored in the nonvolatile memory based on the corresponding control data and the information communicated from the other ECUs, thereby cooperatively performing the control operations of the targets.

For example, the transmission control unit 120 is communicably connected to a speed sensor attached to an output shaft of the transmission or an axle.

When the speed sensor measures the speed of the vehicle and sends, to the transmission control unit 120, the information of the speed in the form of, for example, binary data, the transmission control unit 120 captures the speed information (binary data) and generates data indicative of the vehicle speed based on the speed information (binary data). Thereafter, the transmission control unit 120 sends the generated data formatted, for example, as serial data through the communications bus 101.

When the serial data sent through the communications bus 101 is captured by the braking-system control unit 130, the braking-system control unit 130 utilizes the serial data to control the braking system.

The master control unit 140 can establish communications, by radio waves, with an external management center 200. The external management center 200 stores in advance VIN codes of vehicles to be managed and version information of a specific version of each of the control programs stored in the ECUs 110, 120, and 130.

Specifically, the master control unit 140 is operative to wirelessly communicate with the management center 200 and to obtain, based on the wireless communications, reprogramming data required for the unit 140 to perform data-reprogramming operations. Specifically, the reprogramming data allows the unit 140 to perform the reprogramming operations.

The master control unit 140 is also operative to reprogram data items stored in the ECUs 110, 120, and 130 based on the obtained reprogramming data.

Specifically, descriptions of the data items stored in the ECUs 110, 120, and 130, such as the control programs and the control data, can be required to be reprogrammed with the version upgrade of the control programs and/or with modification thereof In this requirement for reprogramming, the master control unit 140 wirelessly communicates with the management center 200 to receive, from the center 200:

the reprogramming data required to perform data reprogramming operations; and an identifier (ID) identifying at least one of the vehicles to be managed and at least one of the ECUs 110, 120, and 130, as a target to be reprogrammed.

On the other hand, the master control unit 140 stores in advance a code, such as a VIN code, specifying the corresponding vehicle. Thus, the master control unit 140 determines whether the received identifier and the specifying code of the corresponding vehicle are identical to each other.

If it is determined that the received identifier matches the specifying code of the corresponding vehicle, the master control unit 140 reprograms a control program and control data based on the reprogramming data in cooperation with the at least one of the ECUs 110, 120, and 130. These control program and control data are stored in advance in at least one of the ECUs 110, 120, and 130. The at least one of the ECUs 110, 120, and 130 corresponds to the target to be reprogrammed.

Installation of the in-vehicle control system 100 in the vehicle allows the control programs and control data stored in the ECUs 110, 120, and 130 to be very simply updated.

Specifically, the in-vehicle control system 100 is configured to wirelessly communicate with the center 200 to obtain the reprogramming data therefrom.

As described above, in a conventional control system having the configuration, it is assumed that, as the reprogramming data, unauthorized reprogramming data and/or illegal modification data has been sent to the conventional control system. In this assumption, when an identifier attached to the unauthorized reprogramming data and/or illegal modification data matches the specifying code of the corresponding vehicle, it may be likely to cause vehicle-performance deterioration and/or environmental damage due to vehicle emission deterioration, such as emissions of NOx, HC, and CO exceeding the legal emission standards.

In contrast, in the first embodiment, the in-vehicle control system 100 is configured to:

receive a plurality of items of the reprogramming data to each of which the same identifier is attached, which has been sent from the management center 200;

verify the received items of the reprogramming data against each other;

extract, as validated data, at least one of the items of the reprogramming data when it is determined that the at least one of the items of the reprogramming data meets a predetermined rule against at least one remaining item based on the verified result; and reprogram, based on the extracted item of the reprogramming data, at least one of the computer program and the control data stored in at least one of the ECUs 110, 120, and 130.

In the configuration set forth above, even if an identifier of unauthorized reprogramming data and/or illegal modification data matches a code specifying the corresponding vehicle, it would be possible to prevent the control system 100 from performing the reprogramming operations unless satisfying other requirements in which:

(1) a plurality of items of data to each of which the same identifier is attached are received; and (2) the received items of data include one item of data that meets a predetermined rule against the other thereof.

Specifically, in the configuration of the in-vehicle control system, it is possible to:

filter items of the reprogramming data sent from the management center 200;

extract, as validated data, at least one of the items of the reprogramming data when it is determined that the at least one of the items of the reprogramming data meets the predetermined rule against at least one remaining item; and use the extracted item of the reprogramming data to reprogram at least one of the computer program and the control data stored in at least one of the ECUs 110, 120, and 130.

Thus, the configuration of the in-vehicle control system 100 allows the security level thereof to be more highly maintained.

Figure 2:
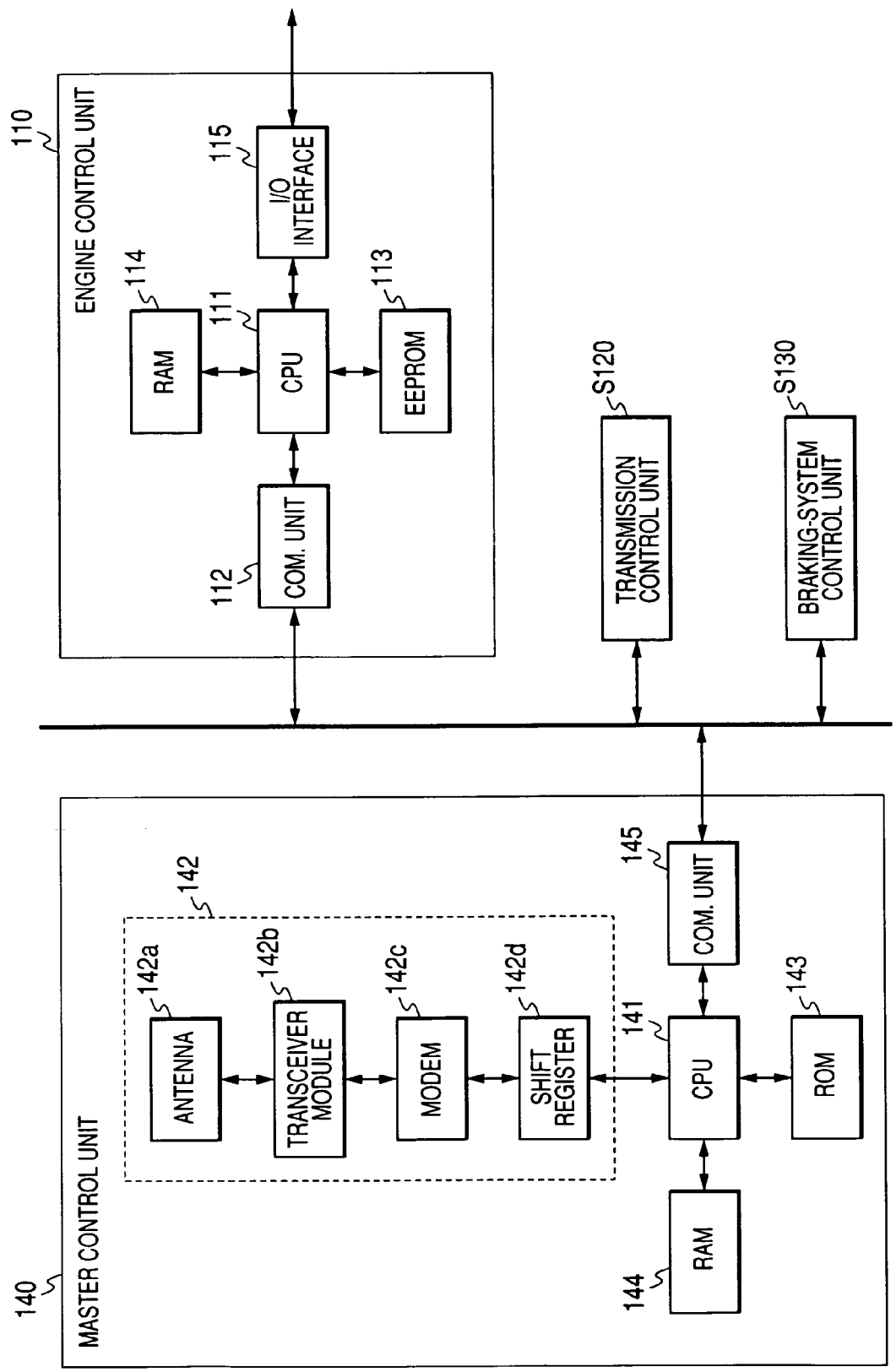
FIG. 2 is a block diagram schematically illustrating an example of the system configuration of each of an engine control unit and a master control unit illustrated in FIG. 1.

FIG. 2 schematically illustrates an example of the system configuration of each of the engine control unit 110 and the master control unit 140 in the in-vehicle control system 100 as a block diagram. The system configuration and electrical operations of each of the control units 110 and 140 will be described hereinafter with reference to FIG. 2. Note that in the descriptions hereinafter, it is assumed that data stored in the engine control unit 110 is reprogrammed.

As illustrated in FIG. 2, the master control unit 140 is composed of a CPU 141, a radio communication unit 142, a program memory 143, a data memory 144, and a communication unit 145. The CPU 141 is electrically connected to the radio communication unit 142, the program memory 143, the data memory 144, and the communication unit 145. The CPU 141 is operative to communicate various types of items of data with each of the elements 142 to 145 and to perform operations based on the items of data.

The radio communication unit 142 serves as a data-communication interface between the CPU 141 and the management center 200. Specifically, the radio communication unit 142 consists of an antenna 142*a*, a transceiver module 142*b*, a modulator and demodulator (modem) 142*c*, and a shift register 142*d*. The functions of the electrical components 142*a* to 142*d* will be described hereinafter.

The program memory 143 consists of, for example, a read only memory (ROM) in which various control programs and control data used upon execution of them are stored in advance. Especially, in the first embodiment, a reprogramming control program that causes the CPU 141 to reprogram items of data stored in each of the ECUs 110, 120, and 130 is also stored in advance in the program memory 143. Moreover, a VIN code specifying the corresponding vehicle is stored in advance in, for example, the ROM 143.

The data memory 144 consists of, for example, a random access memory (RAM). The data memory 144 serves as a storage unit for storing therein items of data sent from the management center 200 and each of the ECUs 110, 120, and 130.

The communication unit 145 serves as a data communication interface between the CPU 141 and each of the ECUs 110, 120, and 130 via the communication bus 101.

In the master control unit 140, when reprogramming data stored in the engine control unit 10, the CPU 141 of the master control unit 140 communicates with the management center 200 by radio waves to obtain a plurality of items of reprogramming data. The plurality of items of reprogramming data are required for the unit 140 to perform data-reprogramming operations. In addition, the plurality of items of reprogramming data have the same identifier attached thereto.

In the first embodiment, in the management center 200, each of the items of reprogramming data preferably has been converted into serial packets, and the serial packets have been modulated on a predetermined carrier wave so that the modulated carrier wave has been sent to the master control unit 140 from the management center 200.

In the radio communication unit 142 of the master control unit 140, the modulated carrier wave sent from the center 200 is received by the transceiver module 142*b* through the antenna 142*a*. The received carrier wave is sent to the modem 142*c* so that the serial packets are demodulated. The serial packets are sent to the shift register 142*d* so that they are converted in parallel format, thereby being sent to the CPU 141. The CPU 141 receives the packets in parallel format and obtains the items of reprogramming data from the received packets.

Upon obtaining of the items of reprogramming data, the CPU 141 runs the reprogramming control program to start operations to reprogram the data items stored in the engine control unit 110.

Specifically, the CPU 141 determines whether the identifier of each of the obtained items of reprogramming data matches the VIN code specifying the corresponding vehicle.

If it has been determined that the identifier of each of the obtained items of reprogramming data matches the VIN code, the CPU 141 stores the obtained items of reprogramming data in the data memory 144, and sends them to the engine control unit 110 through the communication unit 145.

The engine control unit 110 is composed of a CPU 111, a communication unit 112, a program memory 113, a data memory 114, and an Input/output (I/O interface) 115. The CPU 111 is electrically connected to the communication unit 112, the program memory 113, the data memory 114, and the I/O interface 115. The CPU 111 is operative to communicate various types of items of data with each of the elements 112 to 115 and to perform operations based on the items of data.

The communication unit 112 serves as a data-communication interface between the CPU 111 and the master control unit 140.

The program memory 113 consists of a nonvolatile memory, such as a flash memory or an EEPROM, which retains data stored in it when the power supply is switched off. In a first predetermined region of the program memory 113, data items including an engine control program and engine control data associated therewith are stored in advance. The data items are target for reprogramming.

Thus, a reprogramming control program that causes the CPU 111 to reprogram the data items stored in the program memory 113 is also stored in advance in, for example, a second predetermined region of the program memory 113, which is distinctly different from the first predetermined region thereof.

The data memory 114 consists of, for example, a RAM. The data memory 114 serves as a storage unit for storing therein items of data sent from the ECUs 110, 120, and 130 and data sent from various types of sensors communicably linked to the engine control unit 110 through the I/O interface 115. The various types of sensors (not shown) are configured to measure items of information associated with the operating condition of the vehicle.

The I/O interface 115 serves as data communication interface between the various types of sensors and the CPU 111, and between various types of actuators communicably linked to the engine control unit 110 and the CPU 111. The various types of actuators (not shown) are configured to drive, based on drive commands sent from the CPU 111, various types of in-vehicle devices that are controlled targets of the engine control unit 110.

The engine control unit 110 with the above-mentioned structure is normally designed to:

capture temperature information indicative of the temperature of at least one of engine components, such as engine coolant, and speed information indicative of the speed of the vehicle; and execute the engine control program stored in the program memory 113 based on the captured items of information, thereby controlling the engine.

In order to reprogram the data items stored in the program memory 113, the CPU 111 of the engine control unit 110 is operative to:

capture the plurality of items of the reprogramming data to each of which the same identifier is attached, which has been sent from the master control unit 140;

store the received items of the reprogramming data in the data memory 114;

verify the received items of the reprogramming data against each other;

determine whether there is at least one item of the reprogramming data that meets a predetermined rule against the other items based on the verified result;

extract, as validated data, at least one of the items of the reprogramming data when it is determined that at least one item of the reprogramming data meets the predetermined rule against at least one remaining item; and reprogram, based on the extracted at least one item of the reprogramming data, at least one of the computer program and the control data stored in the program memory 113 as a target to be reprogrammed.

Note that the system configuration of the engine control unit 110 is substantially identical to those of the other ECUs 120 and 130, so that the descriptions of which will be omitted.

Next, a specific example of data reprogramming operations under cooperation of the master control unit 140 and the engine control unit 110 will be described hereinafter with reference to FIGS. 3 to 9.

As described above, when performing the data reprogramming operations, the plurality of items of reprogramming data to each of which the same identifier is attached are sent from the management center 200 to the in-vehicle control system 100.

Specifically, the management center 200 according to the first embodiment is configured to send, as the plurality of items of reprogramming data, reprogramming factor data for actually use in reprogramming and mirror data thereof that is the complement of the reprogramming factor data.

The sending operations of the reprogramming factor data and the mirror data of the reprogramming data by the management center 200 will be described hereinafter with reference to FIGS. 3A and 3B.

FIG. 3A schematically illustrates an example of the structure of data to be communicable between the management center 200 and the in-vehicle control system 100. FIG. 3B schematically illustrates an example of the structure of the management-center's memory in which the reprogramming factor data and the mirror data as the items of the reprogramming data are stored in advance. FIG. 3B also schematically illustrates an example of how to send the reprogramming factor data and the mirror data by the management center 200.

As illustrated in FIG. 3A, in the first embodiment, each of the reprogramming factor data and the mirror data is processed between the management center 200 and the in-vehicle control system 100 as a data frame DF. The data frame DF is a self-contained unit of data to be processed between the management center 200 and the in-vehicle control system 100.

Specifically, the data frame DF consists of a plurality of fields and a check code. The data frame DF is configured to be sent in packet. Note that, when each of the reprogramming factor data and the mirror data is processed as the data frame DF, the same identifier is attached to each of the reprogramming factor data and the mirror data as the items of reprogramming data.

The plurality of fields include:

a start of frame (SOF) that marks the beginning of the data frame DF;

an identifier field representing the identifier of corresponding data;

a data field containing data itself; and an end of frame (EOF) that marks the end of the data frame DF.

As illustrated in FIG. 3B, in the management center 200, each of the reprogramming factor data and the mirror data is divided in advance into a plurality of data blocks [1] to [a], where "a" represents a predetermined integer. The data blocks [1] to [a] of the reprogramming factor data are stored in advance a first memory area 201a of the center 200. Similarly, the data blocks [1] to [a] of the mirror data are stored in advance a second memory area 210b of the center 200.

For example, each of the data blocks [1] to [a] of each of reprogramming factor data and mirror data is represented as arbitrary bits in hexadecimal. In FIG. 3B, the data block [1] of reprogramming factor data is represented by 0x0123456 . . . , and corresponding data block [2] of mirror data is represented by 0xFEDCBA9 . . . , this value 0xFEDCBA9 . . . is the complement of the value 0x0123456 . . . .

In sending the reprogramming factor data and the mirror data, the management center 200 sequentially reads out reprogramming factor data in order from block [1] to block [a].

In parallel with the readout operations, the management center 200 sequentially reads out any one of blocks [1] to [a] of mirror data every time there is a readout of one of blocks [1] to [a] of the reprogramming factor data. The sequential readout operations of the management center 200 are carried out such that the readout one of blocks [1] to [a] of mirror data is the complement of the corresponding readout one of blocks [1] to [a] of reprogramming factor data.

For example, upon readout of block [1] of the reprogramming factor data, the block [1] of the mirror data is extracted from blocks [1] to [a] of the mirror data. Similarly, upon readout of block [2] of the reprogramming factor data, block [2] of the mirror data is extracted from blocks [1] to [a] of mirror data.

This allows pairs of data blocks that are complements of each other to be sequentially extracted from the first and second memory areas 201a and 201b as pairs P1, P2, . . . , Pa of data blocks DB1, DB2, DB3, DB4, . . . , DB2a-1, DB2a. The management center 200 have categorized data blocks DB1, DB2, DB3, DB4, . . . , DB2a-1, DB2a such that a plurality of the data frames DF contain the data blocks DB1, DB2, DB3, DB4, DB2a-1, DB2a, respectively.

Next, the management center 200 sequentially sends the plurality of data frames DF to the in-vehicle control unit 100 such that the data blocks DB1, DB3, . . . , DB2a-1 of the reprogramming factor data are paired to the complement data blocks DB2, DB4, . . . , DB2a of the mirror data (in packet or in block), respectively.

When the reprogramming factor data and the mirror data are sent from the management center 200 in the sending way described above, the master control unit 140 of the in-vehicle control system 100 performs receiving processing for receiving the reprogramming factor data and the mirror data and storing them in the data memory 144.

Figure 4:
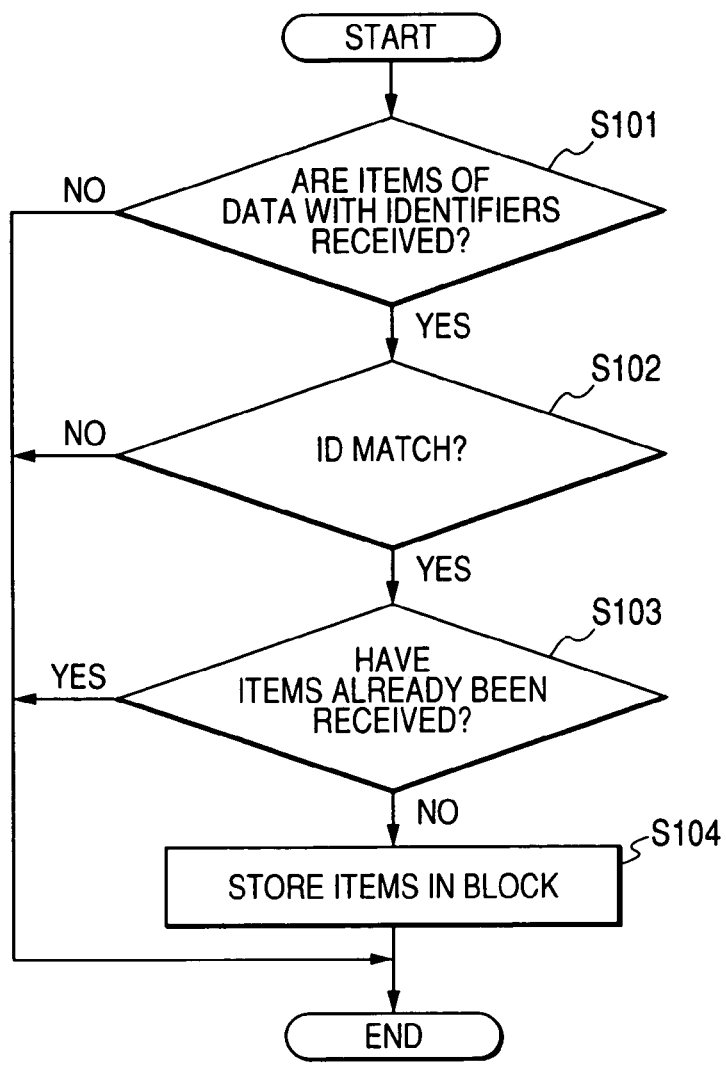
FIG. 4 is a flowchart schematically illustrating receiving processing to be executed by a CPU of the master control unit.

FIG. 4 is a flowchart schematically illustrating the receiving processing to be executed by the CPU 141. The receiving processing is for example repeated every predetermined period.

As illustrated in FIG. 4, in executing the receiving processing, the CPU 141 stands by until receiving a pair of blocks of the reprogramming factor data and the mirror data to each of which the same identifier is attached in step S101.

When receiving the paired blocks of the reprogramming factor data and the mirror data sent in block, the determination in step S101 is YES, so that the CPU 141 proceeds to step S102.

In step S102, the CPU 141 determines whether the identifiers attached to the paired blocks of the reprogramming factor data and the mirror data match the specifying code of the corresponding vehicle.

If it is determined that the identifiers attached to the paired blocks of the reprogramming factor data and the mirror data match the specifying code of the corresponding vehicle (the determination in step S102 is YES), the CPU 141 proceeds to step S103. In step S103, the CPU 141 determines, based on a receiving history stored in the data memory 144, whether the received paired blocks of the reprogramming factor data and the mirror data are equivalent to paired blocks that have been already received to be stored in the data memory 144.

If it is determined that the received paired blocks of the reprogramming factor data and the mirror data have not been received yet (the determination in step S103 is NO), the CPU 141 stores, in block, the received paired blocks in the data memory 144 as the receiving history in step S104. Specifically, the CPU 141 stores, in block, the received paired data blocks in the data memory 144 such that the paired data blocks are associated with each other.

In contrast, if it is determined that the identifiers attached to the paired blocks of the reprogramming factor data and the mirror data do not match the specifying code of the corresponding vehicle (the determination in step S102 is NO), the CPU 141 exits the receiving processing without storing the paired blocks in the data memory 144.

Similarly, if it is determined that the received paired blocks of the reprogramming factor data and the mirror data are equivalent to paired blocks that have been already received to be stored in the data memory 144 (step S103 YES), the CPU 141 exits the receiving processing without storing the paired blocks in the data memory 144.

Specifically, in these data receiving processing exit cases, the CPU 141 stands by until receiving a pair of blocks of the reprogramming factor data and the mirror data to each of which the same identifier is attached (see step S101).

When the paired blocks of the reprogramming factor data and the mirror data are received in the data memory 144, the master control unit 140 performs sending processing for sending the received paired blocks of the reprogramming factor data and the mirror data to the engine control unit 110 as a target to be reprogrammed.

Figure 5:
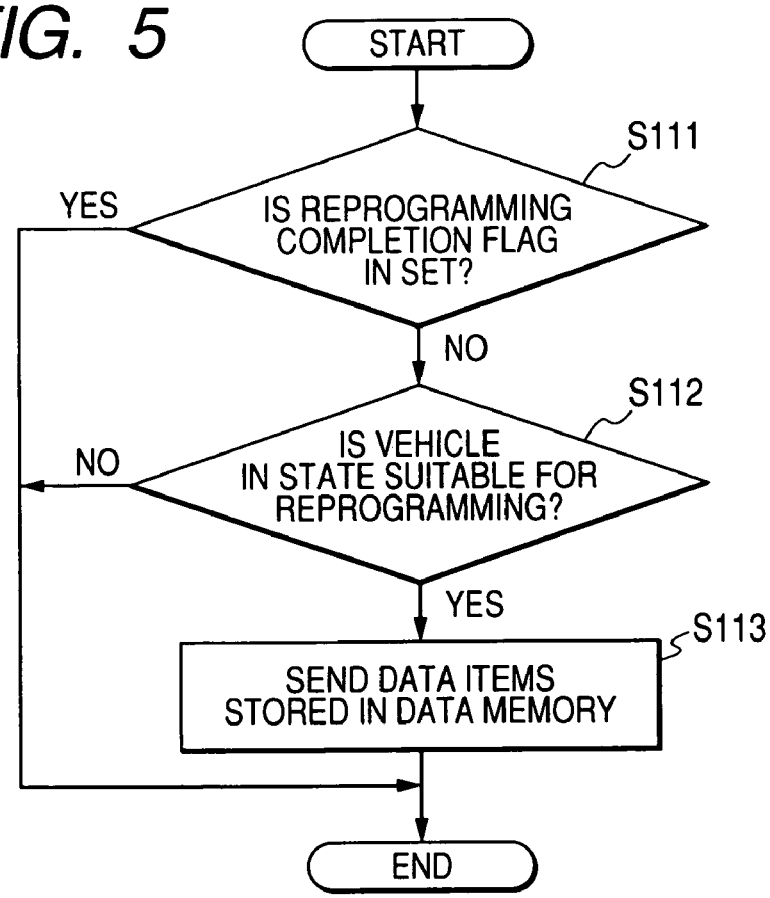
FIG. 5 is a flowchart schematically illustrating sending processing to be executed by the CPU of the master control unit.

FIG. 5 is a flowchart schematically illustrating the sending processing to be executed by the CPU 141. The sending processing is for example repeated every predetermined period when the reprogramming factor data and the mirror data have been stored in the data memory 144.

As illustrated in FIG. 5, in executing the sending processing, the CPU 141 checks a reprogramming completion flag to determine whether the reprogramming completion flag is in set (set state) in step S111. The reprogramming completion flag is configured to be in set (set state) upon completion of the reprogramming of data items stored in the program memory 113 of the engine control unit 110. The reprogramming completion flag has been stored in the data memory 144 and is settable by the CPU 141.

If it is determined that no reprogramming completion flag is in set (reset state) in step S111 based on the check result, the CPU 141 determines that the reprogramming of data items stored in the program memory 113 of the engine control unit 110 has not been completed yet, the CPU 141 sequentially executes steps S112 and S113.

Specifically, in step S112, the CPU 141 determines whether the vehicle is in a state suitable for reprogramming. If it is determined that the vehicle is in a state suitable for reprogramming (the determination in step S112 is YES), the CPU 141 sends, to the engine control unit 110, the paired blocks of the reprogramming factor data and the mirror data stored in the data memory 144 through the communication bus 101 in step S113.

Note that the paired blocks of the reprogramming factor data and the mirror data are sent in block (packet) to the engine control unit such that they are associated with each other.

Otherwise if it is determined that the reprogramming completion flag is in set (set state) in step S111 based on the check result (the determination in step S111 is NO), the CPU 141 exits the sending processing. In this case, the CPU 141 can erase the reprogramming factor data and the mirror data stored in the data memory 144.

Otherwise if it is determined that the vehicle is not in a state suitable for reprogramming (the determination in step S112 is NO), the CPU 141 exits the sending processing. In this case, the CPU 141 stands by until the vehicle goes into a state suitable for reprogramming.

For example, in executing the sending processing, the task in step S112 is to determine whether a predetermined period has elapsed since the time at which the engine revolutions is less than 50 rpm (revolutions per minute), which is substantially equivalent to zero. Specifically, the CPU 111 of the engine control unit 110 is normally programmed to perform post-processing including a task to store, in a predetermined backup region of the data memory 114, data, such as learning values that should be held until the next operating of the engine.

Thus, in the task in step S112, the CPU 111 stands by until the predetermined period has elapsed since the time at which the engine revolutions is less than 50 rpm, which is substantially equivalent to zero. This standby task can prevent data items stored in the program memory 113 from being reprogrammed in parallel to the post-processing.

When the paired blocks of the reprogramming factor data and the mirror data are sent to the engine control unit 110 by the sending processing, the engine control unit 110, as set forth above, verifies the received blocks of the reprogramming factor data and the mirror data against each other.

Next, the engine control unit 110 extracts, as validated data, at least one of the blocks of the reprogramming factor data and the mirror data when it is determined that the at least one of the blocks thereof meets the predetermined rule against at least one remaining block based on the verified result.

Based on the extracted block of the reprogramming factor data and the mirror data, the engine control unit 110 reprograms at least one of the computer program and the control data stored therein.

Note that, if it is determined that no blocks of the reprogramming factor data and the mirror data meet the predetermined rule, the engine control unit 110 determines that the blocks of the reprogramming factor data and the mirror data sent from the management center 200 by radio communications have no validity.

Figure 6:
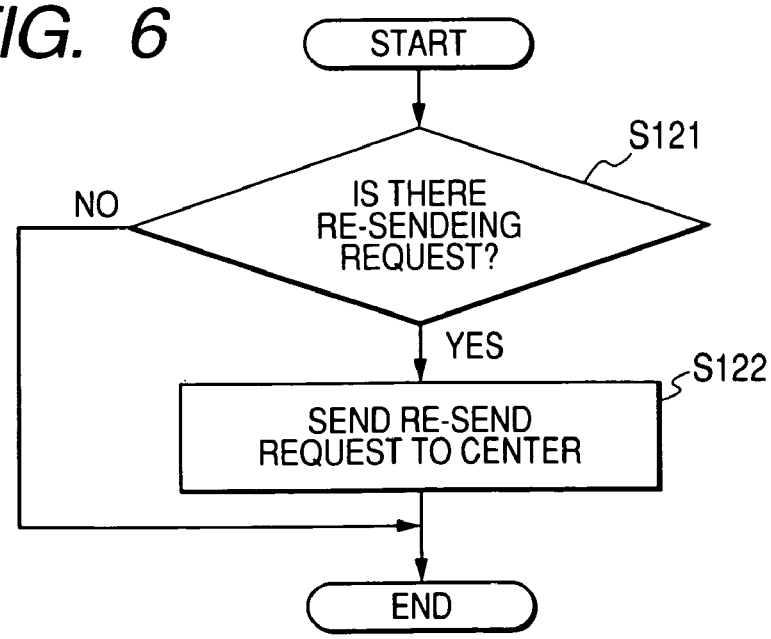
FIG. 6 is a flowchart schematically illustrating re-sending processing to be executed by the CPU of the master control unit.

This can provide the master control unit 140 with a re-sending request of the reprogramming factor data and the mirror data; this task when no blocks of the reprogramming factor data and the mirror data meet the predetermined rule will be described hereinafter in detail. When receiving the re-sending request, the master control unit 140 performs sending processing for requesting, to the management center 200, re-sending of the reprogramming factor data and the mirror data; this sending processing is illustrated in FIG. 6.

Specifically, in step S121, when receiving the re-sending request from the engine control unit 110, the CPU 141 of the master control unit 140 requests, to the management center 200, re-sending of blocks of the reprogramming factor data and the mirror data in step S122. Note that, in step S122, if the blocks of the reprogramming factor data and the mirror data have been stored in the data memory 144, which have been obtained by the previous radio communications, the CPU 141 preferably can clear them from the data memory 144.

Figure 7:
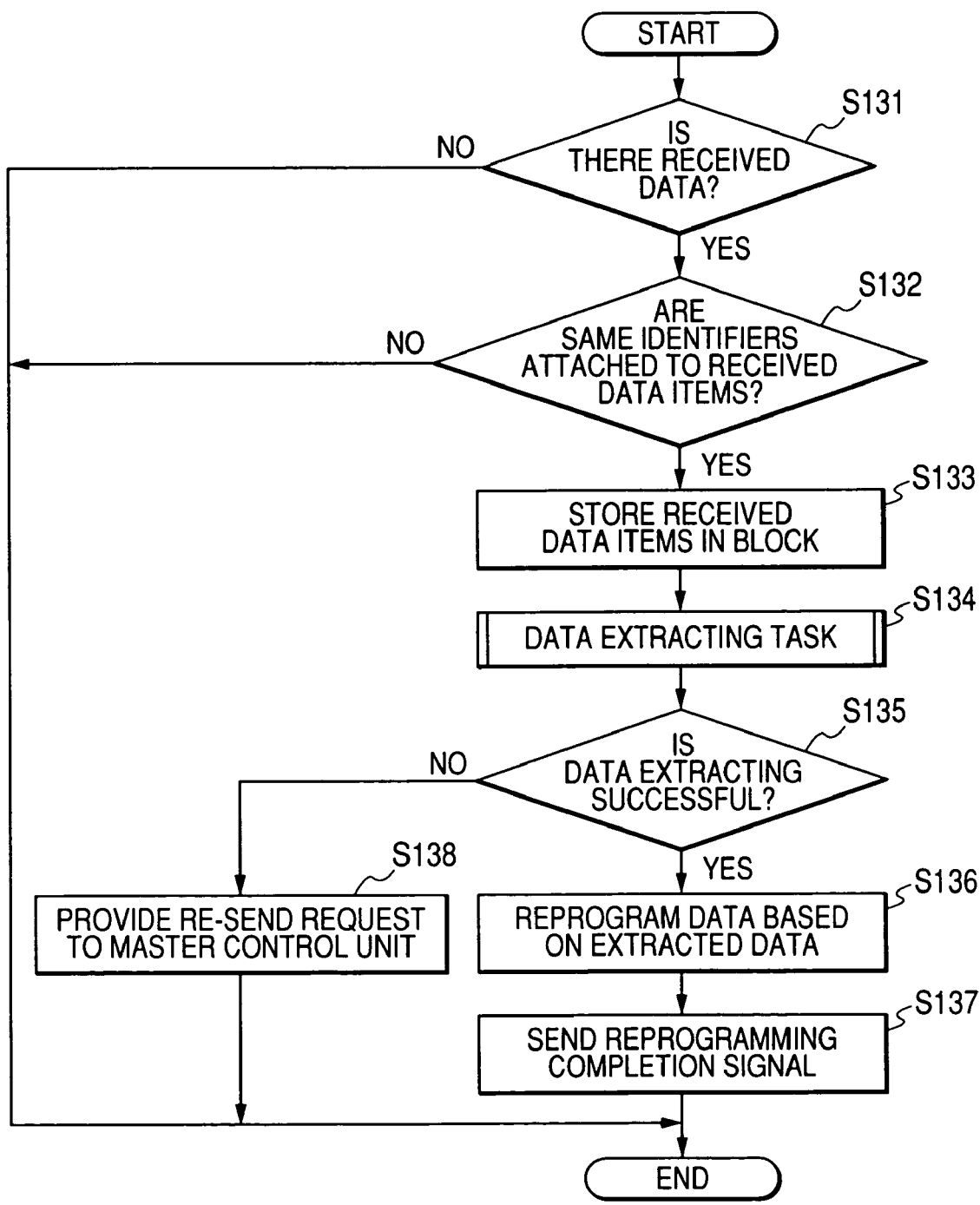
FIG. 7 is a flowchart schematically illustrating reprogramming processing to be executed by a CPU of the engine control unit illustrated in FIG. 1.

FIG. 7 is a flowchart schematically illustrating reprogramming processing to be executed by the CPU 111 of the engine control unit 110; this reprogramming processing is to reprogram data items to be reprogrammed, which are stored in advance in the program memory 111.

As illustrated in FIG. 7, in executing the reprogramming processing, the CPU 111 stands by until receiving items of data through the communication bus 101 in step S131.

When receiving the items of data through the communication bus 101, the CPU 111 identifies the type of each of the received items of data based on the identifiers attached to the received items of data in step S132. In other words, the CPU 111 determines whether the identifies attached to the received items of data coincide with each other.

When it is identified that the identifiers attached to the received items of data coincide with each other, the CPU 111 can identify that the received items of data correspond to the items of the reprogramming factor data and the mirror data (the determination in step S132 is YES). Then, the CPU 111 proceeds to step S133 and performs the set of steps S133 to S138 for reprogramming the data items stored in the program memory 113.

In step S113, the CPU 111 stores, in the data memory 114, the items of the reprogramming factor data and the mirror data in data block.

Figure 8:
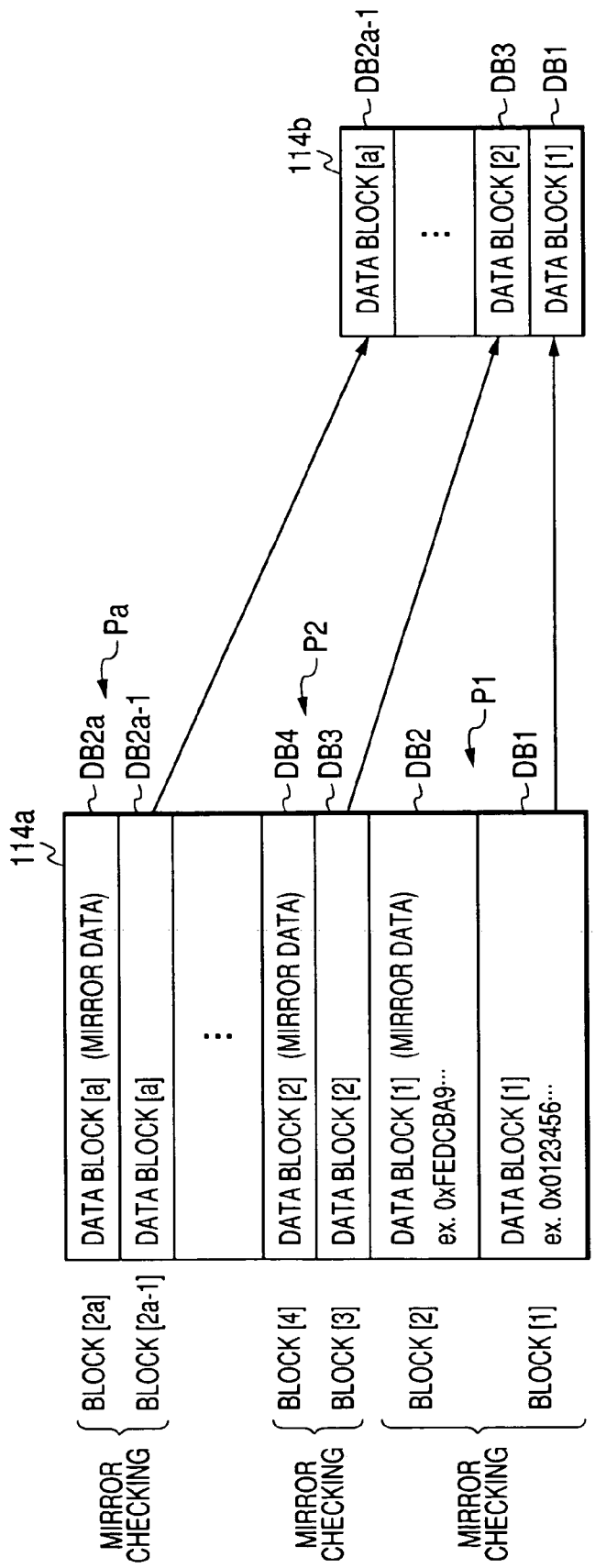
FIG. 8 is a view schematically illustrating extracting and storing processing to be executed by the CPU of the engine control unit illustrated in FIG. 1.

Specifically, as illustrated in FIG. 8 as an example, the CPU 111 stores, in a first memory area 114a of the data memory 114, the data blocks DB1, DB3, . . . , DB2a-1 of the reprogramming factor data and the complement data blocks DB2, DB4, . . . , DB2a of the mirror data such that the data blocks DB1, DB3, . . . , DB2a-1 of the reprogramming factor data are paired to the complement data blocks DB2, DB4, . . . , DB2a of the mirror data, respectively.

Subsequently, the CPU 111 verifies the reprogramming factor data and the mirror data stored in the first memory area 114a of the data memory 114. Next, the CPU 111 extracts, as validated data, at least one item of the reprogramming factor data when it is determined that the at least one item of the reprogramming factor data meets the predetermined rule against corresponding at least one item of the mirror data based on the verified result.

Specifically, in step S134, the CPU 111 performs mirror checking of items of the reprogramming factor data and those of the mirror data. In the first embodiment, as illustrated in FIG. 8, the CPU 111 determines whether the data items (data blocks) of each pair are complement of each other.

As a result of the mirror checking, the CPU 111 extracts at least one data block of the reprogramming factor data when it is determined that the at least one data block of the reprogramming factor data is the complement of the corresponding at least one data block of the mirror data. Thereafter, the CPU 111 stores the extracted at least one data block of the reprogramming factor data in a second memory area 114b of the data memory 114.

For example, when it is determined that all data blocks of reprogramming factor data are the complements of corresponding data blocks of the mirror data, the CPU 111 sequentially combines the extracted data blocks [1] to [a] (data blocks DB1 to DB2a-1), thereby decoding the reprogramming factor data.

As a result of the data extracting task in step S134, when it is determined that the reprogramming factor data consisting of the data blocks [1] to [a] is decoded (the determination in step S135 is YES), the CPU 111 performs the set of steps S136 and S137. Specifically, the CPU 111 reprograms data items in the data memory to be reprogrammed based on the decoded reprogramming factor data in step S136.

After check of completion of the reprogramming of the data items, the CPU 111 sends, to the master control unit 140, a reprogramming completion signal indicative of completion of reprogramming of data items stored in the engine control unit 110. This permits the master control unit 140 to set the reprogramming completion flag in response to receiving the reprogramming completion signal.

Otherwise if it is determined that at least one of the data blocks [1] to [a] of the reprogramming factor data is not decoded, in other words, the mirror checking fails on at least one of the data blocks [1] to [a] of the reprogramming factor data (step S135→NO), the reprogramming factor data for actually use in reprogramming is not decoded.

In this case, as described above, the CPU 111 determines that the items of the reprogramming factor data and the mirror data sent from the management center 200 by radio communications have no validity, thus to provide the master control unit 140 with a re-sending request of the reprogramming factor data and the mirror data in step S138. This permits the master control unit 140 to perform the sending processing for requesting, to the management center 200, re-sending of the reprogramming factor data and the mirror data (see FIG. 6).

FIG. 9 schematically illustrates a specific example of the data extracting task in step S134.

Note that, as already illustrated in FIG. 8, the reprogramming factor data and the mirror data that have been divided into the data blocks [1], [2], . . . [2a-1], [2a], and the data blocks [1], [2], . . . [2a-1], [2a] have been stored as the data block DB1, DB2, . . . , DB2a-1, DB2a in the first memory area 114a of the data memory 114.

In data extracting task, as illustrated in FIG. 9, when the odd blocks [1], [3], . . . [2a-1] of the blocks [1], [2], . . . [2a-1], [2a] are expressed by [2n-1 (n is an integer)], and the remaining even blocks [2], [4], . . . , [2a] are expressed by [2n], the CPU 111 assigns "1" to the variable n in step Next, the CPU 111 repeats the following set of steps S1002, S1003, and S1011, which permits each pair of the data blocks [1] to [2a] of the reprogramming factor data and the mirror data to be subjected to the mirror checking set forth above:

In step S1002, the CPU 111 determines whether the data block [2n] is the complement of the data block [2n-1].

In step S1003, the CPU 111 determines whether all of the data blocks [1] to [2a] are subjected to the mirror checking.

In step S1011, the CPU 111 adds [1] to the variable [n].

Specifically, when "1" is assigned to the variable "n" in step S1001, in step S1002, first, the data block DB1 and DB2 are subjected to the mirror checking. For example, in the first embodiment, the mirror checking is carried out as determination whether the sum of the value 0x0123456 . . . of the DB1 and the value 0xFEDCBA9 . . . of the DB2 matches an expected value 0xFFFFFFFF . . . that should be normally obtained by the sum of the value of the DB1 and that of the DB2.

If it is determined that the sum of the value 0x0123456 . . . of the DB1 and the value 0xFEDCBA9 . . . of the DB2 matches the expected value, the mirror checking is established in the data blocks DB1 and DB2, in other words, the predetermined rule is established in the data blocks DB1 and DB2. Then, the task required to execute the mirror checking for the data block DB3 and DB4 is carried out.

Specifically, in step S1011, "1" is added to the variable "n", and thereafter, the operations in steps S1002 and 1003 are executed again. This allows, in step S1002, the mirror checking to be applied to the data blocks DB3 and DB4 in the same manner as the data blocks DB1 and DB2.

As a result of repeat executions of the set of steps S1002, S1003, and S1011, in step S1003, if it is determined that all of the data blocks [1] to [2a] are subjected to the mirror checking, the CPU 111 executes the set of steps S1004 and S1005.

Specifically, in step S1004, the CPU 111 extracts, as the validated data, the data blocks [1] to [a] (data blocks DB1, DB3, . . . , DB2a-1) from the data blocks DB1 to DB2a of the reprogramming factor data and the mirror data stored in the first memory area 114a of the data memory 114. Then, the CPU 111 sequentially combines the extracted data blocks [1] to [a] to decode (demodulate) the reprogramming factor data, and stores the combined set of the data blocks [1] to [a] in the second memory area 114b of the data memory 114.

When the reprogramming factor data is decoded as a result of the data extracting task illustrated in FIG. 7, the CPU 111 sets a mirror flag in, for example, the data memory 114; this mirror flag represents that the mirror checking is established. This allows the CPU 111 to determine whether the reprogramming factor data is decoded based on the state of the mirror flag.

As a result of repeat execution of the set of steps S1002, S1003, and S1011, it may be determined that the mirror checking is not established, in other words, the predetermined rule is not satisfied. In this case, the CPU 111 probably determines that the items of data sent from the management center 200 are unauthorized data and/or illegal modified data, thereby exiting the data extracting task upon determination such that the mirror checking is not established without setting the mirror flag.

As described above, the in-vehicle control system 100 according to the first embodiment can obtain the first and second effects described hereinafter.

Specifically, as the first effect, in reprogramming data items of control programs and/or control data stored in at least one of the ECUs 110, 120, and 130, when the items of the reprogramming data for use in reprogramming to each of which the same identifier is attached are received, it is possible to:

verify the received items of the reprogramming data against each other; and extract, as the validated data, at least one of the items of the reprogramming data when it is determined that the at least one of the items of the reprogramming data meets a predetermined rule against at least one remaining item based on the verified result.

This permits the security level associated with the control program and data reprogramming to be highly maintained.

As the second effect, it is possible to employ, as the items of the reprogramming data, the reprogramming factor data with validity and the mirror data that is the complement thereof without validity. This permits the security level of at least one item itself extracted from the items of the reprogramming data to be more highly maintained.

SECOND EMBODIMENT

An in-vehicle control system according to a second embodiment of the present invention will be described hereinafter. The in-vehicle control system of the second embodiment has substantially the same structure as that of the in-vehicle control system of the first embodiment. For this reason, like reference characters are assigned to like parts in the in-vehicle control systems according to the first and second embodiments so that descriptions of the parts of the in-vehicle control system of the second embodiment will be omitted.

Specifically, the in-vehicle control system 100 of the second embodiment is basically composed of:

a plurality of ECUs 110, 120, and 130 that are distributedly arranged and operative to cooperatively perform the corresponding control operations of the corresponding in-vehicle devices (targets); and a master control unit 140 operative to perform centralized control over the plurality of ECUs 110, 120, and 130.

A bus type communications network 101 allows the master control unit 140 and the ECUs 110, 120, and 130 to communicate data with each other. The system configuration of each of the master control unit 140 and each of the ECUs 110, 120, and 130 of the in-vehicle control system of the second embodiment is substantially equivalent to that illustrated in FIG. 2.

Substantially like the first embodiment, in the second embodiment, the in-vehicle control system 100 is configured to:

receive a plurality of items of the reprogramming data to each of which the same identifier is attached, which has been sent from the management center 200;

verify the received items of the reprogramming data against each other; and extract, as validated data, at least one of the items of the reprogramming data when it is determined that the at least one of the items of the reprogramming data meets a predetermined rule against at least one remaining item based on the verified result.

Figure 3:
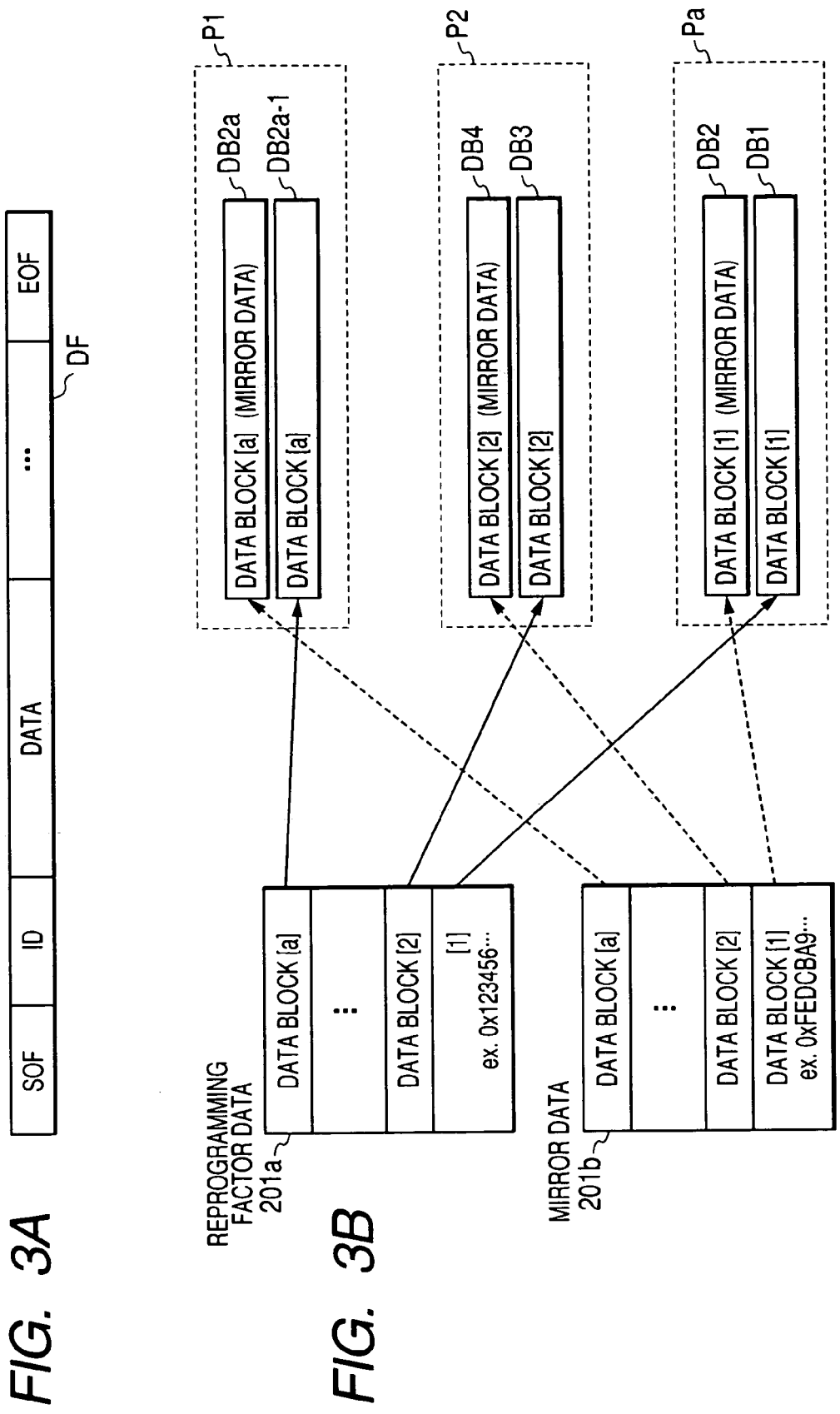
FIG. 3A is a view schematically illustrating an example of the structure of data to be communicable between a management center and the in-vehicle control system illustrated in FIG. 1.
FIG. 3B is a view schematically illustrating an example of the structure of a management-center's memory in which reprogramming factor data and mirror data as items of reprogramming data are stored in advance, and an example of how to send the reprogramming factor data and the mirror data by the management center.

Note that, in the second embodiment, as illustrated in FIGS. 10 and 11 compared to FIGS. 3 and 8, an example of how to send items of the reprogramming data by the management center and that of how to extract the reprogramming factor data thereby are difference from those in the first embodiment.

The sending operations of the reprogramming data by the management center 200 will be described hereinafter with reference to FIGS. 10A and 10B.

FIG. 10A schematically illustrates an example of the structure of data to be communicable between the management center 200 and the in-vehicle control system 100. FIG. 10B schematically illustrates an example of the structure of the management-center's memory in which the items of the reprogramming data are stored in advance. FIG. 10B also schematically illustrates an example of how to send the reprogramming data by the management center 200.

As illustrated in FIG. 10A, in the second embodiment, each of the items of reprogramming data is processed between the management center 200 and the in-vehicle control system 100 as a data frame DF. The data frame DF is a self-contained unit of data to be processed between the management center 200 and the in-vehicle control system 100.

Specifically, the data frame DF consists of a plurality of fields and a check code. The data frame DF is configured to be sent in packet. Note that, when each of the items of the reprogramming data is processed as the data frame DF, the same identifier is attached to each of the items of the reprogramming data.

The data configuration of the data frame DF is substantially equivalent to that of the data frame DF according to the first embodiment.

As illustrated in FIG. 10B, in the management center 200, in place of the mirror data complement of the reprogramming factor data, dummy data as non-validation data that is inconsistent with the reprogramming factor data (validation data) is used.

Each of the reprogramming factor data and the dummy data is divided into a plurality of data blocks [1] to [b], where "b" represents a predetermined integer. The data blocks [1] to [b] of the reprogramming factor data are stored in advance a first memory area 201c of the center 200. Similarly, the data blocks [1] to [b] of the dummy data are stored in advance a second memory area 201d of the center 200.

In sending the reprogramming factor data and the dummy data, the management center 200 sequentially reads out the reprogramming factor data and the dummy data in the order from the block [1] to the block [b].

In addition, the management center 200 combines a pair of the same readout blocks of the reprogramming factor data with the readout block of the dummy data, thereby sending the set of three items of the block data as the items of the reprogramming data.

For example, as illustrated in FIG. 10B, upon double readout of one block sequentially from the block [1] to the block [b] of the reprogramming factor data, one block from the block [1] to the block [b] of the dummy data is sequentially extracted. The double readout of each block of the reprogramming factor data is combined with the corresponding readout one block of the dummy data.

This allows the set of a group G1 to a group Gb to be generated. The group G1 consists of a pair DB1 and DB2 of the data block [1] of the reprogramming factor data and the data block DB3 (data block [1]) of the dummy data. The group Gb consists of a pair DB3b−2 and DB3b−1 of the data block [b] of the reprogramming factor data and the data block [b] (data block [1]) of the dummy data.

The management center 200 categorizes data blocks DB1, DB2, DB3, . . . , DB3b−2, DB3b−1, DB3b such that a plurality of the data frames DF contain the data blocks DB1, DB2, DB3, . . . , DB3b−2, DB3b−1, DB3b, respectively. Next, the management center 200 sequentially sends the plurality of data frames DF to the in-vehicle control unit 100 in packet or in block, respectively.

When the items of the reprogramming factor data and the dummy data are sent from the management center 200 in the sending way described above, the master control unit 140 performs:

receiving processing for receiving the reprogramming factor data and the dummy data; and storing them in the data memory 144, which is similar to the first embodiment (see FIG. 4).

Next, when the items of the reprogramming factor data and the dummy data are received in the data memory 144, the master control unit 140 performs sending processing. The sending processing is to send the received items of the reprogramming factor data and the dummy data to the engine control unit 110 as a target to be reprogrammed, which is similar to the first embodiment (see FIG. 5).

Subsequently, when the items of the reprogramming factor data and the dummy data are received in the engine control unit 110, as illustrated in FIG. 7, the CPU 111 performs reprogramming processing for reprogramming data items to be reprogrammed, which are stored in advance in the program memory 111.

As described above, in FIG. 7, a specific example of the data extracting task in step S134 is different between the first embodiment and the second embodiment.

As illustrated in FIG. 11, in the engine control unit 110, the items of the reprogramming factor data and the mirror data are divided into the blocks [1] to [3b], and the data blocks [1] to [3b] have been stored in a first memory area 114c of the data memory 114 as the data blocks DB1 to DB3b.

Specifically, the set of groups G1 to Gb have been sequentially stored in the first memory area 114c of the data memory 114. The group G1 consists of the pair DB1 and DB2 of the data block [1] of the reprogramming factor data and the data block DB3 (data block [1]) of the dummy data. Moreover, the group Gb consists of the pair DB3b−2 and DB3b−1 of the data block [b] of the reprogramming factor data and the data block DB3b (data block [b]) of the dummy data.

In data extracting task with respect to the first memory area 114c, the CPU 111 performs identical checking of items of the reprogramming factor data and those of the dummy data such that at least two of the three data items of each group are identical to each other. In the second embodiment, as illustrated in FIG. 11, the CPU 111 performs the identical checking operations of the three data items of each group.

As a result of the identical checking, the CPU 111 extracts at least one data block of the reprogramming factor data when it is determined that the at least one data block of the reprogramming factor data is identical to at least one data block of the other data items of each group. Then, the CPU 111 stores the at least one data block of the reprogramming factor data in a second memory area 114d of the data memory 114.

For example, when it is determined that the identical checking is established to all data blocks of the reprogramming factor data and the dummy data, the CPU 111 sequentially combines the extracted data blocks [1] to [b] (data blocks DB1 to DB3b−2), thereby decoding the reprogramming factor data.

FIG. 12 schematically illustrates a specific example of the data extracting task in step S134 according to the second embodiment.

Note that, as illustrated in FIG. 12, the data blocks [1] to [3b] (see FIG. 11) are expressed by [3n−2 (n is an integer)], [3n−1], or [3n] for each block.

In data extracting processing, the CPU 111 assigns "1" to the variable n in step S2100.

Next, the CPU 111 repeats the following set of steps S2200, S2300, S2400, and S2700, which permits each group consisting of the data blocks [3n−2], [3n−1], and [3n] of the reprogramming factor data and the dummy data to be subjected to the identical checking set forth above:

In step S2200, the CPU 111 determines whether the three items [3n−2], [3n−1], and [3n] of each group is identical to each other.

In step S2300, the CPU 111 extracts at least one item from the three items [3n−2], [3n−1], and [3n] of each group based on the check result in step S2200.

In step S2400, the CPU 111 determines whether all of the data blocks [1] to [3b] are subjected to the identical checking.

In step S2700, the CPU 111 adds [1] to the variable [n].

Specifically, in step S2100, [1] is added to the variable [n], and thereafter, in step S2200, the identical checking for the data blocks [1] to [3] corresponding to the data blocks DB1 to DB3 in the data blocks [1] to [3b] is performed.

Specifically, in step S2201 of step S2200, the CPU 111 determines whether the data block DB1 is identical to the data block DB2. In step S2201, if it is determined that the data block DB1 is non-identical to the data block DB2 (the determination in step S2201 is NO), the CPU 111 determines whether the data block DB1 is identical to the data block DB3 in step S2202. If it is determined that the data block DB1 is non-identical to the data block DB3 (the determination in step S2202 is NO), the CPU 111 determines whether the data block DB2 is identical to the data block DB3 in step S2203.

In any one of the steps S2201 to S2203, the data identity is established, the CPU 111 recognizes that at least two of the three data blocks of each group are identical to each other, in other words, the identical checking established, proceeding to step S2300. In step S2300, the CPU 111 extracts one data item from the at least two data blocks of each group.

Specifically, in step S2301 of step S2300, the CPU 111 extracts the data block DB1 from the three data items DB1 to DB3 when it is determined that the data block DB1 is identical to at least one of other data blocks DB2 and DB3 in step S2201 or S2202.

On the other hand, in step S2302 of step S2300, the CPU 111 extracts the data block DB2 from the three data items DB1 to DB3 when it is determined that the data block DB2 is identical to the data block DB3 in step S2203.

After the identical checking for the blocks [1] to [3] has been established, the CPU 111 executes the steps S2400 and S2700 required to execute the next group of the three blocks [4] to [6].

After the task in step S2700 has been completed, the CPU 111 executes the set of steps S2200, S2300, S2400, and S2700) again. Because "1" is added to the variable "n" in step S2700, the identical checking is applied to the three blocks DB4 to DB6 corresponding to the blocks [4] to [6].

Specifically, every addition of the variable "n" to "1" in step S2700, the set of three blocks to which the identical checking is applied are sequentially changed in the order from the three blocks [4] to [6] to the three blocks [3b−2] to [3b] in step S2200.

As a result of repeat executions of the set of steps S2200, S2300, S2400, and S2700, in step S2400, if it is determined that all of the data blocks [1] to [3b] are subjected to the identical checking, the CPU 111 executes the set of steps S2500 and S2600.

Specifically, in step S2500, as illustrated in FIG. 11, the CPU 111 reads out the data blocks DB1, DB4, . . . , DB3b−2 that have been extracted, as the validated data, from the data blocks DB1 to DB3b of the reprogramming factor data and the dummy data. Next, the CPU 111 sequentially combines the readout data blocks DB1, DB4, . . . , DB3b−2 to decode the reprogramming factor data, and stores the combined set of the data blocks DB1, DB4, DB3b−2 in the second memory area 114d of the data memory 114.

When the reprogramming factor data is decoded as a result of the data extracting task illustrated in FIG. 12, the CPU 111 sets an identical flag in, for example, the data memory 114 in step S2600; this identical flag represents that the identical checking is established. This allows the CPU 111 to determine whether the reprogramming factor data is decoded based on the state of the mirror flag, and thereafter, the CPU 111 exits the data extracting processing.

As a result of repeat execution of the set of steps S2200, S2300, S2400, and S2700, it may be determined that, in step S2200 (step S2203), all of the three blocks of one group are not identical to each other, in other words, the identical checking is not established (the predetermined rule is not satisfied). In this case, the CPU 111 probably determines that the data sent from the management center 200 are unauthorized data and/or illegal modified data, thereby exiting the data extracting task upon determination such that the identical checking is not established without setting the identical flag.

In step S135 (see FIG. 7), therefore, the determination whether the reprogramming factor data is decoded is carried out depending on the state of the identical flag.

As described above, the in-vehicle control system 100 according to the second embodiment can obtain substantially the same effects as the first and second effects according to the first embodiment.

THIRD EMBODIMENT

An in-vehicle control system according to a third embodiment of the present invention will be described hereinafter. The in-vehicle control system of the third embodiment has substantially the same structure as that of the in-vehicle control system of the second embodiment. For this reason, like reference characters are assigned to like parts in the in-vehicle control systems according to the second and third embodiments so that descriptions of the parts of the in-vehicle control system of the third embodiment will be omitted.

Substantially like the second embodiment, in the third embodiment, the in-vehicle control system 100 is configured to:

receive a plurality of items of the reprogramming data (the reprogramming factor data and the dummy data) to each of which the same identifier is attached, which has been sent from the management center 200;

verify the received items of the reprogramming data (the reprogramming factor data and the dummy data) against each other; and extract, as validated data, at least one of the items of the reprogramming data when it is determined that the at least one of the items of the reprogramming data meets a predetermined rule against at least one remaining item based on the verified result.

Note that, in the third embodiment, as illustrated in FIGS. 13 and 14 compared to FIGS. 10 and 11, an example of how to send the reprogramming factor data and the dummy data by the management center and that of how to extract the reprogramming factor data thereby are difference from those in the second embodiment.

The sending operations of the reprogramming factor data and the mirror data of the reprogramming data by the management center 200 will be described hereinafter with reference to FIGS. 13A and 13B.

Figures 13A, 13B:
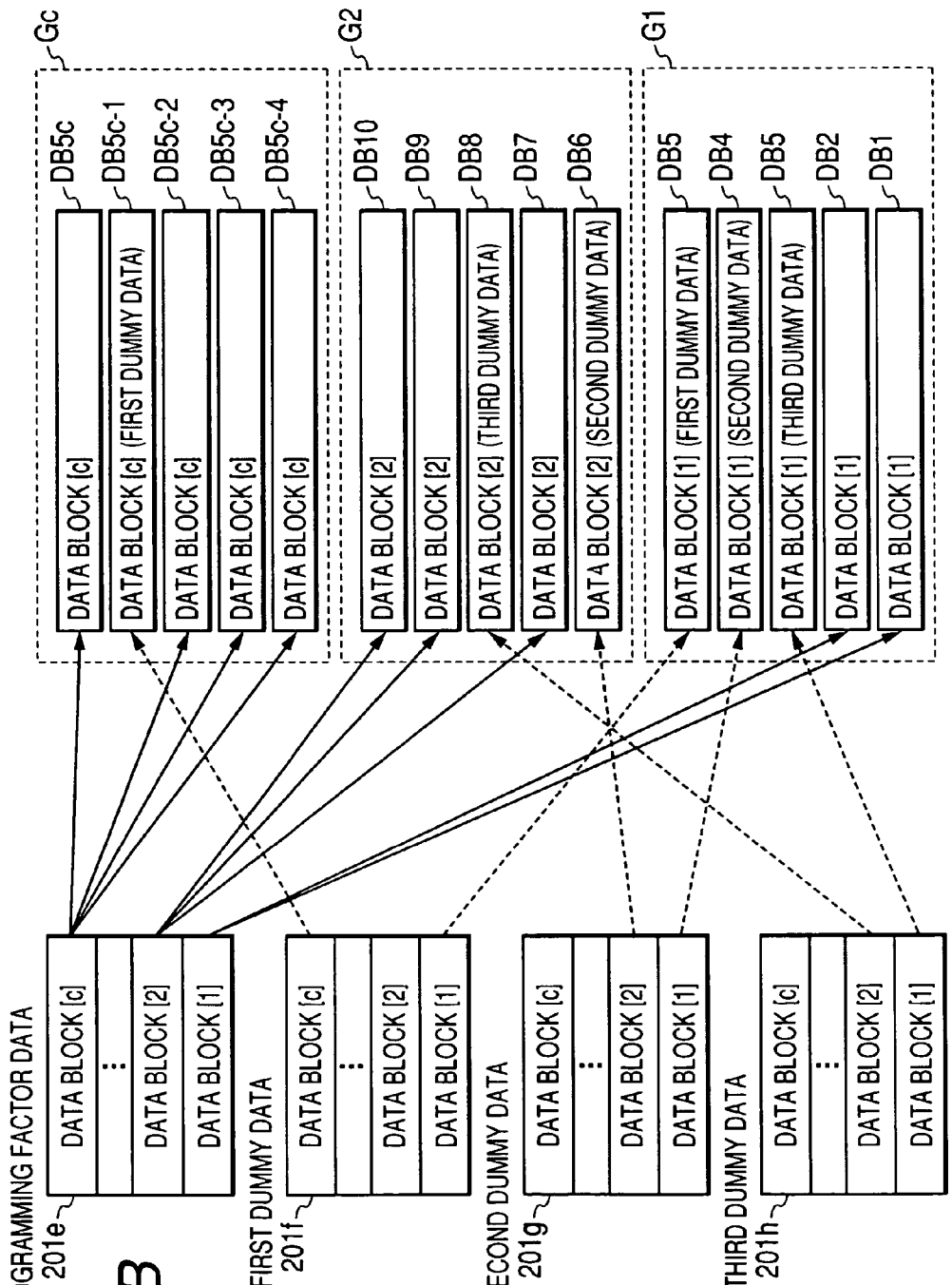
FIG. 13A is a view schematically illustrates an example of the structure of data to be communicable between the management center and the in-vehicle control system according to the second embodiment.
FIG. 13B is a view schematically illustrates an example of the structure of the management-center's memory in which items of the reprogramming data are stored in advance, and an example of how to send the reprogramming data by the management center according to the second embodiment.

FIG. 13A schematically illustrates an example of the structure of data to be communicable between the management center 200 and the in-vehicle control system 100. FIG. 13B schematically illustrates an example of the structure of the management-center's memory in which the items of the reprogramming data are stored in advance. FIG. 13B also schematically illustrates an example of how to send the reprogramming data by the management center 200.

As illustrated in FIG. 13A, in the third embodiment, each of the items of reprogramming data is processed between the management center 200 and the in-vehicle control system 100 as a data frame DF. The data frame DF is a self-contained unit of data to be processed between the management center 200 and the in-vehicle control system 100.

Specifically, the data frame DF consists of a plurality of fields and a check code. The data frame DF is configured to be sent in packet. Note that, when each of the items of the reprogramming data (the reprogramming factor data and the dummy data) is processed as the data frame DF, the same identifier is attached to each of the items of the reprogramming data (the reprogramming factor data and the dummy data).

The data configuration of the data frame DF is substantially identical to that of the data frame DF according to each of the first and second embodiments.

As illustrated in FIG. 13B, in the management center 200 according to the third embodiment, first to third dummy data as non-validation data that are inconsistent with the reprogramming factor data (validation data) are used.

Each of the reprogramming factor data and each of the first to third dummy data are divided into a plurality of data blocks [1] to [c], where "c" represents a predetermined integer. The data blocks [1] to [c] of the reprogramming factor data are stored in advance in a first memory area 201e of the center 200. Similarly, the data blocks [1] to [c] of the first to third dummy data are stored in advance in second to fourth memory areas 201f to 201h of the center 200, respectively.

In sending the reprogramming factor data and the first to third dummy data, the management center 200 sequentially reads out the reprogramming factor data and each of the first to third dummy data in the order from the block [1] to the block [c] under the following first to third conditions:

The first condition is that five data blocks in each of the data blocks [1] to [c] are combined to be readout.

The second condition is that each combined group of five blocks includes at least one of the first to third dummy data.

The third condition is that the largest number of identical blocks in a group with respect to each of the reprogramming factor data, and the first to third dummy data corresponds to the number of identical blocks for the reprogramming factor data.

For example, as illustrated in FIG. 13B, upon double readout of one block [1] from the reprogramming factor data, one block [1] from each of the first to third dummy data is extracted. The double readout of block [1] of the reprogramming factor data is combined with the corresponding readout blocks [1] of the first to third dummy data to form a group G1.

Because the group G1 consists of the five blocks [1], the first condition is satisfied, and because the group G1 includes the blocks [1] of the first to third dummy data, the second condition is satisfied. In addition, because the largest number of identical blocks in a group (five combined blocks) with respect to each of the reprogramming factor data, and the first to third dummy data is "2" with respect to the reprogramming factor data.

This allows the set of the group G1 to a group Gc to be generated. The group G1 consists of the five combined blocks DB1 to DB5 of the data blocks [1] of the reprogramming factor data and the first to third dummy data. The group Gc consists of the five combined blocks DB5c−4 to DB5c of the data blocks [c] of the reprogramming factor data and the first dummy data to be generated.

The management center 200 categorizes data blocks DB1, DB2, DB3, . . . , DB5c such that a plurality of the data frames DF contain the data blocks DB1, DB2, DB3, . . . , DB5c, respectively. Next, the management center 200 sequentially sends the plurality of data frames DF to the in-vehicle control unit 100 in packet or in block, respectively.

The items of the reprogramming factor data and the first to third dummy data are sent from the management center 200 in the sending way described above. The CPU 111 of the engine control unit 110 receives the items of the reprogramming factor data and the first to third dummy data, and, as illustrated in FIG. 14, stores them in a first memory area 114e of the data memory 114 as the data blocks [1] to [5c] corresponding to the data blocks DB1 to DB5cl.

In data extracting task with respect to the first memory area 114e, the CPU 111 extracts items of reprogramming factor data in step S134 with validity in the following manner.

Specifically, in the third embodiment, the CPU 111 performs majority-rule checking of items of the reprogramming factor data and those of the first to third dummy data to determine whether there is the largest number of identical blocks in a group (five combined items) of the reprogramming factor data, and the first to third dummy data every group.

As a result of the majority-rule checking, if it is determined that there is the largest number of identical blocks in a group (five combined items) with respect to the reprogramming factor data, and the first to third dummy data, the majority-rule checking is established, in other words, the predetermined rule is satisfied. Then, the CPU 111 extracts, as the validated data, at least one of the identical data items (blocks) of each group from the five data items thereof. Thereafter, as illustrated in FIG. 14, the CPU 111 sequentially combines the extracted data blocks DB1, DB7 . . . , DB5c–4, thereby storing them in a second memory area 114f of the data memory 114. This allows the reprogramming factor data to be decoded in the second memory area 114f of the data memory 114.

Figure 15:
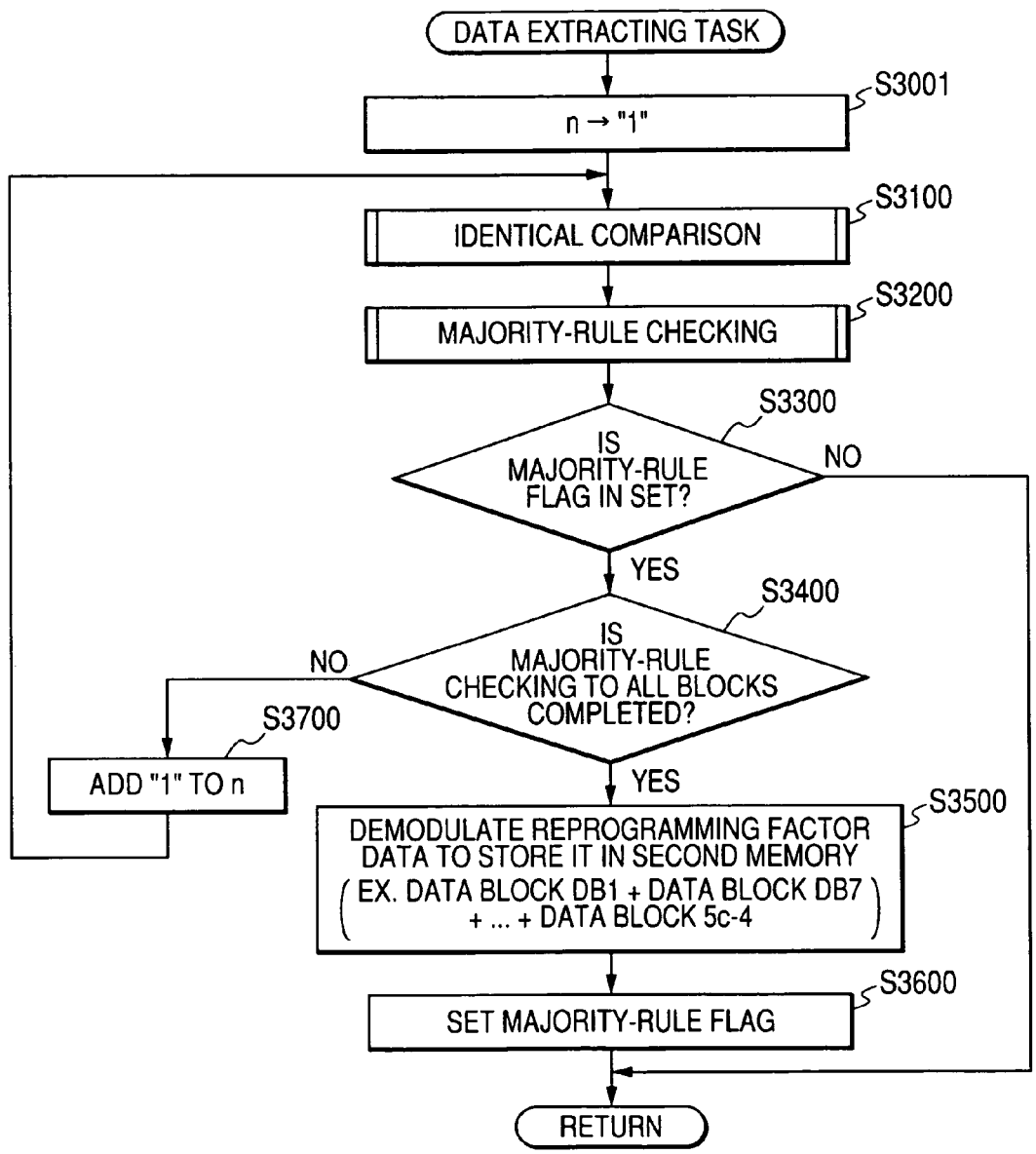
FIG. 15 is a flowchart schematically illustrating a specific example of data extracting task in step S134 of FIG. 7 according to the third embodiment.

FIG. 15 schematically illustrates a specific example of the data extracting task in step S134 according to the third embodiment.

Note that, as illustrated in FIG. 15, the data blocks [1] to [5c] (see FIG. 14) are expressed by [5n–4 (n is an integer)], [5n–3], [5n–2], [5n–1], or [5n] for each block.

As illustrated in FIG. 15, in data extracting processing, the CPU 111 assigns "1" to the variable n in step S3001.

Next, the CPU 111 repeats the following set of steps S3100, S3200, S3300, S3400, and S3700, which permits each group consisting of the five data blocks [5n–4] to [5n] of the reprogramming factor data and the first to third dummy data for each group to be subjected to the majority-rule checking set forth above:

In step S3100, the CPU 111 determines whether the five blocks [5n–4] to [5n] of each group is identical to each other.

In step S3200, the CPU 111 performs a majority-rule checking task to:

subject the five blocks [5n–4] to [5n] of each group to the majority-rule checking based on the result of identical comparison in step S3100, and set a majority-rule flag on condition that the majority-rule checking is established.

In step S3300, the CPU 111 checks the state of the majority-rule flag.

In step S3400, the CPU 111 determines, whether all of the data blocks [1] to [5c] are subjected to the majority-rule checking.

In step S3700, the CPU 111 adds [1] to the variable [n].

Figure 16A:
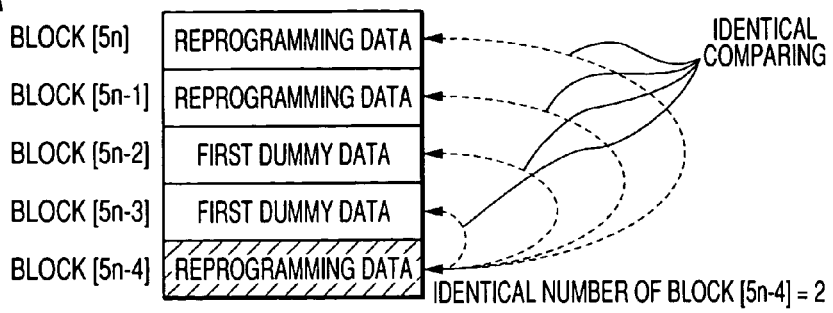
FIG. 16A is a view schematically illustrating a data block [5n−4] in five data blocks [5n−4] to [5n] is used as a reference against the remaining data blocks therein in executing identical checking according to the third embodiment.

Specifically, in step S3100, as illustrated in FIG. 16A, the data block [5n–4] in the five data blocks [5n–4] to [5n] is used as a reference against the remaining data blocks therein, and it is determined whether each of the remaining data blocks [5n–3] to [5n] is identical to the reference data block [5n–4].

Figure 16B:
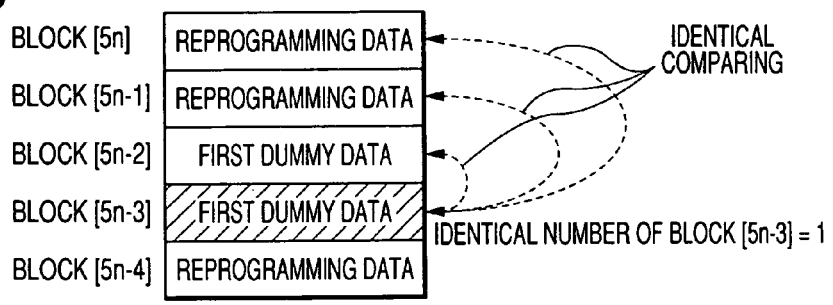
FIG. 16B is a view schematically illustrating a data block [5n−3] in the five data blocks [5n−4] to [5n] is used as a reference against the remaining data blocks therein in executing the identical checking according to the third embodiment.

After the identical comparison using the data block [5n–4] as a reference, as illustrated in FIG. 16B, the data block [5n–3] is used as a reference against the remaining data blocks therein, and it is determined whether each of the remaining data blocks [5n–4], and [5n–2] to [5n] is identical to the reference data block [5n–3].

Figure 16C:
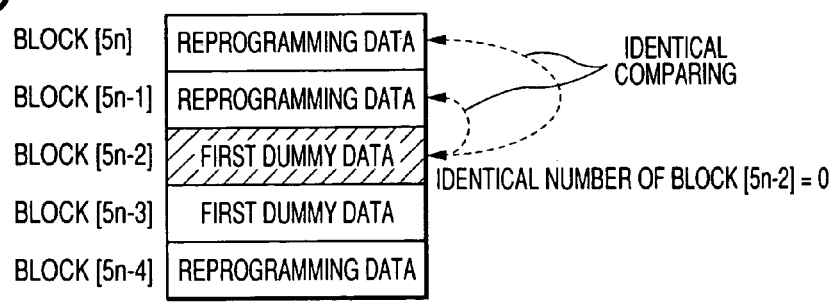
FIG. 16C is a view schematically illustrating a data block [5n−2] in the five data blocks [5n−4] to [5n] is used as a reference against the remaining data blocks therein in executing the identical checking according to the third embodiment.

After the identical comparison using the data block [5n–3] as a reference, as illustrated in FIG. 16C, the data block [5n–2] is used as a reference against the remaining data blocks therein, and it is determined whether each of the remaining data blocks [5n–4], [5n–3], [5n–1], and [5n] is identical to the reference data block [5n–2].

Figure 16D:
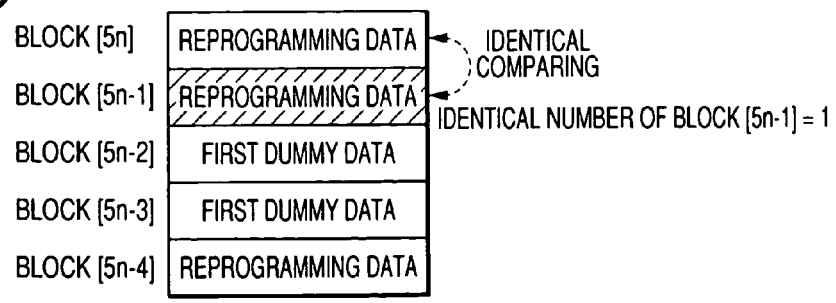
FIG. 16D is a view schematically illustrating a data block [5n−1] in the five data blocks [5n−4] to [5n] is used as a reference against the remaining data blocks therein in executing the identical checking according to the third embodiment.

After the identical comparison using the data block [5n–2] as a reference, as illustrated in FIG. 16D, the data block [5n–1] is used as a reference against the remaining data blocks therein, and it is determined whether each of the remaining data blocks [5n–4], [5n–3], [5n–2], and [5n] is identical to the reference data block [5n–1].

As illustrated in FIGS. 16A to 16D, for example, the four numbers "2", "1", "0", and "1" of identical blocks in the five data blocks [5n–4] to [5n] with respect to the references of blocks [5n–4], [5n–3], [5n–2], and [5n–1] are obtained, respectively. In this case, in step S3200, it is determined that the number of identical blocks of "2" in the case of using the reference of block [5n–4] is the largest number. Then, the data block [5n–4] is extracted as the validated data from the five data blocks [5n–4] to [5n], and therefore the majority-rule flag is in set; this majority-rule flag represents that the majority-rule checking is established.

In step S3400, on condition that the majority-rule flag is in set (see step S3300), it is determined whether all blocks [1] to [5c] are subjected to the majority-rule checking. If it is determined that all blocks [1] to [5c] are not subjected to the majority-rule checking, "1" is added to the variation "n" by the CPU 111 in step S3700, and thereafter, the steps S3100 and 3200 are executed again, so that the five data blocks of the next group are subjected to the majority-rule checking.

As a result of repeat executions of the set of steps S3100, S3200, S3300, S3400, and S3700, in step S3400, if it is determined that all of the data blocks [1] to [5c] have been already subjected to the majority-rule checking, the CPU 111 executes the set of steps S3500 and S3600.

Specifically, in step S3500, as illustrated in FIG. 14, the CPU 111 reads out the data blocks DB1, DB7 . . . , DB5c–4 that have been extracted, as the validated data, from the data blocks DB1 to DB5c of the reprogramming factor data and the dummy data for each group. Next, the CPU 111 sequentially combines the readout data blocks DB1, DB7, . . . , DB5c–4 to decode the reprogramming factor data, and stores the combined set of the data blocks DB1, DB7, . . . , DB5c–4 in the second memory area 114f of the data memory 114.

When the reprogramming factor data is decoded as a result of the data extracting task illustrated in FIG. 15, the majority-rule flag is set in, for example, the data memory 114. This allows the CPU 111 to determine whether the reprogramming factor data is decoded based on the state of the majority-rule flag, and thereafter, the CPU 111 defines the state of the majority-rule flag, exiting the data extracting processing.

As a result of repeat execution of the set of steps S3100, S3200, S3300, S3400, and S3700, in step S3300, if no majority-rule flag may be set, the CPU 111 probably determines that the data sent from the management center 200 is unauthorized data and/or illegal modified data. Thus, the CPU 111 exits the data extracting task upon determination such that the identical comparison is not established without setting the majority-rule flag.

In step S135 (see FIG. 7), therefore, the determination whether the reprogramming factor data is decoded is carried out depending on the state of the majority-rule flag.

Figure 17:
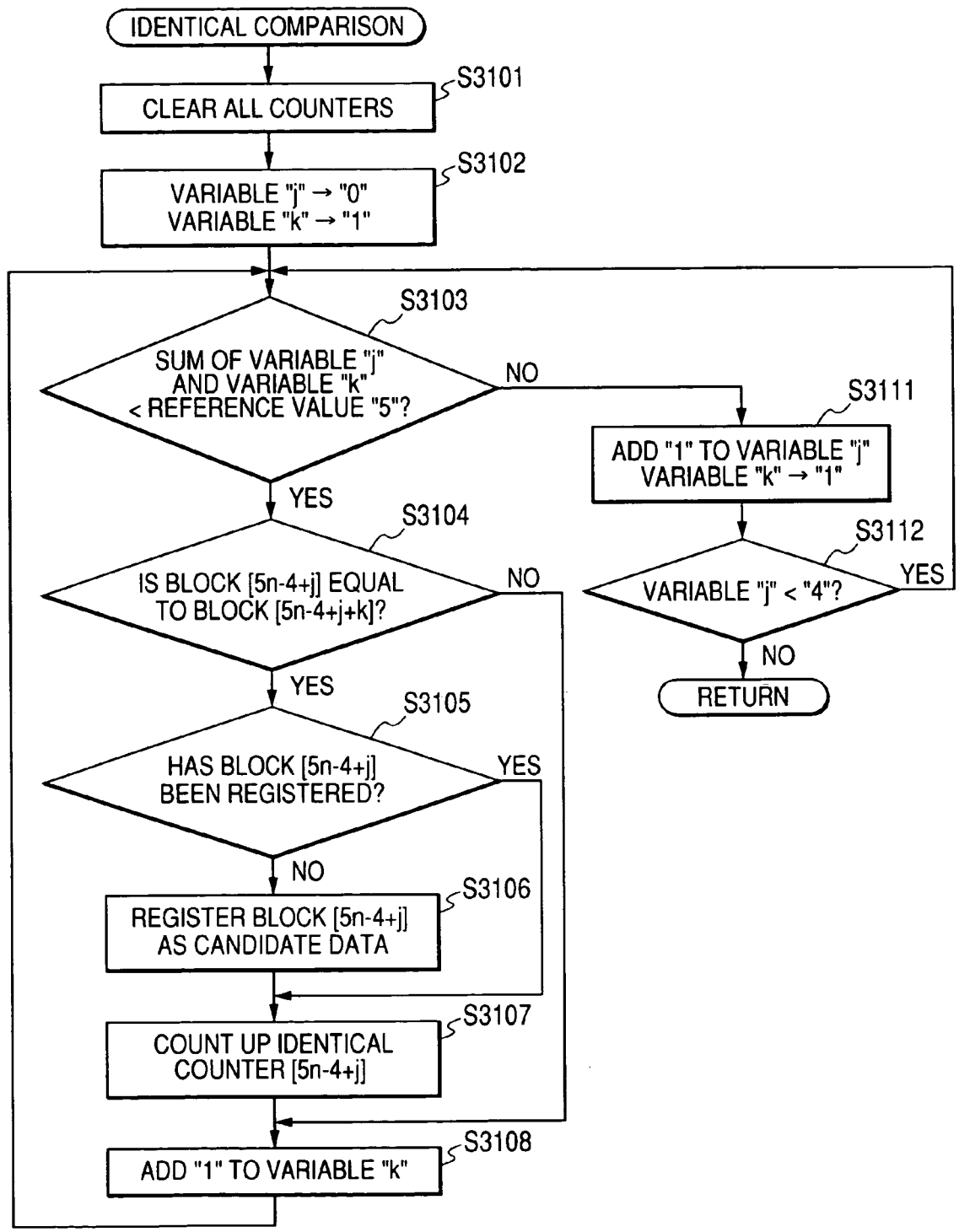
FIG. 17 is a flowchart schematically illustrating an example of the algorithm of identical comparison in step S3100 of FIG. 15.
Figure 18:
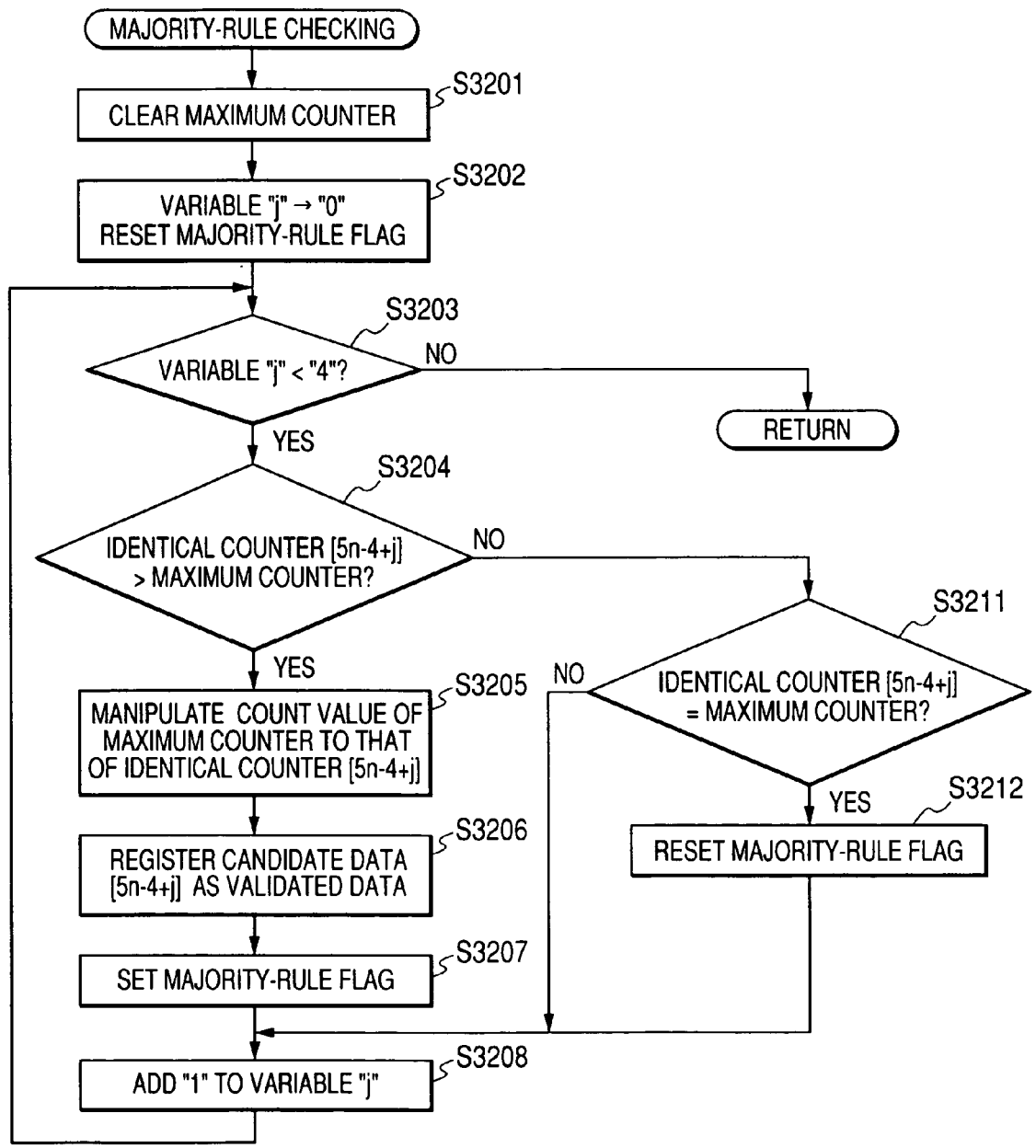
FIG. 18 is a flowchart schematically illustrating an example of the algorithm of majority-rule checking in step S3200 of FIG. 15.

FIG. 17 is a flowchart schematically illustrating an example of the algorithm of the identical comparison in step S3100 of FIG. 15, and FIG. 18 is a flowchart schematically illustrating an example of the algorithm of the majority-rule checking in step S3200 of FIG. 15.

The identical comparison in step S3100 will be described first in reference to FIG. 17.

As set forth above, in the identical comparison, as illustrated in FIGS. 16A to 16D, the combined five data blocks [5n–4] to [5n] of each group are compared with one of the blocks [5n−4] to [5n] as a reference being changed. This determines the four numbers of identical blocks in the five data blocks [5n−4] to [5n] with respect to the references of [5n−4], [5n−3], [5n−2], and [5n−1], respectively. The determined four numbers of identical blocks in the five data blocks [5n−4] to [5n] are stored, as comparison results of the identical comparison, in the data memory 114. In the memory 114, the determined four numbers of identical blocks are associated with corresponding the references of [5n−4] to [5n−1], respectively.

In the third embodiment, as illustrated in FIG. 17, manipulated variables "j", "k", and a plurality of identical number counters will be manipulated in the manner described hereinafter to realize the identical comparison. Note that inner counters of the CPU 111 can be used as the plurality of identical number counters, but outer counters can be prepared and used as the plurality of identical number counters.

As illustrated in FIG. 17, in identical comparison, the CPU 111 clears the count value of each of the identical number counters. Next, the CPU 111 sets the variable "j" to "0", and the variable "k" to "1", and thereafter, the CPU 111 repeats the following set of steps S3103 to S3108. This permits the five data blocks [5n−4] to [5n] to be subjected to the identical comparison based on the data block [5n−4] as a reference against the remaining data blocks therein, thereby determining whether each of the remaining data blocks [5n−3] to [5n] is identical to the reference data block [5n−4]:

In step S3103, the CPU 111 calculates the sum of the variables "j" and "k" to compare the sum value with the combination number "5" of the five compared blocks.

In step S3104, the CPU 111 compares the data block [5n−4+j] with the data block [5n−4+j+k] on condition that the sum value is less than the combination number "5" as a result of the comparison in step S3103.

In step S3105, the CPU 111 checks whether the data block [5n−4+j] has already been registered as candidate data on condition that the data block [5n−4+j] is identical to the data block [5n−4+j+k] as a result of the comparison in step S3104. The candidate data should be extracted as data block whose number of blocks identical thereto in the five data blocks is the largest therein.

In step S3106, the CPU 111 registers the data block [5n−4+j] as the candidate data [5n−4+j] on condition that the data block [5n−4+j] has not been registered yet as the candidate data as a result of the checking in step S3105.

In step S3107, the CPU 111 counts up the count value of the identical number counter [5n−4+j] representing the identical number (comparison result) of the data block [5n−4+j] on condition that the data block [5n−4+j] is identical to the data block [5n−4+j+k] ) as a result of the comparison in step S3104.

In step S3108, the CPU 111 adds "1" to the variable "k".

For example, in steps S3101 and S3102, when the count value of the identical counter [5n−4+j] has been cleared and the variables "j" and "k" have been respectively set to "0" and "1", it is determined that the sum value of the variables "j" and "k" is less than the reference value "5" in step S3103.

Next, in step S3104, the data block [5n−4] used as a reference is compared with the data block [5n−3] to determine whether the data block [5n−4] is identical to the data block [5n−3].

If it is determined that the data block [5n−4] is identical to the data block [5n−3], in steps S3105 and 3106, the data block [5n−4] is registered as the candidate data [5n−4] that should be extracted as data block whose number of blocks identical thereto in a group (five combined blocks) is the largest therein.

Next, as the operation in step S3107, the count value of the identical number counter [5n−4] representing the identical number of the data block [5n−4] is counted up (incremented) so that the count value "1" of the identical number counter [5n−4] is obtained. Thereafter, "1" is added to the variable "k" in step S3108.

In step S3104, it may be determined that the data block [5n−4] is non-identical to the data block [5n−3]. In this case, the CPU 111 shifts to step S3108 without executing the registering operation of the candidate data [5n−4] in step S3106 and the counter manipulating operation in step S3107. That is, the CPU 111 adds "1" to the variable "k" in response to the timing when it is determined that the data block [5n−4] is non-identical to the data block [5n−3].

After execution of the operation in step S3108 set forth above, the set of sequential steps S3103 to S3108 are executed again. Note that, in this execution of the operations in steps S3103 to S3108, because "1" is added to the variable "k", in step S3104, the data block [5n−4] used as a reference is compared with the data block [5n−2] to determine whether the data block [5n−4] is identical to the data block [5n−2].

Specifically, every time "1" is added to the variable "k", the target of identical comparison of the reference data block [5n−4] is sequentially shifted in the order of the data block [5n−3], the data block [5n−2], the data block [5n−1], and the data block [5n] in step S3104. The count value of the identical number counter [5n−4] to be manipulated through the operations in steps S3103 to S3106 finally shows the number of identical blocks in a group in the case of using the data block [5n−4] as the reference, such as "2" in FIG. 16A as an example in step S3107.

As a result of the repeat execution of the operations in step S3103 to S3108, the sum value of the variables "j" and "k" goes to "5" in step S3103, so that it is determined that the sum value is equal to or greater than the reference value "5". This causes the CPU execution to be shifted to step S3111.

Specifically, in this case, the variable "k" is "5" so that the identical comparison between the five combined data blocks [5n−4] to [5n] using the data block [5n−4] as a reference has been completed. In step S3111, therefore, as illustrated in FIG. 16B, as a task for shifting the data block used as a reference against the remaining data blocks from the data block [5n−4] to the data block [5n−3], "1" is added to the variable "j". In parallel with the addition task, the variable "k" is set to "1", in other words, is cleared, in order to execute the identical comparison between the five combined data blocks [5n−4] to [5n] using the data block [5n−3] as a reference.

Next, the operations in steps S3103 to S3108 are repeatedly executed again on condition that the variable "j" is lower than the reference value "4" obtained by subtracting "1" from the previous reference value "5". This allows the identical comparison between the five combined data blocks [5n−4] to [5n] using the data block [5n−3] as a reference.

Note that, in the third embodiment, as illustrated in FIG. 16B, the identical comparison between the data block [5n−4] and the reference data block [5n−3] is not carried out. Specifically, the identical comparison between the data block [5n−4] and the reference data block [5n−3] has been already carried out by the identical comparison using the data block [5n−4] as a reference. For this reason, omission of the identical comparison between the data block [5n−4] and the reference data block [5n−3] allows the processing load of the data extracting processing in step S135 to decrease. Note that the omission is similarly applied to the identical comparisons using the data blocks [5n−2] and [5n−1] as references, respectively. In addition, note that the identical comparison using the data block [5n] as a reference is not carried out.

After the sequential repeat execution of the set of operations in steps S3103 to S3108 sequentially using the data blocks [5n−3], [5n−2], and [5n−1] as references through the operations in step S3111 and S3112, it is finally determined that the variable "j" is not less than "4" in step S3112. Then the identical comparison between the five combined data blocks [5n−4] to [5n] is completed, so that the identical comparison in step S3100 is terminated at the timing when it is determined that the variable "j" is not less than "4".

As set forth above, however, after step S3100, in step S3700, when [1] is added to the variable "n", the next five combined group is subjected to the identical comparison illustrated in FIG. 17.

Next, the majority-rule checking in step S3200 will be described in reference to FIG. 18.

As set forth above, in the identical comparison, as illustrated in FIGS. 16A to 16D, the numbers of identical blocks in a group in the case of using the data blocks [5n−4] to [5n−1] as the references are respectively calculated by the count values of the identical number counters [5n−4] to [5n−1].

In the majority-rule checking, as set forth above, it is determined whether there is one of the data block whose number of blocks identical thereto in a group (five combined data blocks [5n−4] to [5n]) is the largest therein. In addition, the majority-rule flag is set on condition that there is one of the data block whose number of blocks identical thereto in a group (five combined data blocks) is the largest therein.

In the third embodiment, as illustrated in FIG. 18, a manipulated variable "j" and a maximum counter indicative of the number of identical blocks of one of the data blocks whose number of blocks identical thereto is the largest in a group (five data blocks [5n−4] to [5n]) will be manipulated in the manner described hereinafter to realize the majority-rule checking. Note that an inner counter of the CPU 111 can be used as the maximum counter, but an outer counter can be prepared and used as the max counter.

As illustrated in FIG. 18, in majority-rule checking, the CPU 111 clears the count value of the maximum counter in step S3201. Next, the CPU 111 sets the variable "j" to "0", and resets the majority-rule flag. Thereafter, the CPU 111 repeats the following set of steps S3203 to S3208, S3211, and S3212. This makes it possible to determine whether there is one of the data blocks whose number of blocks identical thereto in a group (five combined data blocks [5n−4] to [5n]) is the largest therein:

In step S3203, the CPU 111 compares the variable "j" with the value "4" obtained by subtracting "1" from the reference value "5".

In step S3204, the CPU 111 compares the count value of the identical number counter [5n−4+j] with the count value of the maximum counter on condition that the variable "j" is less than the value "4" as a result of the comparison in step S3203. The count value of the identical number counter [5n−4+j] represents the number of identical blocks in a group (five combined data blocks [5n−4] to [5n]) with respect to the reference data block [5n−4+j].

In step S3205, the CPU 111 counts up the count value of the maximum counter such that the count value of the maximum counter matches the count value of the identical number counter [5n−4+j] on condition that the count value of the identical number counter [5n−4+j] is larger than the count value of the maximum counter as a result of the comparison in step S3204.

In step S3206, the CPU 111 registers the data block [5n−4+j] (the candidate data [5n−4+j]) in, for example, the data memory 114 as the validated data representing the data block whose identical number is the largest in the five data blocks on condition that the count value of the identical number counter [5n−4+j] is larger than the count value of the maximum counter as a result of the comparison in step S3204.

In step S3207, the CPU 111 sets the majority-rule flag on condition that the count value of the identical number counter [5n−4+j] is larger than the count value of the maximum counter as a result of the comparison in step S3204.

In step S3208, the CPU 111 adds "1" to the variable "j".

In step S3211, the CPU 111 compares the count value of the identical number counter [5n−4+j] with the count value of the maximum counter on condition that the variable "j" is not less than the value "4" as a result of the comparison in step S3203. The count value of the identical number counter [5n−4+j] represents the number of identical blocks in a group (the five combined data blocks [5n−4] to [5n]) with respect to the reference data block [5n−4+j].

In step S3212, the CPU 111 resets the majority-rule flag on condition that the count value of the identical number counter [5n−4+j] is identical to the count value of the maximum counter.

For example, in steps S3201 and S3202, when the count value of the maximum counter has been cleared and the variable "j" is set to "0", it is determined that the variable "j" is less than the value "4" obtained by subtracting "1" from the reference value "5" in step S3203.

Next, in step S3204, the count value of the identical number counter [5n−4] indicative of the number of identical blocks in a group (five combined data blocks [5n−4] to [5n]) with respect to the candidate data [5n−4] is compared with the count value of the maximum counter.

If it is determined that the count value of the identical number counter [5n−4] corresponding to the candidate data [5n−4] is larger than the count value of the maximum counter, the data block [5n−4] registered as the candidate data is determined as the data block whose number of blocks identical thereto in a group (data blocks [5n−4] to [5n]) is largest therein.

In step S3205, therefore, the count value of the maximum counter is counted up such that the count value of the maximum counter matches the count value of the identical number counter [5n−4]. Subsequently, in steps S3206 and 3207, the candidate data [5n−4] is registered as the validated data whose number of blocks identical thereto in a group (five combined data blocks) is the largest therein, and the majority-rule flag is set. Thereafter, in step S3208, "1" is added to the variable "j".

In step S3204, it may be determined that the count value of the identical number counter [5n−4] is equal to or less than the count value of the maximum counter. In this case, the maximum counter has already served as a counter representing the largest number of identical blocks in a group (five combined data blocks [5n−4] to [5n]).

The CPU 111 adds "1" to the variable "j" in step S3208 in response to the timing when the operation in step S3211 or S3212 is executed without executing the set of steps S3205 to S3207.

After execution of the operation in step S3208, as set forth above, the set of sequential steps S3203 to S3208, S3211, and S3212 are executed again. Note that, in this execution of the operations in steps 53203 to S3208. S3211, and S3212, because "1" is added to the variable "j", in step S3208, it is determined whether the count value of the identical number counter [5n−3] becomes the validated data; this count value of the identical number counter [5n−3] represents the number of identical blocks in a group (five combined data blocks [5n−4] to [5n]) with respect to the reference data block [5n−3].

Specifically, in step S3208, every time "1" is added to the target of comparison of the count value of the maximum counter is sequentially shifted in the order of the count value of the identical number counter [5n−3], the count value of the identical number counter [5n−2], and the count value of the identical number counter [5n−1]. These operations allow the candidate data that has been registered as the validated data to be finally obtained as data that should be extracted from the five combined data blocks in step S3207.

After the repeat execution of the set of operations in steps S3203 to 3208, S3211, and S3212, it is finally determined that the variable "j" is not less than "4" in step S3203. At that time, the determination of whether there is one of the data block whose number of blocks identical thereto in a group (five combined data blocks [5n−4] to [5n]) has been completed. Thus, the majority-rule checking comparison is terminated at the timing when it is determined that the variable "j" is not less than "4".

As set forth above, however, after step S3203, in step S3700, when [1] is added to the variable "n", the next five combined group is subjected to the majority-rule checking illustrated in FIG. 18.

Note that, when the five combined data blocks [5n−4] to [5n] in a group are subjected to the majority-rule checking set forth above, as illustrated in FIG. 19 as an example, in step S3100, the number of identical blocks in a group with respect to the candidate data [5n−1] and that of identical blocks in the group with respect to the candidate data [5n−4] may be the same as each other, and the largest in the group.

In such a case where a plurality of blocks whose numbers of identical blocks in a group (five combined data blocks) are the same as each other and the largest therein, it may be difficult to selectively extract any one of the blocks as the validated data.

In the third embodiment, therefore, in step S3204, if it is determined that the count value of the identical number counter [5n−2] is equal to or less than the count value of the maximum counter, in the next step S3211, it is determined whether the count value of the identical number counter [5n−2] is equal to the count value of the maximum counter.

If it is determined that the count value of the identical number counter [5n−2] is equal to the count value of the maximum counter (the determination in step S3211 is YES), in the next step S3212, the majority-rule flag is reset so as to hold the data extracting task in step S134. The reset state of the majority-rule flag kept during the majority-rule checking in step S3200 permits, in step S3300, the data extracting task in step S134 to be forcibly terminated. This makes it possible to more improve the reliability of reprogramming for data.

As described above, the in-vehicle control system 100 according to the third embodiment can obtain substantially the same effects as the first and second effects according to the first embodiment. In addition, the in-vehicle control system 100 according to the third embodiment can obtain the third effect described hereinafter.

Specifically, as the third effect, when it is determined that there are a plurality of blocks whose numbers of identical blocks in a group (five combined data blocks) are the same as each other and the largest therein, it is possible to forcibly terminate the data extracting task in step S134. This allows the security level associated with the data reprogramming to be highly maintained.

In the third embodiment, the data extracting task in step S134 is carried out with the use of the majority-rule checking in accordance with the procedures and algorithm illustrated in FIGS. 15 to 18. Note that, as a modification of the third embodiment, each group consists of three data blocks so that the majority-rule checking is applied to the three blocks of each group.

Figure 21:
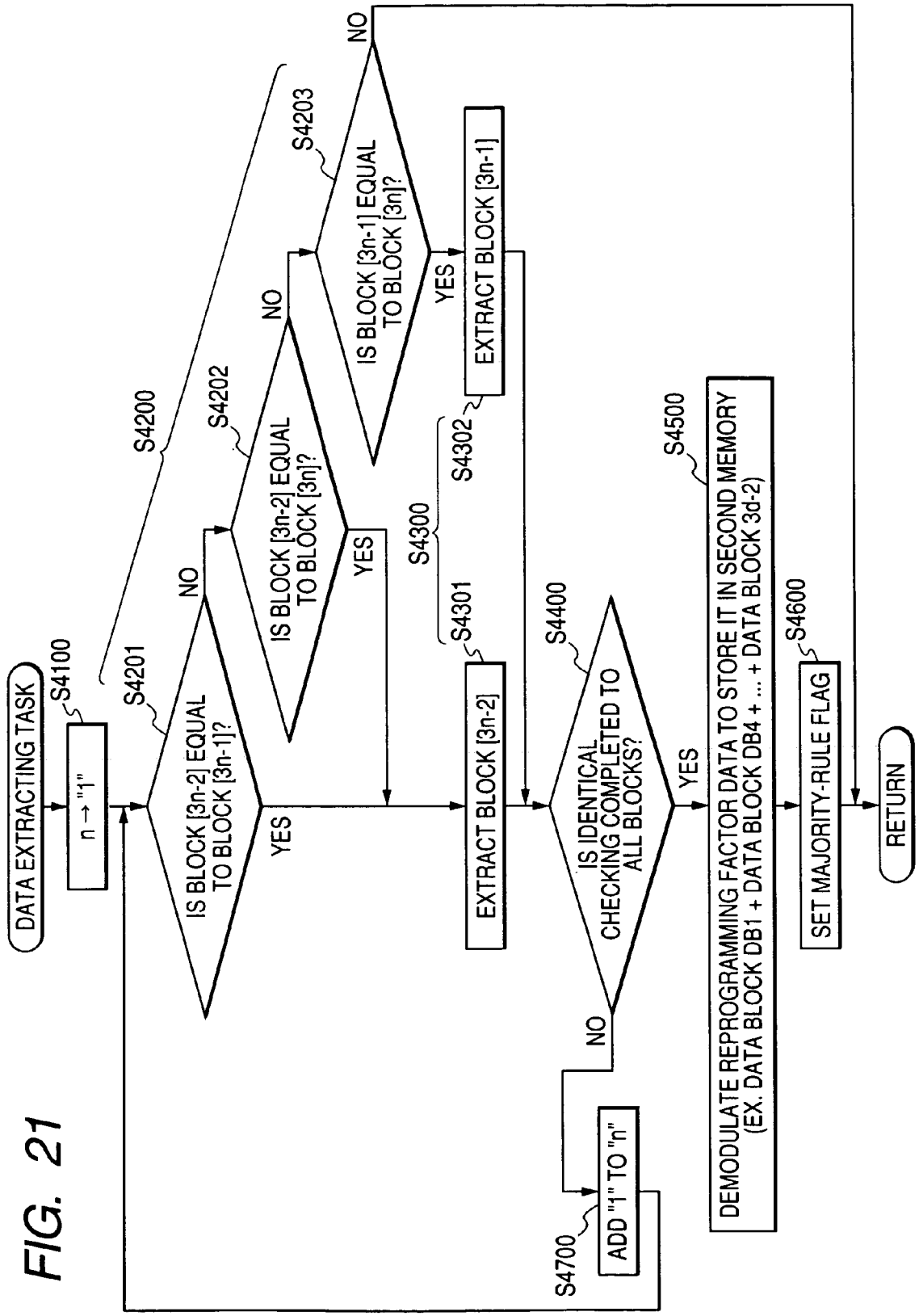
FIG. 21 is a flowchart schematically illustrating a specific example of data extracting task in step S134 of FIG. 7 according to the modification of the third embodiment.

In this modification, the data extracting task in step S134 can be carried out with the use of the majority-rule checking in accordance with the procedures and algorithm illustrated in FIG. 21 in place of FIGS. 15 to 18.

Specifically, in the modification, the management center 200 is configured to send the items of the reprogramming data (the reprogramming factor data and the dummy data) to the in-vehicle control system 100 in accordance the procedures and algorithm like the second embodiment (see FIGS. 10A and 10B).

Figure 20:
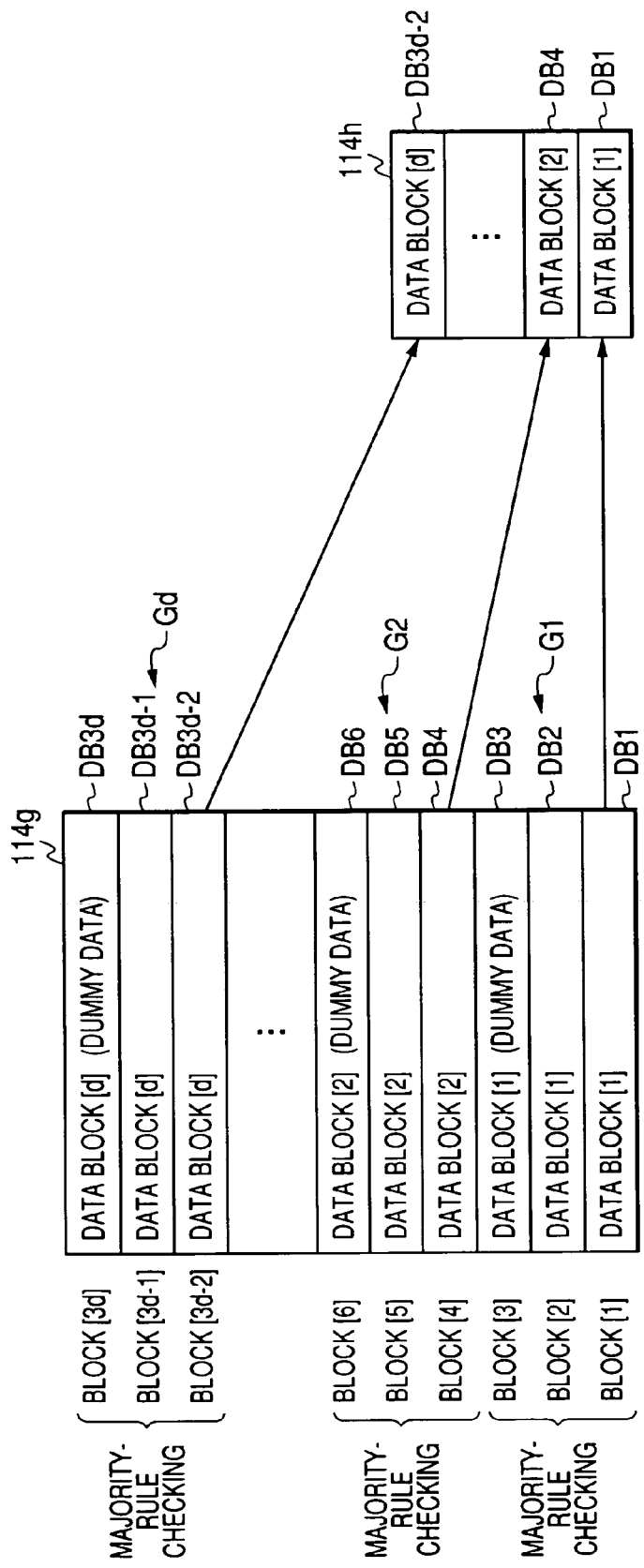
FIG. 20 is a view schematically illustrating extracting and storing processing to be executed by the CPU of the engine control unit according to a modification of the third embodiment of the present invention.

As illustrated in FIG. 20, the engine control unit 110 divides the items of the reprogramming factor data and the mirror data into blocks [1] to [3d], and stores the data blocks [1] to [3d] in a first memory area 114g of the data memory 114 as data blocks DB1 to DB3d (d is an integer).

Specifically, the set of groups G1 to Gd have been sequentially stored in the first memory area 114g of the data memory 114. The group G1 consists of the pair DB1 and DB2 of the data block [1] of the reprogramming factor data and the data block DB3 (data block [1]) of the dummy data. Moreover, the group Gd consists of the pair DB3d−2 and DB3d−1 of the data block [d] of the reprogramming factor data and the data block DB3d (data block [d]) of the dummy data.

In the modification, the CPU 111 carries out the data extracting in step S134 with respect to the data blocks DB1 to DB3d with the use of the majority-rule checking in accordance with the procedures and algorithm illustrated in FIG. 21.

Note that, as illustrated in FIG. 21, the data blocks [1] to [3d] (see FIG. 20) are expressed by [3n−2 (n is an integer)], [3n−1], or [3n] for each block.

As illustrated in FIG. 21, in data extracting processing, the CPU 111 assigns "1" to the variable n in step S4100.

Next, the CPU 111 repeats the following set of steps S4200, S4300, S4400, and S4700, which permits each group consisting of the data blocks [3n−2], [3n−1], and [3n] of the reprogramming factor data and the dummy data to be subjected to the majority-rule checking set forth above:

In step S4200, the CPU 111 determines whether the three blocks [3n−2] to [3n] of each group is identical to each other.

In step S4300 the CPU 111 extracts one data block whose number of blocks identical thereto in the three data blocks is the largest therein based on the result of identical comparison in step S4200.

In step S4400, the CPU 111 determines whether all of the data blocks [1] to [3d] are subjected to the majority-rule checking.

In step S4700, the CPU 111 adds [1] to the variable [n].

For example, in step S4100, [1] is added to the variable [n], and thereafter, in step S4200, the majority-rule checking for the data blocks [1] to [3] corresponding to the data blocks DB1 to DB3 in the data blocks [1] to [3d] is performed.

Specifically, in step S4201 of step S4200, the CPU 111 determines whether the data block DB1 is identical to the data block DB2. In step S4201, if it is determined that the data block DB1 is non-identical to the data block DB2 (the determination in step S4201 is NO), the CPU 111 determines whether the data block DB1 is identical to the data block DB3 in step S4202. If it is determined that the data block DB1 is non-identical to the data block DB3 (the determination in step S4202 is NO), the CPU 111 determines whether the data block DB2 is identical to the data block DB3 in step S4203.

In the modification, the CPU 111 performs the majority-rule checking for the data blocks [3n−2] to [3n] in each group.

For this reason, in step S4200, when it is determined that one of the data blocks is identical to another one of the data blocks, the CPU 111 can determine the paired data blocks (one and another one of the data blocks) as the pair of the data blocks whose number of blocks identical thereto in the corresponding three data blocks is the largest therein.

The CPU 111 therefore shifts to step S4300 when it is determined that there is one data block whose number of identical blocks in the corresponding three data blocks is the largest therein upon detection of the paired identical data blocks in each group.

In step S4300, the CPU 111 extracts one data item from the paired identical data items based on the result of majority-rule checking.

Specifically, in step S4301 of step S4300, the CPU 111 extracts the data block DB1 from the three data items DB1 to DB3 when it is determined that the data block DB1 is identical to at least one of other data blocks DB2 and DB3 in step S4201 or S4202.

On the other hand, in step S4302 of step S4300, the CPU 111 extracts the data block DB2 from the three data items DB1 to DB3 when it is determined that the data block DB2 is identical to the data block DB3 in step S4203.

After the majority-rule checking for the blocks [1] to [3] has been established, the CPU 111 executes the steps S4400 and S4700 required to execute the next group of the three blocks [4] to [6].

After the task in step S4700 has been completed, the CPU 111 executes the set of steps S4200, S4300, S4400, and S4700 again. Because "1" is added to the variable "n" in step S2700, the majority-rule checking is applied to the three blocks DB4 to DB6 corresponding to the blocks [4] to [6].

Specifically, every addition of the variable "n" to "1" in step S4700, the set of three blocks to which the majority-rule checking is applied are sequentially changed in the order from the three blocks [4] to [6] to the three blocks [3d−2] to [3d] in step S4200.

As a result of repeat executions of the set of steps S4200, S4300, S4400, and S4700, in step S4400, if it is determined that all of the data blocks [1] to [3d] are subjected to the majority-rule checking, the CPU 111 executes the set of steps S4500 and S4600.

Specifically, in step S4500, as illustrated in FIG. 20, the CPU 111 reads out the data blocks DB1, DB4, ..., DB3d−2 that have been extracted, as the validated data, from the data blocks DB1 to DB3d of the reprogramming factor data and the dummy data. Next, the CPU 111 sequentially combines the readout data blocks DB1, DB4, ..., DB3d−2 to decode the reprogramming factor data, and stores the combined set of the data blocks DB1, DB4, ..., DB3d−2 in a second memory area 114h of the data memory 114.

When the reprogramming factor data is decoded as a result of the data extracting task, the CPU 111 sets the majority-rule flag in, for example, the data memory 114 in step S4600; this majority-rule flag represents that the majority-rule checking is established. This allows the CPU 111 to determine whether the reprogramming factor data is decoded based on the state of the majority-rule flag, and thereafter, the CPU 111 exits the data extracting processing.

As a result of repeat execution of the set of steps S4200, S4300, S4400, and S4700, it may be determined that, in step S4200 (step S4203), all of the three blocks of one group are not identical to each other. In this case, the CPU 111 probably determines that the data sent from the management center 200 are unauthorized data and/or illegal modified data, thereby exiting the data extracting task upon determination such that the majority-rule checking is not established without setting the majority-rule flag.

In step S135 (see FIG. 7), therefore, the determination whether the reprogramming factor data is decoded is carried out depending on the state of the majority-rule flag.

As described above, the in-vehicle control system 100 according to the modification of the third embodiment can obtain substantially the same effects as the first and second effects according to the first embodiment.

In addition, the in-vehicle control system 100 according to the modification of the third embodiment can obtain the fourth effect described hereinafter.

Specifically, as the fourth effect, when it is determined that one of the data blocks is identical to another one of the data blocks, the CPU 111 can determine the paired data blocks (one and another one of the data blocks) as the pair of the data blocks whose number of identical blocks in the corresponding three data blocks is the largest therein. This permits the load of the CPU 111 to be reduced.

FOURTH EMBODIMENT

An in-vehicle control system according to a fourth embodiment of the present invention will be described hereinafter. The in-vehicle control system of the fourth embodiment has substantially the same structure as that of the in-vehicle control system of the third embodiment. For this reason, like reference characters are assigned to like parts in the in-vehicle control systems according to the third and fourth embodiments so that descriptions of the parts of the in-vehicle control system of the fourth embodiment will be omitted.

Substantially like the third embodiment, in the fourth embodiment, the in-vehicle control system 100 is configured to:

receive a plurality of items of the reprogramming data (the reprogramming factor data and the dummy data) to each of which the same identifier is attached, which has been sent from the management center 200;

verify the received items of the reprogramming data (the reprogramming factor data and the dummy data) against each other; and extract, as validated data, at least one of the items of the reprogramming data when it is determined that the at least one of the items of the reprogramming data meets a predetermined rule against at least one remaining item based on the verified result.

Note that, in the fourth embodiment, the management center 200 is configured to send the items of the reprogramming data (the reprogramming factor data and the dummy data) to the in-vehicle control system 100 in accordance the procedures and algorithm like the third embodiment (see FIGS. 13A and 13B).

Especially, in the fourth embodiment, in sending the reprogramming factor data and the first to third dummy data, the management center 200 sequentially reads out the reprogramming factor data and each of the first to third dummy data in the order from the block [1] to the block [e] under the following first to third conditions:

The first condition is that five data blocks in each of the data blocks [1] to [e] are combined to be readout The second condition is that each combined group of five blocks includes at least one of the first to third dummy data The third condition is that the number of data blocks of the reprogramming factor data has a majority in the total number (five) of the five identical blocks in a group.

Figure 22:
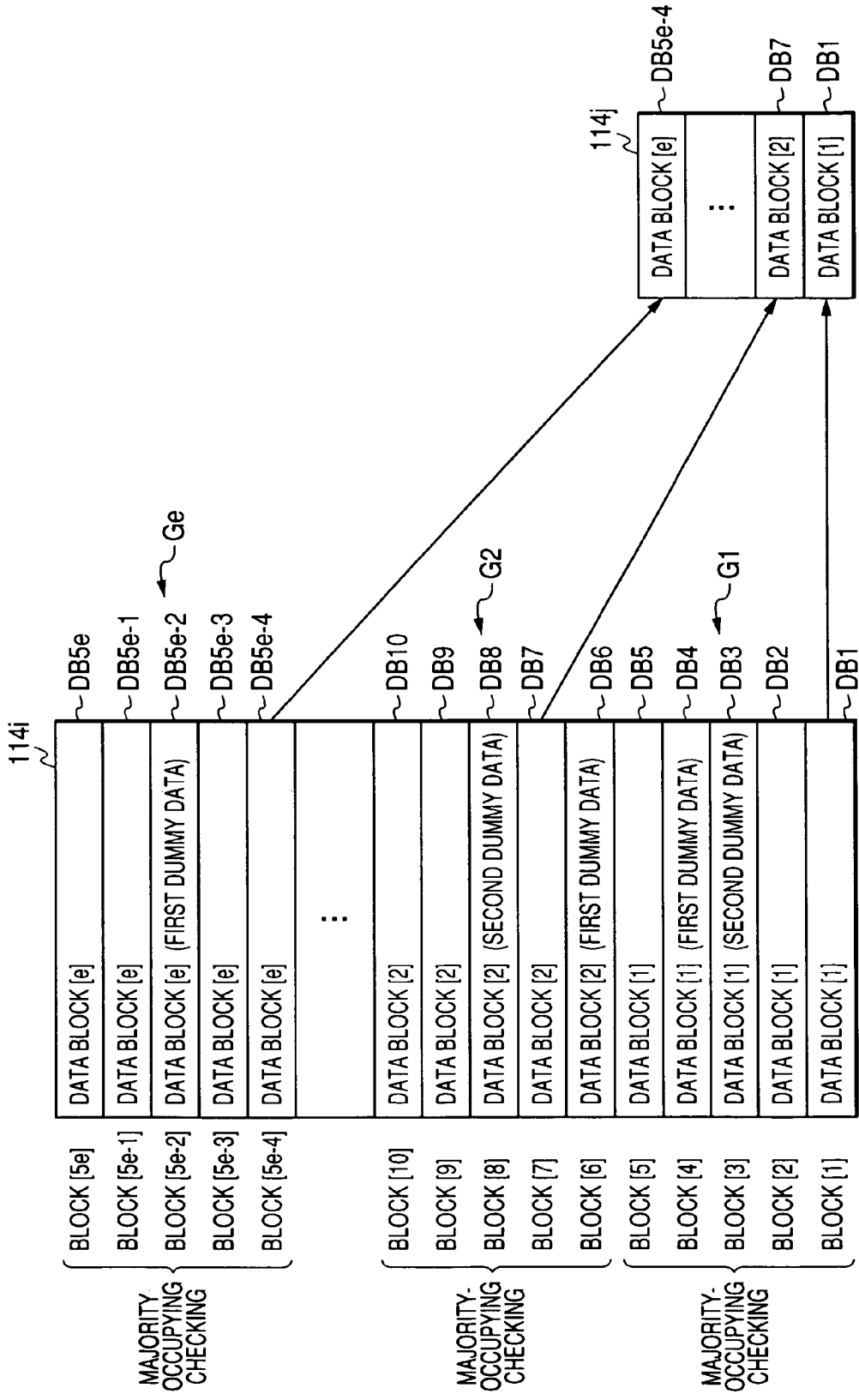
FIG. 22 is a view schematically illustrating extracting and storing processing to be executed by the CPU of the engine control unit according to a fourth embodiment of the present invention.

For example, as illustrated in FIG. 22, upon triple readout of one block [1] from the reprogramming factor data, one block [1] from each of the first and second dummy data is extracted. The triple readout of block [1] of the reprogramming factor data is combined with the corresponding readout blocks [1] of the first and second dummy data to form a group G1.

Because the group G1 consists of the five blocks [1], the first condition is satisfied, and because the group G1 includes the blocks [1] of the first and second dummy data, the second condition is satisfied. In addition, because the number (3) of data blocks [1] of the reprogramming factor data has a majority in the total number (five) of the five identical blocks in a group (see FIG. 22), This allows the set of the group G1 to a group Ge to be generated. The group G1 consists of the five combined blocks DB1 to DB5 of the data blocks [1] of the reprogramming factor data and the first to third dummy data. The group Ge consists of the five combined blocks DB5e−4 to DB5e of the data blocks [e] of the reprogramming factor data and the first dummy data to be generated.

The management center 200 categorizes data blocks DB1, DB2, DB3, . . . , DB5e such that a plurality of the data frames DF contain the data blocks DB1, DB2, DB3, . . . , DB5e, respectively. Next, the management center 200 sequentially sends the plurality of data frames DF to the in-vehicle control unit 100 in packet or in block, respectively.

When the items of the reprogramming factor data and the first to third dummy data are sent from the management center 200 in the sending way described above, as illustrated in FIG. 22, the engine control unit 110 stores the data blocks [1] to [5e] in a first memory area 114*i* of the data memory 114 as the data blocks DB1 to DB5e.

In data extracting task with respect to the first memory area 114*i*, the CPU 111 extracts items of reprogramming factor data in step S134 with validity in the following manner.

Specifically, in the fourth embodiment, as illustrated in FIG. 22, the CPU 111 performs majority-occupying checking of items of the reprogramming factor data and those of the first to third dummy data to determine whether there is a majority of identical blocks in a group (five combined items) of the reprogramming factor data, and the first to third dummy data every group.

As a result of the majority-occupying checking, if it is determined that there is the majority of identical blocks in a group (five combined items), the majority-occupying checking is established, in other words, the predetermined rule is satisfied. Then, the CPU 111 extracts, as the validated data, at least one of the identical data items (blocks) of each group from the five data items thereof. Thereafter, as illustrated in FIG. 22, the CPU 111 sequentially combines the extracted data blocks DB1, DB7, . . . , DB5e−4, thereby storing them in a second memory area 114*j* of the data memory 114. This allows the reprogramming factor data to be decoded in the second memory area 114*j* of the data memory 114.

Figure 23:
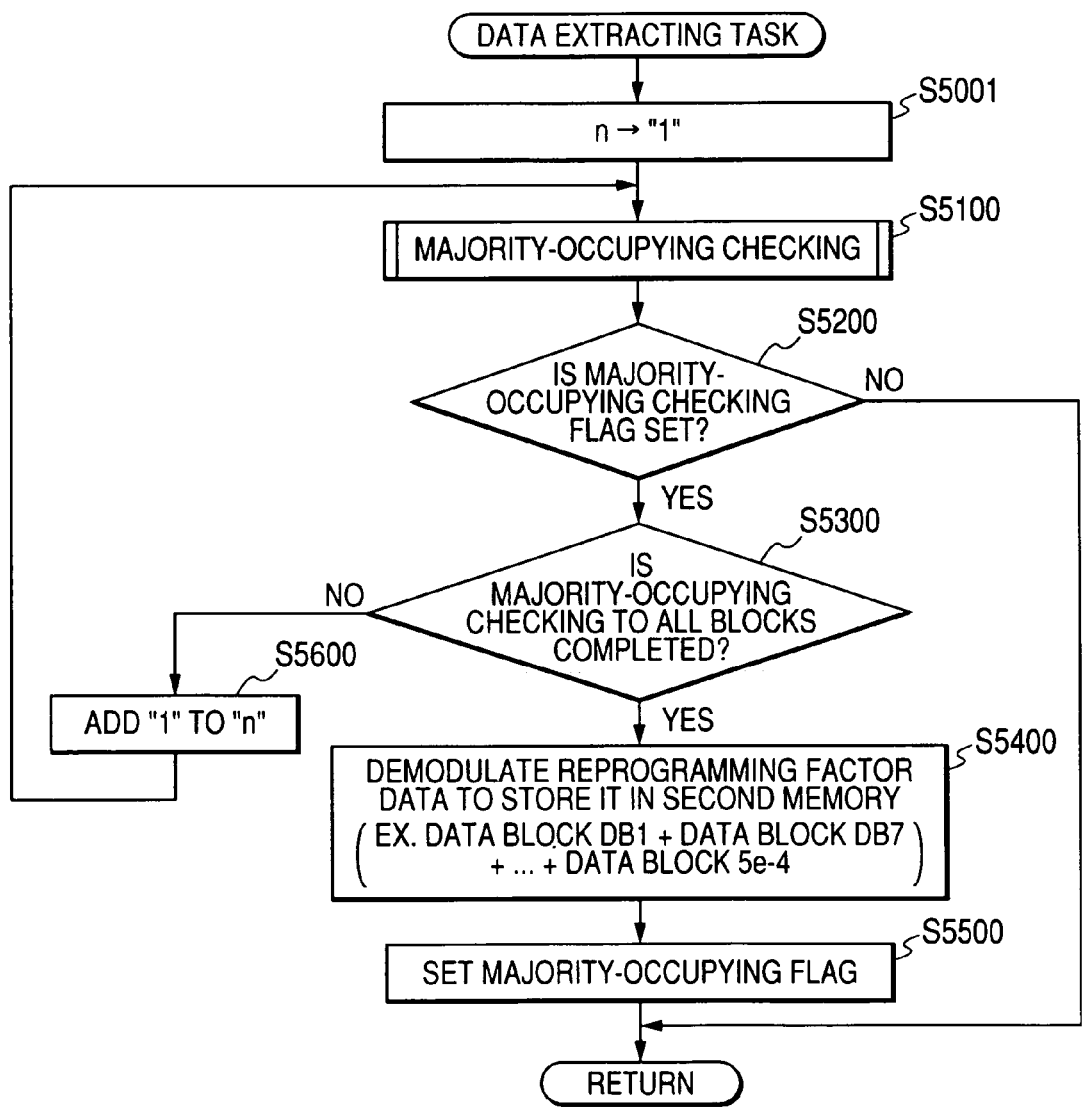
FIG. 23 is a flowchart schematically illustrating a specific example of the data extracting task in step S134 of FIG. 7 according to the fourth embodiment.

FIG. 23 schematically illustrates a specific example of the data extracting task in step S134 according to the fourth embodiment.

Note that, as illustrated in FIG. 23, the data blocks [1] to [5e] (see FIG. 22) are expressed by [5n−4 (n is an integer)], [5n−3], [5n−2], [5n−1], or [5n] for each block.

As illustrated in FIG. 23, in data extracting processing, the CPU 111 assigns "1" to the variable n in step S5001.

Next, the CPU 111 repeats the following set of steps S5100, S5200, S5300, and S5600, which permits each group consisting of the five data blocks [5n−4] to [5n] of the reprogramming factor data and the first to third dummy data for each group to be subjected to the majority-occupying checking set forth above:

In step S5100, the CPU 111 performs a majority-occupying checking task to:

subject the five blocks [5n−4] to [5n] of each group to the majority-occupying checking, and set a majority-occupying flag on condition that the majority-occupying checking is established.

In step S5200, the CPU 111 checks the state of the majority-occupying flag; and

In step S5300, the CPU 111 determines whether all of the data blocks [1] to [5e] are subjected to the majority-occupying checking.

In step S5600, the CPU 111 adds [1] to the variable [n].

In FIG. 23, step S5100 is equivalent to step S3100 according to the third embodiment. Specifically, as illustrated in FIG. 16A, the data block [5n−4] in the five data blocks [5n−4] to [5n] is used as a reference against the remaining data blocks therein, and it is determined whether each of the remaining data blocks [5n−3] to [5n] is identical to the reference data block [5n−4].

After the identical comparison using the data block [5n−4] as a reference, as illustrated in FIG. 16B, the data block [5n−3] is used as a reference against the remaining data blocks therein, and it is determined whether each of the remaining data blocks [5n−4], and [5n−2] to [5n] is identical to the reference data block [5n−3].

After the identical comparison using the data block [5n−3] as a reference, as illustrated in FIG. 16C, the data block [5n−2] is used as a reference against the remaining data blocks therein, and it is determined whether each of the remaining data blocks [5n−4], [5n−3], [5n−1], and [5n] is identical to the reference data block [5n−2].

After the identical comparison using the data block [5n−2] as a reference, as illustrated in FIG. 16D, the data block [5n−1] is used as a reference against the remaining data blocks therein, and it is determined whether each of the remaining data blocks [5n−4], [5n−3], [5n−2], and [5n] is identical to the reference data block [5n−1].

In the fourth embodiment, as illustrated in FIG. 16A as an example, as a result of determining whether each of the remaining data blocks [5n−3] to [5n] is identical to the reference data block [5n−4], when the identical number "2" is obtained, it is determined that there is the majority of identical blocks in the data blocks [5n−4] to [5n]. Then, the data block [5n−4] is extracted as the validated data from the five data blocks [5n−4] to [5n], and therefore the majority-occupying flag is set; this majority-occupying flag represents that the majority-occupying checking is established.

In step S5300, on condition that the majority-occupying flag is in set (see step S5200), it is determined whether all blocks [1] to [5e] are subjected to the majority-occupying checking. If it is determined that all blocks [1] to [5e] are not subjected to the majority-occupying checking, "1" is added to the variation "n" by the CPU 111 in step S5600, and thereafter, the step S5100 is executed again, so that the five data blocks of the next group are subjected to the majority-occupying checking.

As a result of repeat executions of the set of steps S5100, S5200, S5300, and S5600, in step S5300, if it is determined that all of the data blocks [1] to [5e] have been already subjected to the majority-occupying checking, the CPU 111 executes the set of steps S5400 and S5500.

Specifically, in step S5400, as illustrated in FIG. 22, the CPU 111 reads out the data blocks DB1, DB7 . . . DB5e−4 that have been extracted, as the validated data, from the data blocks DB1 to DB5e of the reprogramming factor data and the dummy data for each group. Next, the CPU 111 sequentially combines the readout data blocks DB1, DB7, . . . , DB5e-4 to decode the reprogramming factor data, and stores the combined set of the data blocks DB1, DB7, . . . , DB5e-4 in the second memory area 114f of the data memory 114.

When the reprogramming factor data is decoded as a result of the data extracting task, the majority-occupying flag is set in, for example, the data memory 114. This allows the CPU 111 to determine whether the reprogramming factor data is decoded based on the state of the majority-occupying flag, and thereafter, the CPU 111 exits the data extracting processing.

As a result of repeat execution of the set of steps S5100, S5200, S5300, and S5600, in step S5200, if the majority-occupying flag may be reset, the CPU 111 probably determines that the data sent from the management center 200 are unauthorized data and/or illegal modified data. Thus, the CPU 111 exits the data extracting task when determining that the majority-occupying flag is reset.

In step S135 (see FIG. 7), therefore, the determination whether the reprogramming factor data is decoded is carried out depending on the state of the majority-occupying flag.

Figure 24:
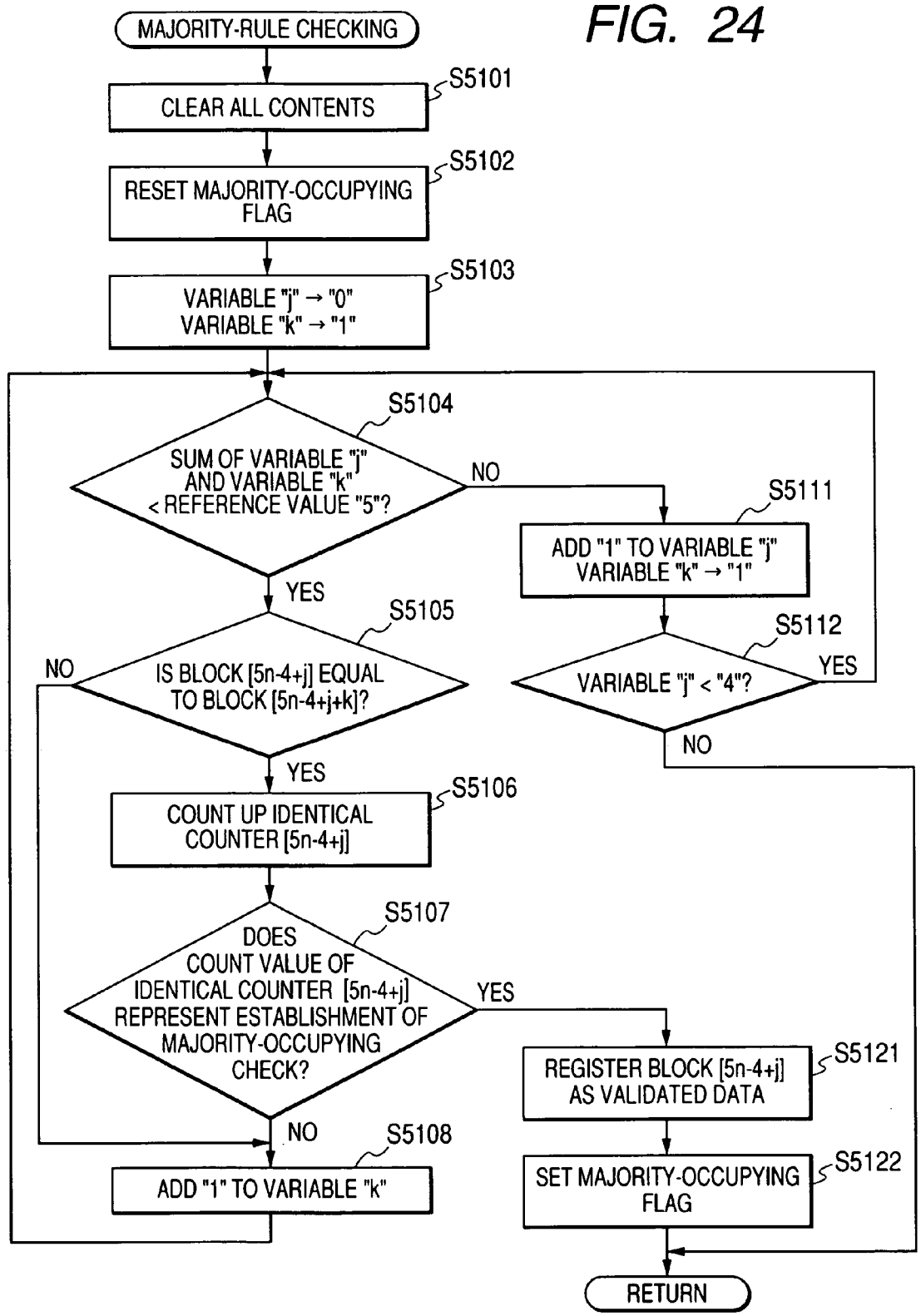
FIG. 24 is a flowchart schematically illustrating an example of the algorithm of majority-occupying checking in step S5100 of FIG. 23.

FIG. 24 is a flowchart schematically illustrating an example of the algorithm of the majority-occupying checking in step S5100 of FIG. 23.

As described above, in the majority-occupying checking, as illustrated in FIGS. 16A to 16D, the combined five data blocks [5n-4] to [5n] of each group are compared with one of the blocks [5n-4] to [5n] as a reference being changed. When it is determined that there is the majority of identical blocks in the data blocks [5n-4] to [5n], the comparison is terminated and the majority-occupying checking flag is set.

In the fourth embodiment, as illustrated in FIG. 24, manipulated variables "j", "k", and a plurality of identical number counters will be manipulated in the manner described hereinafter to realize the majority-occupying checking. Note that inner counters of the CPU 111 can be used as the plurality of identical number counters, but outer counters can be prepared and used as the plurality of identical number counters.

As illustrated in FIG. 24, in majority-occupying checking, the CPU 111 clears the count value of each of the identical number counters in step S5101.

Next, the CPU 111 resets the majority-occupying flag, sets the variable "j" to "0", and sets the variable "k" to "1" in steps S5102 and S5103.

Thereafter, the CPU 111 repeats the following set of steps S5104 to S5108. This permits the five data blocks [5n-4] to [5n] to be subjected to the identical comparison based on the data block [5n-4] as a reference against the remaining data blocks therein, thereby determining whether each of the remaining data blocks [5n-3] to [5n] is identical to the reference data block [5n-4]:

In step S5104, the CPU 111 calculates the sum of the variables "j" and "k" to compare the sum value with the combination number "5" of the five compared blocks.

In step S5105, the CPU 111 compares the data block [5n-4+j] with the data block [5n-4+j+k] on condition that the sum value is less than the combination number "5" as a result of the comparison in step S5104.

In step S5106, the CPU 111 counts up the count value of the identical number counter [5n-4+j] representing the identical number (comparison result) of the data block [5n-4+j] on condition that the data block [5n-4+j] is identical to the data block [5n-4+j+k] as a result of the comparison in step S5105.

In step S5107, the CPU 111 determines whether the count value of the identical number counter [5n-4+j] counted up in step S5106 represents establishment of the majority-occupying check.

In step S5108, the CPU 111 adds "1" to the variable "k".

For example, in steps S5101 to S5103, when the count value of the identical counter [5n-4+j] has been cleared and the variables "j" and "k" have been respectively set to "0" and "1", it is determined that the sum value of the variables "j" and "k" is less than the reference value "5" in step S5104.

Next, in step S5105, the data block [5n-4] used as a reference is compared with the data block [5n-3] to determine whether the data block [5n-4] is identical to the data block [5n-3].

If it is determined that the data block [5n-4] is identical to the data block [5n-3], in step S5106, the count value of the identical number counter [5n-4] representing the identical number of the data block [5n-4] is counted up (incremented) so that the count value "1" of the identical number counter [5n-4] is obtained.

In step S5107, it is determined whether the count value "1" of the identical number counter [5n-4] represents establishment of the majority-occupying check.

Specifically, as illustrated in FIG. 16A, if the identical number of the data block [5n-4], that is, the count value of the identical number counter [5n-4] is equal to or greater than "2", it is determined that the majority of data blocks in the five data blocks are identical to each other. Regarding the data block [5n-4], therefore, because of the count value "1" of the identical number counter [5n-4] it is determined that the majority-occupying checking is not established. This results in that "1" is added to the variable "k" in step S5108.

In step S5105, it may be determined that the data block [5n-4] is non-identical to the data block [5n-3]. In this case, the CPU 111 shifts to step S5108 without executing the counter manipulating operation and the like in steps S5100 and S5107. That is, the CPU 111 adds "1" to the variable "k" in response to the timing when it is determined that the data block [5n-4] is non-identical to the data block [5n-3].

After execution of the operation in step S5108 set forth above, the set of sequential steps S5104 to S5108 are executed again. Note that, in this execution of the operations in steps S5104 to S5108, because "1" is added to the variable "k" in step S5108, the data block [5n-4] used as a reference is compared with the data block [5n-2] to determine whether the data block [5n-4] is identical to the data block [5n-2].

Specifically, every time "1" is added to the variable "k", the target of identical comparison of the reference data block [5n-4] is sequentially shifted in the order of the data block [5n-3], the data block [5n-2], the data block [5n-1], and the data block [5n] in step S5104. The count value of the identical number counter [5n-4] to be manipulated through the operations in steps S5104 to S5106 finally shows the number of identical blocks in a group in the case of using the data block [5n-4] as the reference, such as "2" in FIG. 16A as an example in step S5106.

As a result of the repeat execution of the operations in step S5104 to S5108, the sum value of the variables "j" and "k" goes to "5" in step S5104, so that it is determined that the sum value is equal to or greater than the reference value "5". This causes the CPU execution to be shifted to step S5111.

Specifically, in this case, the variable "k" is "5" so that the identical comparison between the five combined data blocks [5n-4] to [5n] using the data block [5n-4] as a reference has been completed. In step S5111, therefore, as illustrated in FIG. 16B, as a task for shifting the data block used as a reference against the remaining data blocks from the data block [5n−4] to the data block [5n−3], "1" is added to the variable "j". In parallel with the addition task, the variable "k" is set to "1", in other words, is cleared, in order to execute the identical comparison between the five combined data blocks [5n−4] to [5n] using the data block [5n−3] as a reference.

Next, the operations in steps S5104 to S5108 are repeatedly executed again on condition that the variable "j" is lower than the reference value "4" obtained by subtracting "1" from the previous reference value "5". This allows the identical comparison between the five combined data blocks [5n−4] to [5n] using the data block [5n−3] as a reference.

Note that, in the fourth embodiment, like the third embodiment, the identical comparison between selected two blocks in the blocks [5n−4] to [5n] is carried out without duplication.

After the sequential repeat execution of the set of operations in steps S5104 to S5108 sequentially using the data blocks [5n−3], [5n−2], and [5n−1] as references through the operations in step S5111 and S5112, it is finally determined that the variable "j" is not less than "4" in step S5112. Then, the identical comparison between the five combined data blocks [5n−4] to [5n] is completed, so that the identical comparison in step S5100 is terminated at the timing when it is determined that the variable "j" is not less than "4".

As set forth above, however, as a result of repeat execution of the operations in steps S5104 to S5108 and steps S5111 and S5112, if it is determined that the count value of the identical number counter [5n−4] reaches "2" so that the majority of data blocks in the five combined data blocks are identical to each other, the CPU 111 interrupts execution of the series of operations in steps 5104 to S5108 and steps S5111 and S5112.

After the interruption, the CPU 111 registers the data block [5n−4] in, for example, the data memory 114 as the validated data occupying in the five combined data blocks in a group in step S5121. Thereafter, the CPU 111 sets the majority-occupying flag indicative of establishment of the majority-occupying checking, exiting the majority-occupying checking. Thereafter, in step S5200 (see FIG. 23), the CPU 111 determines whether to terminate the data extracting task in step S134.

As described above, if "1" is added to the variation "n" by the CPU 111 in step S5600, the step S5100 (see FIG. 24) is executed again, so that the five data blocks of the next group are subjected to the majority-occupying checking.

As described above, the in-vehicle control system 100 according to the fourth embodiment can obtain substantially the same effects as the first and second effects according to the first embodiment.

In addition, the in-vehicle control system 100 according to the fourth embodiment can obtain the fifth effect described hereinafter.

Specifically, as the fifth effect, when it is determined that the majority of identical blocks in the five combined blocks in a group are identical to each other, it is possible to register one of the identical blocks as the validated data, which reduces the load of the CPU 111.

In the fourth embodiment, the data extracting task in step S134 is carried out with the use of the majority-occupying checking in accordance with the procedures and algorithm illustrated in FIGS. 23 and 24. Note that, as a modification of the fourth embodiment, each group consists of three data blocks so that the majority-occupying checking is applied to the three blocks of each group.

Figure 26:
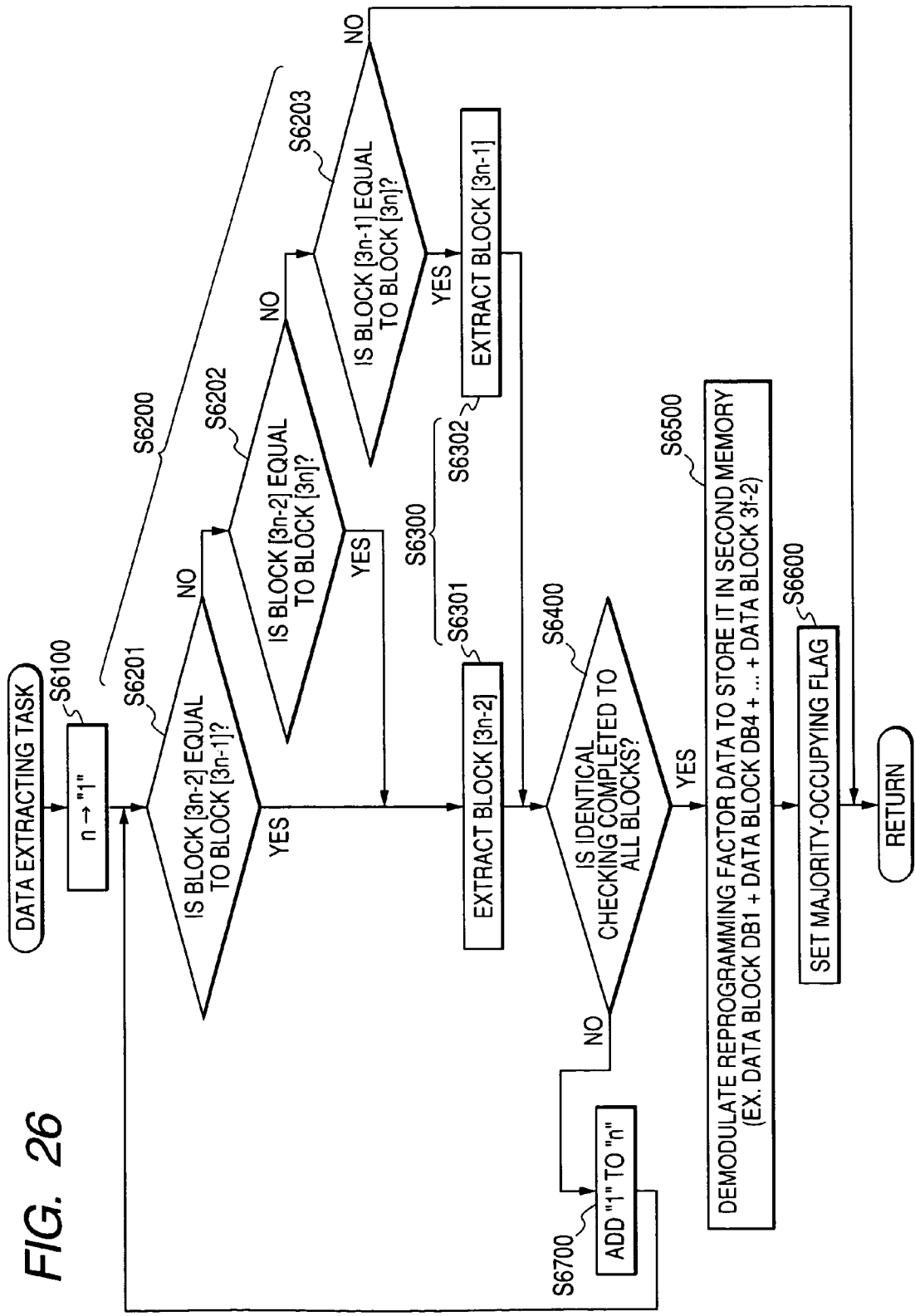
FIG. 26 is a flowchart schematically illustrating a specific example of data extracting task in step S134 of FIG. 7 according to the modification of the fourth embodiment.

In this modification, the data extracting task in step S134 can be carried out with the use of the majority-occupying checking in accordance with the procedures and algorithm illustrated in FIG. 26 in place of FIGS. 23 and 24.

Specifically, in the modification, the management center 200 is configured to send the items of the reprogramming data (the reprogramming factor data and the dummy data) to the in-vehicle control system 100 in accordance the procedures and algorithm like the second embodiment (see FIGS. 10A and 10B).

Figure 25:
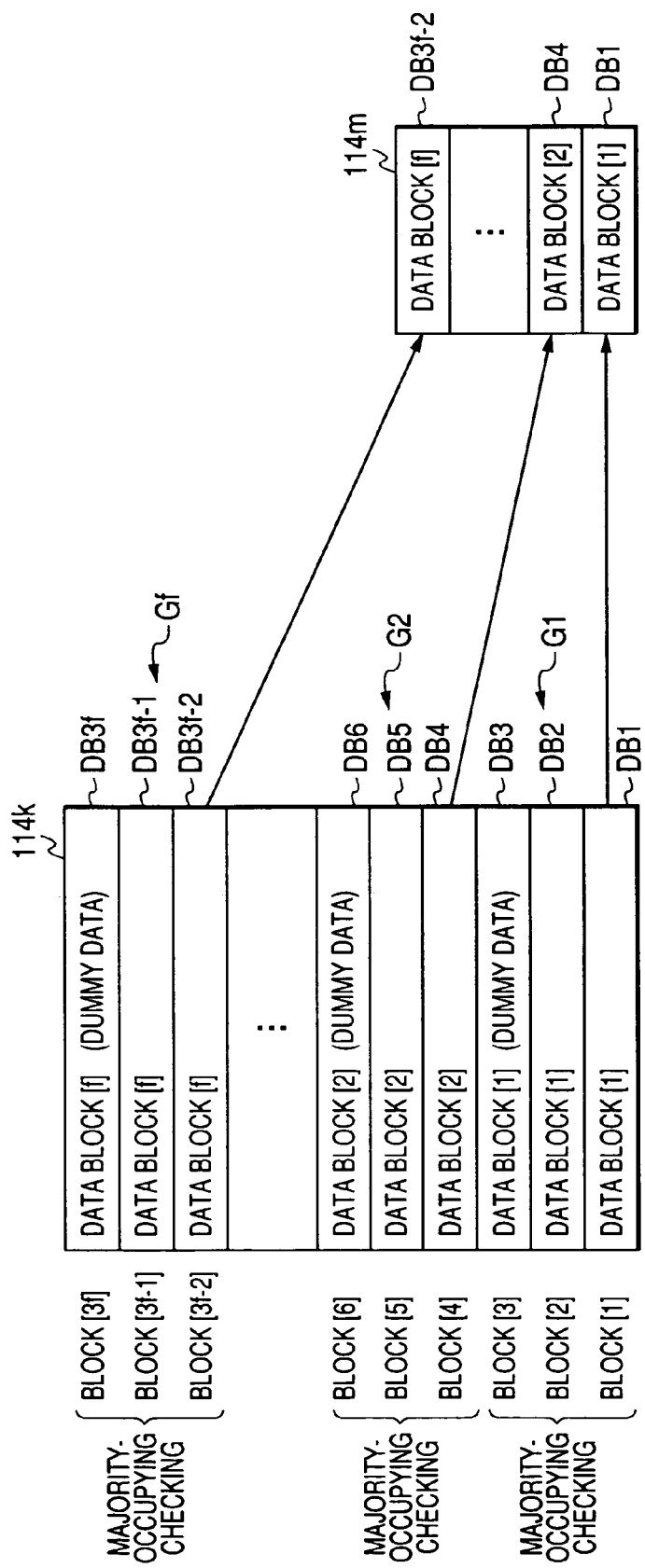
FIG. 25 is a view schematically illustrating extracting and storing processing to be executed by the CPU of the engine control unit according to a modification of the fourth embodiment of the present invention.

As illustrated in FIG. 25, the engine control unit 110 divides the items of the reprogramming factor data and the mirror data into blocks [1] to [3f], and stores the data blocks [1] to [3f]in a first memory area 114k of the data memory 114 as data blocks DB1 to DB3f (f is an integer).

Specifically, the set of groups G1 to Gf have been sequentially stored in the first memory area 114g of the data memory 114. The group G1 consists of the pair DB1 and DB2 of the data block [1] of the reprogramming factor data and the data block DB3 (data block [1]) of the dummy data. Moreover, the group Gf consists of the pair DB3f−2 and DB3f−1 of the data block [f] of the reprogramming factor data and the data block DB3f (data block [f]) of the dummy data.

In the modification, the CPU 111 carries out the data extracting in step S134 with respect to the data blocks DB1 to DB3f with the use of the majority-occupying checking in accordance with the procedures and algorithm illustrated in FIG. 26.

As illustrated in FIG. 26, in data extracting processing, the CPU 111 assigns "a" to the variable n in step S6100.

Next, the CPU 111 repeats the following set of steps S6200, S6300, S6400, and S6700, which permits each group consisting of the data blocks [3n−2], [3n−1], and [3n] of the reprogramming factor data and the dummy data to be subjected to the majority-occupying checking set forth above:

In step S6200, the CPU 111 performs a majority-occupying checking task to:
  subject the three blocks [3n−2] to [3n] of each group to the majority-occupying checking, and
  set a majority-occupying flag on condition that the majority-occupying checking is established.

In step S6300 the CPU 111 extracts one data block occupying the majority of identical blocks in the three data blocks based on the result of majority-occupying checking in step S6200.

In step S6400, the CPU 111 determines whether all of the data blocks [1] to [3f] are subjected to the majority-occupying checking.

In step S6700, the CPU 111 adds [1] to the variable [n].

For example, in step S6100, [1] is added to the variable [n], and thereafter, in step S6200, the majority-occupying checking for the data blocks [1] to [3] corresponding to the data blocks DB1 to DB3 in the data blocks [1] to [3d] is performed.

Specifically, in step S6201 of step S6200, the CPU 111 determines whether the data block DB1 is identical to the data block DB2. In step S6201, if it is determined that the data block DB1 is non-identical to the data block DB2 (the determination in step S6201 is NO), the CPU 111 determines whether the data block DB1 is identical to the data block DB3 in step S6202. If it is determined that the data block DB1 is non-identical to the data block DB3 (the determination in step S6202 is NO), the CPU 111 determines whether the data block DB2 is identical to the data block DB3 in step S6203.

In the modification, the CPU 111 performs the majority-occupying checking for the data blocks [3n−2] to [3n] in each group. For this reason, in step S6200, when it is determined that one of the data blocks is identical to another one of the data blocks, the CPU 111 can determine the paired data blocks (one and another one of the data blocks) as the pair of the data blocks occupying the majority of identical blocks in the corresponding three data blocks.

The CPU 111 therefore shifts to step S6300 when it is determined that there is one data block occupying the majority of identical blocks in the corresponding three data blocks upon detection of the paired identical data blocks in each group.

In step S6300, the CPU 111 extracts one data item from the paired identical data items based on the result of majority-occupying checking.

Specifically, in step S6301 of step S6300, the CPU 111 extracts the data block DB1 from the three data items DB1 to DB3 when it is determined that the data block DB1 is identical to at least one of other data blocks DB2 and DB3 in step S6201 or S6202.

On the other hand, in step S6302 of step S6300, the CPU 111 extracts the data block DB2 from the three data items DB1 to DB3 when it is determined that the data block DB2 is identical to the data block DB3 in step S6203.

After the majority-occupying checking for the blocks [1] to [3] has been established, the CPU 111 executes the steps S6400 and S6700 required to execute the next group of the three blocks [4] to [6].

After the task in step S6700 has been completed, the CPU 111 executes the set of steps S6200, S6300, S6400, and S6700 again. Because "1" is added to the variable "n" in step S6700, the majority-occupying checking is applied to the three blocks DB4 to DB6 corresponding to the blocks [4] to [6].

Specifically, every addition of the variable "n" to "1" in step S6700, the set of three blocks to which the majority-occupying checking is applied are sequentially changed in the order from the three blocks [4] to [6] to the three blocks [3f−2] to [3f] in step S6200.

As a result of repeat executions of the set of steps S6200, S6300, S6400, and S6700, in step S6400, if it is determined that all of the data blocks [1] to [3f] are subjected to the majority-occupying checking, the CPU 111 executes the set of steps S6500 and S6600.

Specifically, in step S6500, as illustrated in FIG. 25, the CPU 111 reads out the data blocks DB1, DB4, . . . , DB3f−2 that have been extracted, as the validated data, from the data blocks DB1 to DB3f of the reprogramming factor data and the dummy data. Next, the CPU 111 sequentially combines the readout data blocks DB1, DB4, . . . , DB3f−2 to decode the reprogramming factor data, and stores the combined set of the data blocks DB1, DB4, . . . , DB3f−2 in a second memory area 114*m* of the data memory 114.

When the reprogramming factor data is decoded as a result of the data extracting task, the CPU 111 sets the majority-occupying flag in, for example, the data memory 114 in step S6600; this majority-occupying flag represents that the majority-occupying checking is established. This allows the CPU 111 to determine whether the reprogramming factor data is decoded based on the state of the majority-occupying flag, and thereafter, the CPU 111 exits the data extracting processing.

As a result of repeat execution of the set of steps S6200, S6300, S6400, and S6700, it may be determined that, in step S6200 (step S6203), all of the three blocks of one group are not identical to each other. In this case, the CPU 111 probably determines that the data sent from the management center 200 are unauthorized data and/or illegal modified data, thereby exiting the data extracting task upon determination such that the majority-occupying checking is not established without setting the majority-occupying flag.

In step S135 (see FIG. 7), therefore, the determination whether the reprogramming factor data is decoded is carried out depending on the state of the majority-occupying flag.

As described above, the in-vehicle control system 100 according to the modification of the fourth embodiment can obtain substantially the same effects as the first and second effects according to the first embodiment.

In addition, the in-vehicle control system 100 according to the modification of the fourth embodiment can obtain the fifth effect described hereinafter.

Specifically, as the fifth effect, when it is determined that one of the data blocks is identical to another one of the data blocks, the CPU 111 can determine the paired data blocks (one and another one of the data blocks) as the pair of the data blocks occupying the majority of identical blocks in the three combined blocks. This permits the load of the CPU 111 to be reduced.

FIFTH EMBODIMENT

An in-vehicle control system according to a fifth embodiment of the present invention will be described hereinafter. The in-vehicle control system of the fifth embodiment has substantially the same structure as that of the in-vehicle control system of the third embodiment. For this reason, like reference characters are assigned to like parts in the in-vehicle control systems according to the fourth and fifth embodiments so that descriptions of the parts of the in-vehicle control system of the fifth embodiment will be omitted.

Substantially like the fourth embodiment, in the fifth embodiment, the in-vehicle control system 100 is configured to:

receive a plurality of items of the reprogramming data (the reprogramming factor data and the dummy data) to each of which the same identifier is attached, which has been sent from the management center 200;

verify the received items of the reprogramming data (the reprogramming factor data and the dummy data) against each other; and extract, as validated data, at least one of the items of the reprogramming data when it is determined that the at least one of the items of the reprogramming data meets any one of first to fourth predetermined rules against at least one remaining item based on the verified result.

Note that, in the fifth embodiment, the in-vehicle control system 100 includes the following first to fourth determining units described in detail in the first to fourth embodiments, respectively:

The first determining unit (mirror determining unit) is configured to, when the plurality of items of reprogramming data consisting of specific data and the mirror data thereof that is the complement of the specific data have been received, determine that the first predetermined rule is established when the received specific data and the mirror data are the complement of each other (the first embodiment).

The second determining unit (identity determining unit) is configured to, when the plurality of items of reprogramming data each item of which consists of at least three or more data blocks have been received, determine that the second predetermined rule is established when at least two of the three or more data blocks of each item of the reprogramming data are identical to each other (the second embodiment).

The third determining unit (majority-rule determining unit) is configured to, when the plurality of items of reprogramming data each item of which consists of three or more data blocks have been received, determine that the third predetermined rule is established when there is at least one data block whose number of blocks identical thereto in the three or more data blocks is the largest therein (the third embodiment).

The fourth determining unit (majority-occupying determining unit) is configured to, when the plurality of items of reprogramming data each item of which consists of three or more data blocks have been received, determine that the fourth predetermined rule is established when the majority of the three or more data blocks are identical to each other (the fourth embodiment).

In extracting at least one of the items of the reprogramming data, the in-vehicle control system 100 is configured to dynamically determine selection of any one of the first to fourth determining units in cooperation with the management center 200. Specifically, the in-vehicle control system 100 is configured to dynamically determine selection of any one of the first to fourth determining units based on instruction sent from the management center 200.

According to the configuration of the in-vehicle control system 100, even if one of the first to fourth predetermined rules is generally known, it is possible to maintain the security level associated with data reprogramming. In addition, the in-vehicle control system 100 is configured to dynamically determine selection of any one of the first to fourth determining units in cooperation with the management center 200, which makes it difficult to decode how to extract the reprogramming factor data. Reprogramming based on unauthorized data and/or illegal modified data can be therefore securely avoided.

Figures 27, 28:
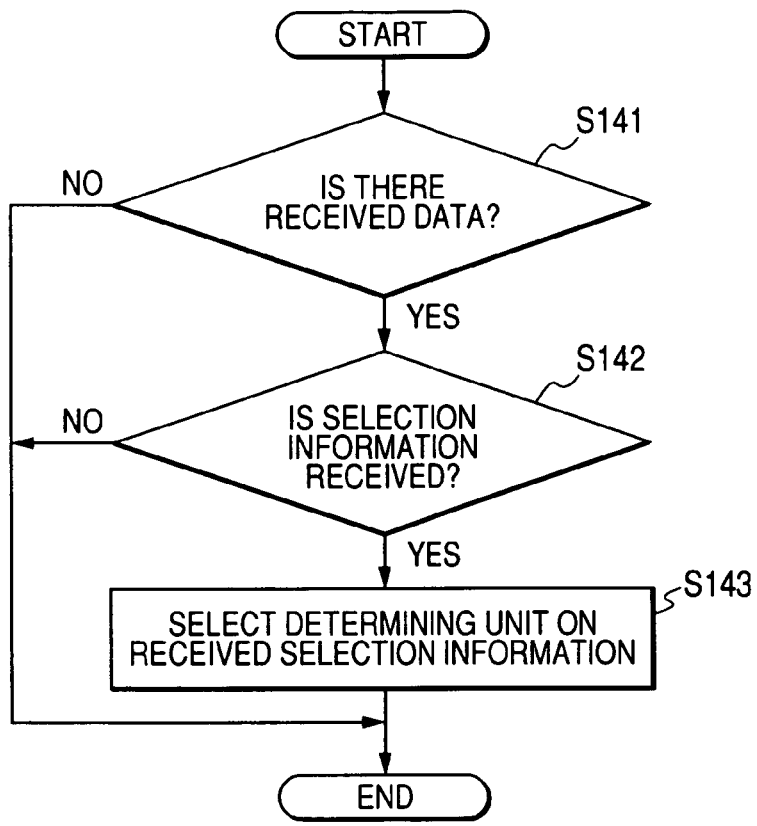
FIG. 27 is a flowchart schematically illustrating selection processing to be executed by the engine control unit in cooperation with the management center according to a fifth embodiment of the present invention.
FIG. 28 is a view schematically illustrating a table representing the relationship between first to fourth identifiers and first to fourth determining units according to the fifth embodiment.

FIG. 27 is a flowchart schematically illustrating the selection processing to be executed by, for example, the engine control unit 110 in cooperation with the management center 200. In the fifth embodiment, the communications between the management center 200 and the engine control unit 110 can be established via the master control unit 140. In addition, the selection processing can be repeated every predetermined period.

When how to extract the reprogramming factor data based on any one of the first to fourth determining units is determined by the management center 200, the selection information indicative of any one of the first to fourth determining units that should be selected by the engine control unit 110 is sent from the management center 200. For example, as the selection information, an identifier can be employed. The identifier can identify any one of the first to fourth determining units.

In selecting any one of the first to fourth determining units, the CPU 111 of the engine control unit 110 stands by until receiving data through the communication bus 101 in step S141.

When receiving data, the determination in step S141 is YES, so that the CPU 111 identifies what type of the received data in step S142 based on the identifier contained in the received data.

If it is identified that the received data is the selection information (the determination in step S142 is YES), the CPU 111 selects any one of the first to fourth determining units based on the received selection information (identifier).

In the data extracting task in step S134, therefore, it is possible to verify the received items of reprogramming data using the selected one of the first to fourth determining units, thereby extracting, as validated data, at least one of the items of the reprogramming data when it is determined that the at least one of the items of the reprogramming data meets corresponding one of the first to fourth predetermined rules against at least one remaining item based on the verified result.

For example, first to forth identifiers, such as "0x01", "0x02", "0x03", and "0x04", corresponding respectively to the first to fourth determining units can be employed as the identifier. In this case, each of the ECUs 110, 120, and 130 can be provided with a table T illustrated in FIG. 28. The table T represents the relationship between the first to fourth identifiers and the first to fourth determining units.

Specifically, it is possible for each of the ECUs 110, 120, and 130 to easily select any one of the first to fourth determining units by referring to the table T with the use of the identifier contained in the received data.

As described above, the in-vehicle control system 100 according to the fifth embodiment can obtain substantially the same effects as the first and second effects according to the first embodiment, as the third effect according to the third embodiment, and the fifth effect according to the fourth embodiment.

In addition, the in-vehicle control system 100 according to the fifth embodiment can obtain the seventh effect described hereinafter.

Specifically, as the seventh effect, even if one of the first to fourth predetermined rules is generally known, it is possible to maintain the security level associated with data reprogramming. In addition, the in-vehicle control system 100 and the management center 200 make it difficult to decode how to extract the reprogramming factor data. Reprogramming based on unauthorized data and/or illegal modified data can be therefore securely avoided.

In the fifth embodiment, employing a determining unit described in the modification of the third embodiment as the majority-rule determining unit permits the fourth effect to be obtained. Similarly, employing a determining unit described in the modification of the fourth embodiment as the majority-occupying determining unit permits the sixth effect to be obtained.

The first to fifth embodiments can be modified within the scope of the present invention. Some modifications as examples will be described hereinafter.

The data extracting task for extracting, as validated data, at least one of the items of the reprogramming data when it is determined that the at least one of the items of the reprogramming data meets a predetermined rule against at least one remaining item based on the verified result can be performed in parallel with receiving the items of the reprogramming data without storing them.

In the fifth embodiment, the management center 200 sends the selection information, but another unit, such as the master control unit 140 can send the selection information. In this case, the management center 200 can receive the selection information and determine how to extract the reprogramming factor data based on any one of the first to fourth determining units.

In the fifth embodiment, it can be possible to select any one of the first to fourth determining units based on, as the selection information, information indicative of timing, such as date and/or hour, at which the items of reprogramming data were received.

For example, the following remainders obtained by dividing, by "4", the date at which the items of reprogramming data were received can be associated with the first to fourth determining units; this "4" corresponds to the number of types of the determining units:

(a) the reminder "0", such as the date of 4 or 8, associated with the first determining unit (b) the reminder "1", such as the date of 1 or 5, associated with the second determining unit (c) the remainder "2", such as the date of 2 or 6, associated with the third determining unit (d) the remainder "3", such as the date of 3 or 7, associated with the fourth determining unit.

In this case, the management center 200 can determine how to extract the reprogramming factor data based on any one of the first to fourth determining units in accordance with the information indicative of date and/or hour at which the items of reprogramming data were received.

In the fifth embodiment, the in-vehicle control system 100 can be equipped with at least two of the first to fourth determining units, thereby dynamically select any one of the at least two of the first to fourth determining units.

In each of the first to fourth embodiments, the engine control unit 1110 is configured to execute the data extracting task for extracting, as validated data, at least one of the items of the reprogramming data when it is determined that the at least one of the items of the reprogramming data meets a predetermined rule against at least one remaining item. The present invention is not limited to the structure.

Specifically, the master control unit 140 can execute the data extracting task before sending the items of the reprogramming data to the engine control unit 110.

The data extracting task to be executed by the master control unit 140 will be described hereinafter. Note that the data extracting task can be repeatedly executed by the master control unit 140 every predetermined period.

Figure 29:
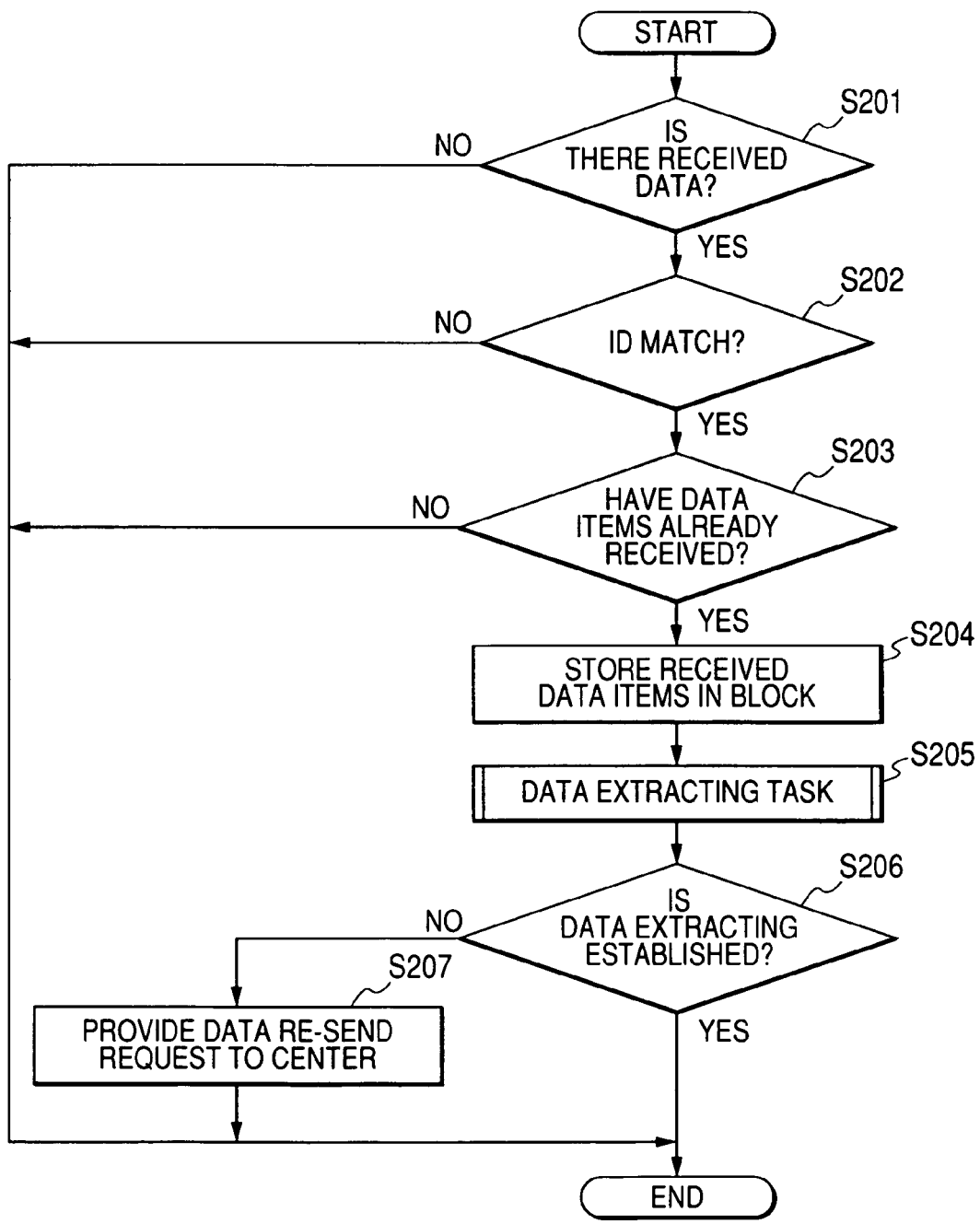
FIG. 29 is a flowchart schematically illustrating data extracting processing to be executed by the CPU of the master control unit according to a modification of each embodiment of the present invention.

As illustrated in FIG. 29, the CPU 141 stands by until receiving items of data through the communication bus 101 in step S201.

When receiving the items of reprogramming data in block through the communication bus 201, the CPU 141 determines whether the received identifier of each item of the reprogramming data and the specifying code, such as VIN code, of the corresponding vehicle in step S202.

If it is determined that the received identifier of each item matches the specifying code of the corresponding vehicle, the CPU 141 determines, based on a receiving history stored in the data memory 144, whether the received items of the reprogramming data are equivalent to items that have been already received to be stored in the data memory 144 in step S203.

If it is determined that the received items of the reprogramming data have not been received yet (the determination in step S203 is NO), the CPU 141 stores, in block, the received items in the data memory 144 as the receiving history in step S204. Specifically, the CPU 141 stores, in block, the received data items in the data memory 144 such that the data items are associated with each other.

Then, the CPU 141 executes the data extracting task in step S205 (see step S134 in FIG. 7), and when the reprogramming factor data is extracted by the data extracting task in step S205, the CPU 141 terminates the data extracting processing illustrated in FIG. 29.

If no item of reprogramming factor data is extracted by the data extracting task in step S205, the CPU 141 provides the management center 200 with a re-sending request of items of the reprogramming data in step S207.

Specifically, the master control unit 140 is configured to send the extracted at least one item of the reprogramming data to the engine control unit 110.

Figure 30:
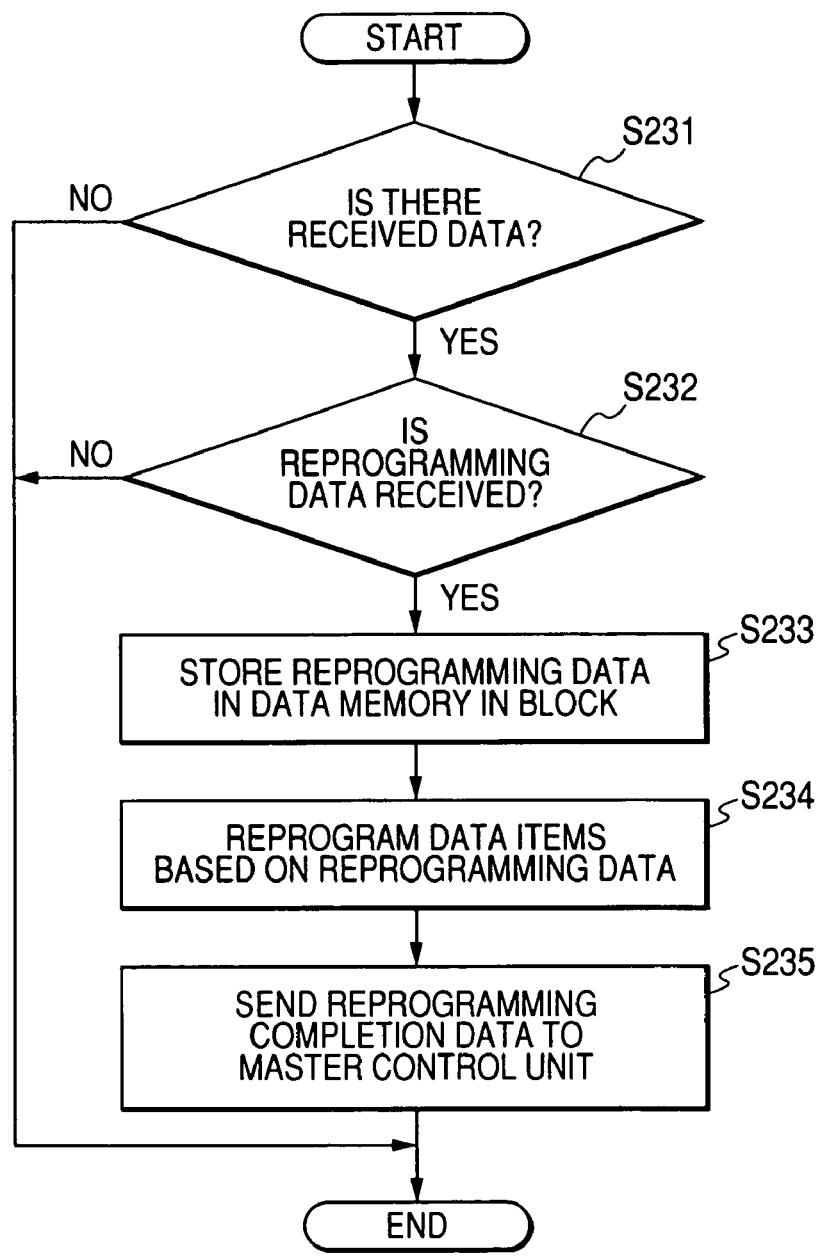
FIG. 30 is a flowchart schematically illustrating reprogramming processing to be executed by the CPU of the engine control unit according to the modification of each embodiment of the present invention.

In this case, the CPU 111 of the engine control unit 110 can execute a data reprogramming task based on the extracted item sent from the master control unit 140 in accordance with the algorithm illustrated in FIG. 30 as an example.

Specifically, the CPU 111 stands by until receiving data in step S231.

When receiving data, the CPU 111 determines whether the received data is an item of the reprogramming factor data based on the identifier attached to the received data in step S232.

If it is determined that the received data is an item of the reprogramming factor data, the CPU 111 stores the received data in the data memory 114 in step S233, and reprograms corresponding at least one data item stored in the program memory 113 based on the received data in step S234. Thereafter, the CPU 111 sends, to the master control unit 140, data reprogramming completion signal indicative of completion of data reprogramming in step S235.

Figure 31:
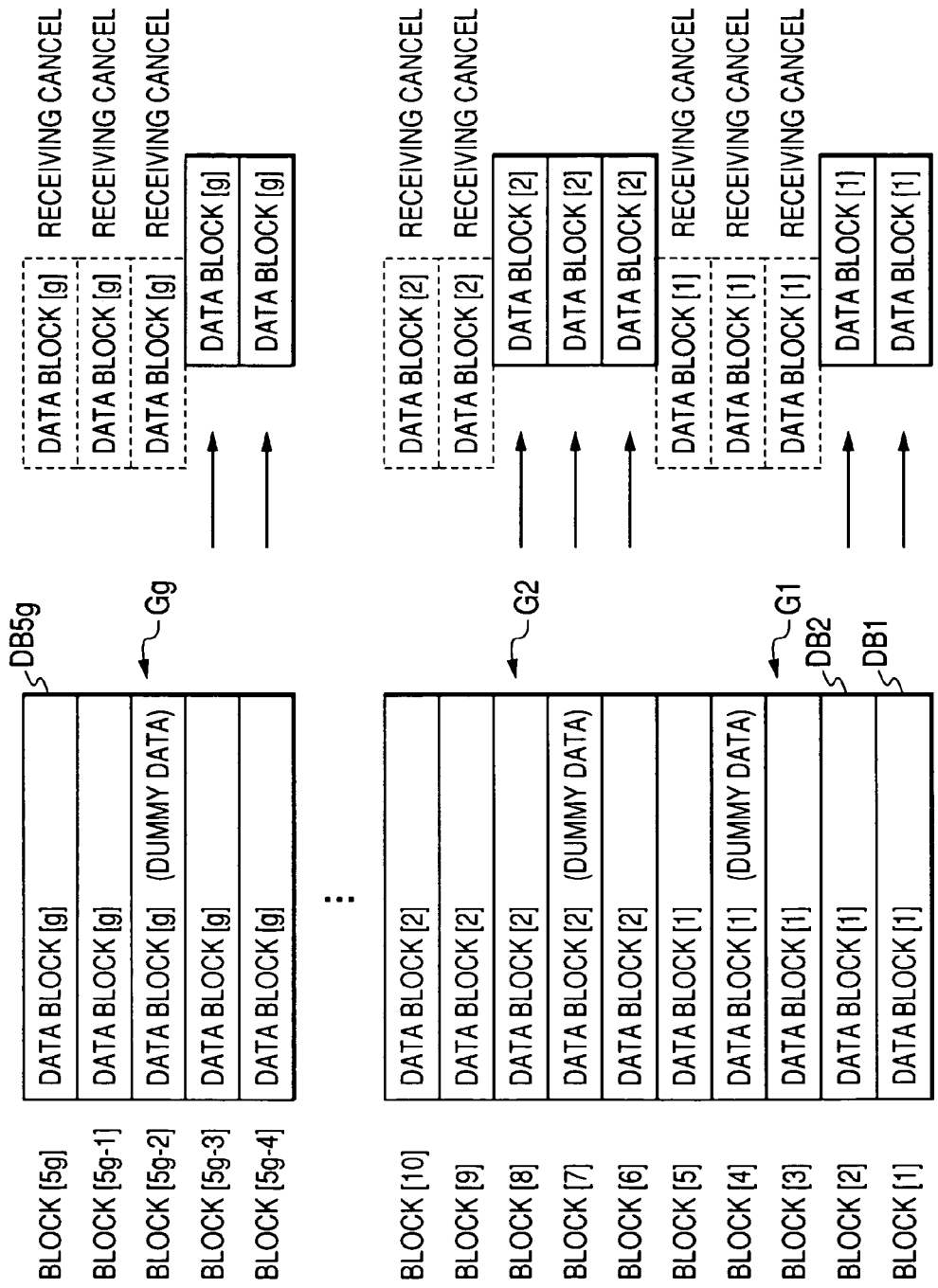
FIG. 31 is a view schematically illustrating extracting and storing processing to be executed by the CPU of the engine control unit according to a modification of each embodiment of the present invention.

As described above, the master control unit 140 can execute the data extracting task in parallel to receiving the plurality of items of reprogramming data. In this case, as illustrated in FIGS. 31, when at least one of data blocks that meet a predetermined rule is extracted from data blocks in a group, the CPU 141 preferably cancels receiving the remaining data blocks except for the data blocks meeting the predetermined rule, and starts to verify data blocks in the next group. This makes it possible to effectively utilize the data memory 144. Such a data extracting task to be executed by the master control unit 140 will be described hereinafter.

Note that this modification can be applied to the second to fifth embodiments in which three or more data blocks in a group are sent from the management center 200. In this case, the modification is applied to the identify determining unit according to the second embodiment as an example. The data extracting task to be executed by the master control unit 140 according to the modification will be described hereinafter with reference to FIGS. 31 and 32.

In the management center 200, as illustrated in FIG. 31, each of the reprogramming factor data and dummy data is divided into a plurality of data blocks [1] to [g], where "g" represents a predetermined integer.

A group G1 consists of the five combined block DB1 to DB5 of the data blocks [1] including one dummy data. Similarly, a group G2 consists of the five combined block DB6 to DB10 of the data blocks [2] including one dummy data, . . . , a group Gg consists of the five combined blocks DB5g–4 to 5g of the data blocks [g] including one dummy data.

The management center 200 categorizes the data blocks DB1, DB2, DB3, . . . , DB5g such that a plurality of the data frames DF contain the data blocks DB1, DB2, DB3, . . . , DB5g, respectively. Next, the management center 200 sequentially sends the plurality of data frames DF to the in-vehicle control unit 100 in packet or in block, respectively, such that the data blocks in each group are paired to each other. The management center 200 also sequentially sends he plurality of data frames DF to the in-vehicle control unit 100 such that one block of the reprogramming factor data contained in the five combined data blocks of each group is sent first from the remaining data blocks.

Figure 32:
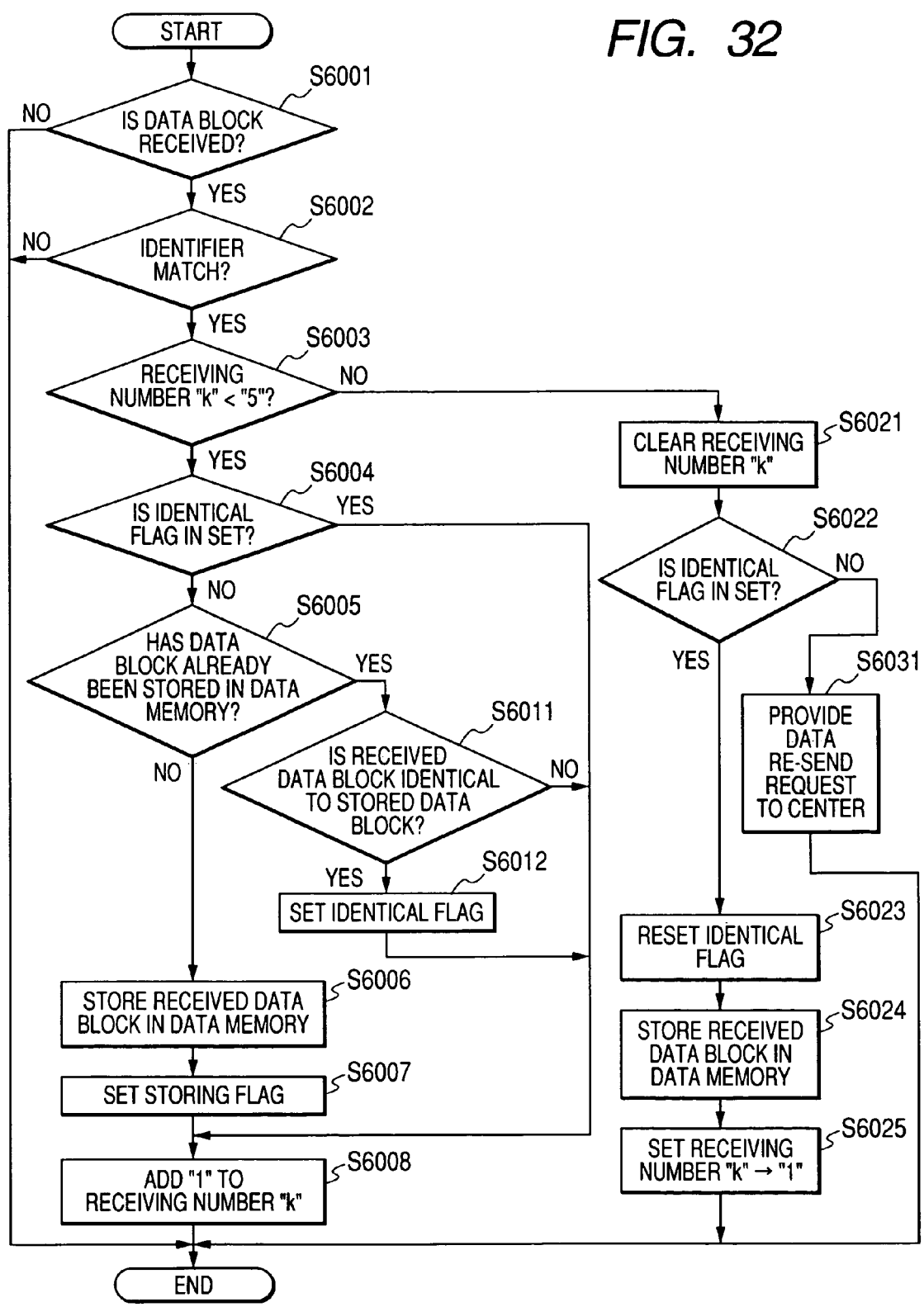
FIG. 32 is a flowchart schematically illustrating reprogramming processing to be executed by the CPU of the engine control unit according to the modification of each embodiment of the present invention.

In the master control unit 140, as illustrated in FIG. 32, the CPU 141 stands by until receiving a data block in step S6001.

When receiving the data block [1], the CPU 141 proceeds to step S6002 and determines whether the identifier attached to the data block matches the specifying code, such as VIN code, of the corresponding vehicle.

If it is determined that the identifier attached to the data block matches the specifying code of the corresponding vehicle (the determination in step S6002 is YES), the CPU 141 proceeds to step S6003. In step S6003, the CPU 141 determines whether the receiving number "k" of receiving the data block is less than "5" corresponding to the number of paired blocks in each group.

Note that the number "k" can be set to "0" upon receipt the data block [1], and therefore, the CPU 141 determines that the number "k" of receiving the data block is less than "5". In this case, the CPU 141 executes the set of steps S6004 to S6008 in order to execute identical comparison task between the five data blocks [1] to [5]:

In step S6004, the CPU 141 checks the state of the identical flag that is set upon establishment of the identical checking.

In step S6005, the CPU 141 determines whether data blocks are stored in the data memory 144 on condition that the identical flag is in reset.

In step S6006, the CPU 141 stores the received data block in the data memory 144 on condition that no data blocks are stored in the data memory 144.

In step S6007, the CPU 141 sets a storing flag indicative of data blocks being stored in the data memory 144 on condition that no data blocks are stored in the data memory 144.

In step S6008, the CPU 141 adds "1" to the receiving number "k".

Specifically, the received data block [1] is stored in the data memory 114 (see step S6006), the storing flag is set (see step S6007), and the receiving number "k" is manipulated to "1".

When a data block [2] is newly received, because the storing flag is in set, the CPU 141 determines that the data block is stored in advance in the data memory 114.

Then, the CPU 141 executes, as identical checking between the data block stored in the data memory 144 and the newly received data block, the following steps S6011 and S6012:

In step S6011, the CPU 141 determines whether the data block stored in the data memory 144 is identical to newly received data block.

In step S6012, the CPU 141 sets the identical flag on condition that data block stored in the data memory 144 is identical to newly received data block.

Specifically, as illustrated in FIG. 31, the data block [1] and the newly received data block [2] are identical to each other (see step S6011), so that the identical flag is set (see step S6012). Thereafter, "1" is added to the receiving number "k", so that the receiving number "k" goes to "2".

When the data blocks [3] to [5] are received (see step S600), the state of the identical flag is checked so that the receiving of the data blocks [3] to [5] are cancelled. That is, the CPU 141 further adds "1" to the receiving number "k" when checking the identical flag (see step S6008).

In contrast, when the identical checking between the five combined data blocks in a group is completed, and thereafter, the data block [6] is received (S6001), it is determined that the receiving number "k" is not less than "5". In this case, in order to subject five combined data blocks of the next group to the identical comparison, the CPU 141 executes the following steps S6021 to S6025, and S6031.

In step S6021, the CPU 141 clears the receiving number "k".

In step S6022, the CPU 141 checks the state of the identical flag.

In step S6023, the CPU 141 resets the identical flag on condition that the identical flag is in set in step S6022.

In step S6024, the CPU 141 stores the received data block in the data memory 144 on condition that the identical flag is in set in step S6022.

In step S6025, the CPU 141 sets the receiving number "k" to "1" on condition that the identical flag is in set in step S6022.

In step S6031, the CPU 141 provides the management center 200 with a re-sending request of the reprogramming data on condition that the identical flag is in reset in step S6022.

Specifically, the identical flag is reset (see step S6022), the data block [6] is stored in the data memory 144 (see step S6024), and the receiving number "k" is set to "1" (see step S6025). Therefore, when the data block [7] is newly received (see step S6001), it is determined that the receiving number "k" is less than "5" in step S6003. Thereafter, the steps S6004 to S6008, S6011, and S6012 are repeated again so that the identical checking is performed between the data blocks [6] to [10] as illustrated in FIG. 31.

Repeat execution of the set of steps S6001 to S6008, S6011, and S6012, and S6012 to S6025 allows realization of an example of the data extracting task illustrated in FIG. 31.

In the second to fifth embodiments, three or more items of reprogramming data as the target for the identical checking, the majority-rule checking, and the majority-occupying checking can be used.

In the second and fifth embodiments, it can be possible to determine that the identical checking is established when at least three blocks are identical to each other in three or more blocks in a group.

As a result of the majority-rule checking, when it is determined that there are a plurality of blocks whose numbers of blocks identical thereto in a group are the same as each other and the largest therein, it is possible to hold the data extracting task in accordance with various procedures except for those described in the third embodiment. This makes it possible to more improve the reliability of reprogramming for data.

In majority-rule checking and/or majority-occupying checking, it is possible to reexecute identical checking of specific data blocks whose identical checking has been already performed.

The management center 200 can generate the dummy data in sending the items of reprogramming data without storing them.

When the identical comparison is applied to data blocks, it is possible to execute it in any data length, such as 2 bytes.

It is possible to send the data blocks in any unit except in data blocks.

It is possible to verify the items of reprogramming data in any unit except in data blocks.

The in-vehicle control system according to each of the first to fifth embodiments can be applied to a system composed of a plurality of ECUs communicably linked therebetween via a dedicated line.

Another processing except for the mirror checking, identical checking, majority-rule checking, and majority-occupying checking can be used to realize the data extracting task configured to verify the items of the reprogramming data and to extract, as validated data, at least one of the items of the reprogramming data based on the verifying result. Algorithm for causing the CPU to execute another processing can be freely determined.

The management center 200 can send all of the items of reprogramming data as validated data.

In each of the first to fifth embodiments, the present invention is applied to an in-vehicle control, system. The present invention however is not limited to the application. Specifically, the present invention can be applied to reprogramming systems for reprogramming data stored therein. In each of the first to fifth embodiments and their modifications, the elements provided in the units can be implemented as microcomputers.

Some of the elements constituting each of the units according to the first to fifth embodiments and their modifications can be independently provided from a microcomputer, or can be implemented as dedicated hardware devices, such as custom LSI (Large-Scale Integration) circuits.

In addition, those skilled in the art will appreciate that the present invention is capable of being distributed as program products, for example, the programs stored in the program memories in a variety of forms. It is also important to note that the present invention applies equally regardless of the particular type of signal bearing media used to actually carry out the distribution. Examples of suitable signal bearing media include recordable type media such as CD-ROMs and DVD-ROMs, and transmission type media such as digital and analog communications links.

While there has been described what is at present considered to be the embodiments and their modifications of the present invention, it will be understood that various modifications which are not described yet may be made therein, and it is intended to cover in the appended claims all such modifications as fall within the true spirit and scope of the invention.

What is claimed is:

1. A data reprogramming system communicable with a rewritable memory in which data is stored in advance, the stored data being reprogrammable based on validated data, the data reprogramming system comprising:
   a receiving unit configured to receive a plurality of items of data for use in reprogramming;
   wherein the plurality of items of data include at least one item of specific data and at least one item of mirror data, the at least one item of specific data and at least one item of mirror data being a complement of each other, and to each of which the same identifier is attached, further the at least one item of specific data and at least one item of mirror data being sent to the receiving unit while being paired with each other; and
   a data extracting unit configured to verify that the received plurality of items of data have the same identifier and to match the at least one item of specific data with at least one item of mirror data to detect that the at least one item of specific data is the complement of the at least one item of mirror data to extract at least one item of the specific data as the validated data upon determination that the at least one specific data meets a predetermined rule against the at least one item of the mirror data.

2. A data reprogramming system according to claim 1, wherein:
   the data reprogramming system is installed in a vehicle, and the data stored in the rewritable memory includes a control program and control data used for control of at least one device installed in the vehicle.

3. A data reprogramming system according to claim 1, wherein:
   the plurality of items of data received by the receiving unit include at least one item of non-validation data, the at least one item of non-validation data being inconsistent with the at least one item extracted by the extracting unit.

4. A data reprogramming system according to claim 1, wherein:
   the plurality of items of data received by the receiving unit include three or more items of data, at least two of the three or more items of data being identical to each other, and
   the data extracting unit is configured to:
   match the three or more items of data with each other to detect that at least two of the three or more items of data are identical to each other, thereby determining that one of the at least two identical items of data meets the predetermined rule against at least another of the at least two identical items of data; and extract, as the validated data, the one of the at least two identical items of the data based on the determination.

5. A data reprogramming system according to claim 4, wherein:
   the data extracting unit is configured to cancel receiving the at least two of the three or more items of data after determining that the at least two of the three or more items are identical to each other.

6. A data reprogramming system according to claim 1, wherein:
   the plurality of items of data received by the receiving unit include three or more items of data, a majority of the three or more items of data being identical to each other, and
   the data extracting unit is configured to:
   match the three or more items of data with each other to detect that the majority of the three or more items of data are identical to each other, thereby determining that at least one of the majority of the three or more items of data meets the predetermined rule against another at least one of the majority of the three or more items of data; and extract, as the validated data, the at least one of the majority of the three or more items of data based on the determination.

7. A data reprogramming system according to claim 1, wherein:
   the plurality of items of data received by the receiving unit include three or more items of data, the three or more items of data including a first group of data items that are identical to each other and a second group of one or more items of data,
   the data extracting unit is configured to:
   match the three or more items of data with each other to determine whether:
   the number of the items in the first group is greater than that of the items in the second group, the items in the second group being identical to each other; or
   the second group includes one item, and
   determine that at least one item in the first group meets the predetermined rule against the remaining at least one item included in the first group upon determining that:
   the number of the items in the first group is greater than that of the items in the second group; or
   the second group includes one item; and
   extract, as the validated data, the at least one item of data included in the first group based on the determination.

8. A data reprogramming system according to claim 7, wherein:
   the data extracting unit is configured to determine that the number of the items in the first group is equal to that of the items in the second group, and determine that the three or more items of data do not meet the predetermined rule.

9. A data reprogramming system according to claim 1, wherein:
   the predetermined rule consists of a plurality of rules, the data extracting unit comprises: a sending unit configured to send the plurality of items of data to the receiving unit; a plurality of determining units communicable to the sending unit and configured to determine whether at least one item of the data meets at least one of the plurality of rules against at least one remaining item of the data based on the result of the matching; and a selecting unit configured to select one of the plurality of determining units in cooperation with the sending unit.

10. A data reprogramming system according to claim 9, wherein:

the sending unit is configured to further send, to the data extracting unit, selection information indicative of any one of the plurality of determining units that should be selected, and the selecting unit is configured to select one of the plurality of determining units based on the selection information sent from the sending unit.

11. A data reprogramming system according to claim 9, wherein:

the data reprogramming system is installed in a vehicle, the vehicle including a control unit installed therein, and the data extracting unit is communicable to the control unit and configured to select one of the plurality of determining units based on selection information, the selection information being indicative of any one of the plurality of determining units that should be selected and being sent from the control unit to the data extracting unit.

12. A data reprogramming system according to claim 9, wherein:

the data extracting unit is configured to select one of the plurality of determining units based on selection information, the selection information being indicative of timing at which the plurality of items of data are received.

13. A data reprogramming system according to claim 9, wherein the plurality of determining units include:

an identity determining unit configured to, when the plurality of items of data received by the receiving unit include three or more items of data, at least two of the three or more items of data being identical to each other, match the three or more items of data to detect that at least two of the three or more items of data are identical to each other, so as to determine that one of the at least two identical items of data meets a corresponding one of the plurality of rules against at least another of the at least two identical items of data, thereby extracting, as the validated data, the one of the at least two identical items of the data based on the determination;

a majority-occupying determining unit configured to, when the plurality of items of data received by the receiving unit include three or more items of data, a majority of the three or more items of data being identical to each other, match the three or more items of data to detect that the majority of the three or more items of data are identical to each other, so as to determine that at least one of the majority of the three or more items of data meets a corresponding one of the plurality of rules against another at least one of the majority of the three or more items of data, thereby extracting, as the validated data, the at least one of the majority of the three or more items of data based on the determination; and a majority-rule determining unit configured to: when the plurality of items of data received by the receiving unit include three or more items of data, the three or more items of data including a first group of items that are identical to each other and a second group of one or more items, match the three or more items of data with each other to determine whether:

the number of the items in the first group is greater than that of the items in the second group, the items in the second group being identical to each other; or the second group includes one item, determine that at least one item in the first group meets a corresponding one of the plurality of rules against the remaining at least one item included in the first group upon determining that:

the number of the items in the first group is greater than that of the items in the second group; or the second group includes one item, and extract, as the validated data, the at least one item included in the first group based on the determination.

14. A data reprogramming system according to claim 13, wherein, when the identity determining unit is selected from the plurality of determining units, the data extracting unit is configured to cancel receiving the at least two of the three or more items of data after determining that the at least two of the three or more items are identical to each other.

15. A data reprogramming system according to claim 13, wherein, when the majority-rule determining unit is selected from the plurality of determining units, the data extracting unit is configured to upon determining that the number of the items in the first group is equal to that of the items in the second group, determine that the three or more items of data do not meet the predetermined rule.

16. A data reprogramming system according to claim 1, wherein:

each of the items of data received by the receiving unit is divided in advance into a plurality of blocks and is sequentially sent in block to the receiving unit in a predetermined sending way, the predetermined sending way being determined depending on the predetermined rule, and the data extracting unit is configured to:

match, in block, the received plurality of items of data with each other;

extract a plurality of blocks of the at least one item of data as matched blocks upon determination that the plurality of blocks of the at least one item of data meet the predetermined rule against a plurality of blocks of at least one remaining item of data based on the result of the matching in block; and combine the extracted blocks of the at least one item of data to decode the at least one item of data as the validated data.

17. A data reprogramming system according to claim 16, wherein:

the plurality of items of data received by the receiving unit include three or more items of data, at least two of the three or more items of data being identical to each other, each of the items of data received by the receiving unit is divided in advance into the plurality of blocks such that each block of the at least two of the three or more items and each block of the remaining at least one of the three or more items are combined to generate a group, and the three or more items of data are sequentially sent to the receiving unit in group.

18. A data reprogramming system according to claim 1, wherein:

each of the plurality of items of data is processed as a data frame while being sent to the receiving unit in packet, the data frame has a data field in which each of the plurality of items of data is contained, each of the plurality of items contained in the data field is divided in advance into a plurality of blocks, and the data extracting unit is configured to match the blocks of one item of the plurality of items of data with those of another item of the plurality of items of data.

19. A data reprogramming system according to claim 1, wherein:

the data reprogramming system is composed of a plurality of electronic control units installed in a vehicle, the plurality of electronic control units being communicably linked to each other via a communication bus and cooperatively perform distributed control for the vehicle, the receiving unit and the data extracting unit being installed in at least one of the electronic control units.

20. A data reprogramming program product embedded in a memory of a computer communicable with a rewritable memory in which data is stored in advance, the stored data being reprogrammable based on validated data, the data reprogramming program product comprising:
first means for instructing a computer to receive a plurality of items of data for use in reprogramming;
wherein the plurality of items of data include at least one item of specific data and at least one item of mirror data, the at least one item of specific data and at least one item of mirror data being a complement of each other, and to each of which the same identifier is attached, further the at least one item of specific data and at least one item of mirror data being sent to the computer while being paired with each other; and
second means for instructing a computer to verify the received plurality of items of data to have the same identifier and to match the at least one item of specific data with at least one item of mirror data to detect that the at least one item of specific data is the complement of the at least one item of mirror data to extract at least one item of the specific data as the validated data upon determination that the at least one specific data meets a predetermined rule against the at least one item of the mirror data.

21. A method of reprogramming data stored in advance in a rewritable memory based on validated data, the method comprising:
receiving a plurality of items of data for use in reprogramming; wherein the plurality of items of data include at least one item of specific data and at least one item of mirror data, the at least one item of specific data and at least one item of mirror data being a complement of each other, and to each of which the same identifier is attached, further the at least one item of specific data and at least one item of mirror data being received while being paired with each other;
verifying that the received plurality of items of data; and
matching the plurality of items of data with each other to verify that the received plurality of items of data have the same identifier and to match the at least one item of specific data with at least one item of mirror data to detect that the at least one item of specific data is the complement of the at least one item of mirror data, thus extracting at least one item of the data as the validated data upon determination of the matching that the at least one item of the specific data meets a predetermined rule against at least one item of the mirror data.

* * * * *